United States Patent
Ando et al.

(10) Patent No.: US 9,780,201 B2
(45) Date of Patent: Oct. 3, 2017

(54) SEMICONDUCTOR DEVICE AND MANUFACTURING METHOD OF THE SAME

(71) Applicant: Semiconductor Energy Laboratory Co., Ltd., Atsugi-shi, Kanagawa-ken (JP)

(72) Inventors: Yoshinori Ando, Kanagawa (JP); Hidekazu Miyairi, Kanagawa (JP); Naoto Yamade, Kanagawa (JP); Asako Higa, Kanagawa (JP); Miki Suzuki, Kanagawa (JP); Yoshinori Ieda, Kanagawa (JP); Yasutaka Suzuki, Kanagawa (JP); Kosei Nei, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/223,002

(22) Filed: Jul. 29, 2016

(65) Prior Publication Data
US 2016/0336433 A1   Nov. 17, 2016

Related U.S. Application Data

(62) Division of application No. 14/520,196, filed on Oct. 21, 2014, now Pat. No. 9,431,435.

(30) Foreign Application Priority Data

Oct. 22, 2013  (JP) .................................. 2013-219682

(51) Int. Cl.
*H01L 21/02* (2006.01)
*H01L 21/477* (2006.01)
(Continued)

(52) U.S. Cl.
CPC ...... *H01L 29/66969* (2013.01); *C23C 14/086* (2013.01); *C23C 14/351* (2013.01);
(Continued)

(58) Field of Classification Search
CPC ... H01L 21/00; H01L 21/02; H01L 21/02266; H01L 21/02178; H01L 21/477;
(Continued)

(56) References Cited

U.S. PATENT DOCUMENTS 5,583,369 A   12/1996  Yamazaki et al.
5,731,856 A    3/1998  Kim et al.
(Continued)

FOREIGN PATENT DOCUMENTS

CN   102714496 A   10/2012
EP     1737044 A   12/2006
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Chuong A Luu
(74) *Attorney, Agent, or Firm* — Fish & Richardson P.C.

(57) ABSTRACT

To improve the electrical characteristics of a semiconductor device including an oxide semiconductor, and to provide a highly reliable semiconductor device with a small variation in electrical characteristics. The semiconductor device includes a first insulating film, a first barrier film over the first insulating film, a second insulating film over the first barrier film, and a first transistor including a first oxide semiconductor film over the second insulating film. The amount of hydrogen molecules released from the first insulating film at a given temperature higher than or equal to
(Continued)

400° C., which is measured by thermal desorption spectroscopy, is less than or equal to 130% of the amount of released hydrogen molecules at 300° C. The second insulating film includes a region containing oxygen at a higher proportion than oxygen in the stoichiometric composition.

16 Claims, 43 Drawing Sheets

(51) Int. Cl.
    *H01L 29/66* (2006.01)
    *C23C 14/08* (2006.01)
    *C23C 14/35* (2006.01)
    *H01L 21/469* (2006.01)
    *H01L 21/4757* (2006.01)
    *H01L 21/822* (2006.01)
    *H01L 27/06* (2006.01)
    *H01L 27/088* (2006.01)
    *H01L 27/12* (2006.01)
    *H01L 29/786* (2006.01)

(52) U.S. Cl.
    CPC ...... *H01L 21/0214* (2013.01); *H01L 21/0217* (2013.01); *H01L 21/02318* (2013.01); *H01L 21/469* (2013.01); *H01L 21/477* (2013.01); *H01L 21/4757* (2013.01); *H01L 21/8221* (2013.01); *H01L 27/0688* (2013.01); *H01L 27/088* (2013.01); *H01L 27/1225* (2013.01); *H01L 27/1255* (2013.01); *H01L 27/1259* (2013.01); *H01L 29/7869* (2013.01); *H01L 29/78603* (2013.01); *H01L 29/78606* (2013.01); *H01L 29/78693* (2013.01)

(58) Field of Classification Search
    CPC ........... H01L 21/4757; H01L 21/02365; H01L 21/0214; H01L 21/0217; H01L 21/02318; H01L 21/469; H01L 21/823462
    USPC ........................................ 438/104, 151, 275
    See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,237,166 B2 | 8/2012 | Kumomi et al. | |
| 8,547,771 B2 | 10/2013 | Koyama | |
| 8,809,154 B2 * | 8/2014 | Koezuka ........... | H01L 21/02365 438/151 |
| 2001/0046027 A1 | 11/2001 | Tai et al. | |
| 2002/0048885 A1 * | 4/2002 | Shibata ........... | H01L 21/823462 438/275 |
| 2002/0056838 A1 | 5/2002 | Ogawa | |
| 2002/0132454 A1 | 9/2002 | Ohtsu et al. | |
| 2003/0168004 A1 * | 9/2003 | Nakata ...................... | C23C 8/12 118/50.1 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0175646 A1 | 7/2011 | Takemura et al. | |
| 2013/0164899 A1 | 6/2013 | Koezuka et al. | |

(56) References Cited

U.S. PATENT DOCUMENTS

| | | | |
|---|---|---|---|
| 2013/0234135 | A1 | 9/2013 | Mochizuki et al. |
| 2014/0097867 | A1 | 4/2014 | Koyama |
| 2015/0076471 | A1* | 3/2015 | Saito .................. H01L 27/3262 257/40 |

FOREIGN PATENT DOCUMENTS

| | | | |
|---|---|---|---|
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-077833 | A | 3/2003 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | A | 6/2006 |
| JP | 2011-172214 | A | 9/2011 |
| JP | 2012-059860 | A | 3/2012 |
| JP | 2012-059860 | A | 3/2012 |
| JP | 2012-094757 | A | 5/2012 |
| JP | 2012-257187 | A | 12/2012 |
| KR | 2012-0118034 | A | 10/2012 |
| KR | 2013-0139950 | A | 12/2013 |
| TW | 201140754 | | 11/2011 |
| WO | WO-2004/114391 | | 12/2004 |
| WO | WO-2011/089808 | | 7/2011 |
| WO | WO-2012/057020 | | 5/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1 Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility Zno Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.
International Search Report (Application No. PCT/JP2014/078006) Dated Dec. 22, 2014.
Written Opinion (Application No. PCT/JP2014/078006) Dated Dec. 22, 2014.

\* cited by examiner

FIG. 13A
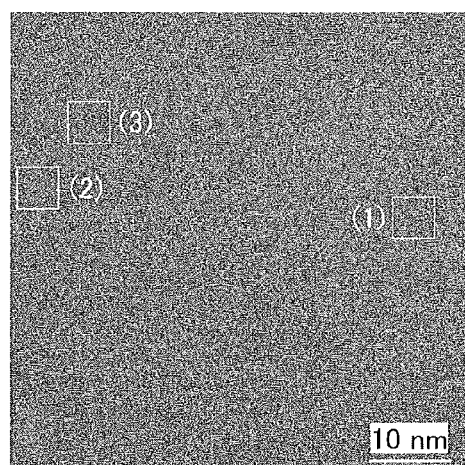
FIG. 13B    FIG. 13C    FIG. 13D
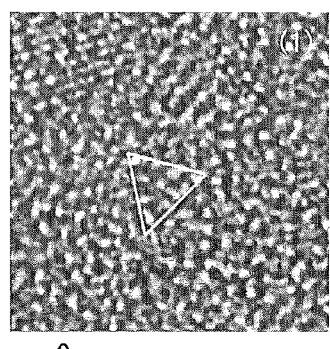 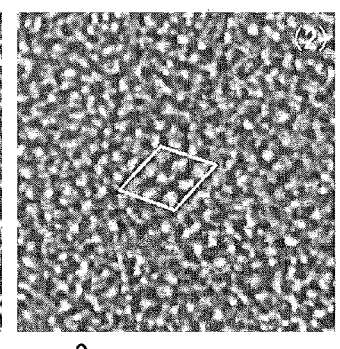 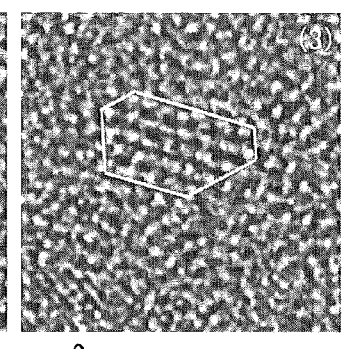

peak derived from a substrate

FIG. 15A
FIG. 15B
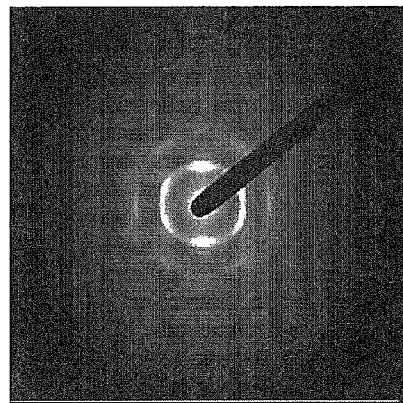
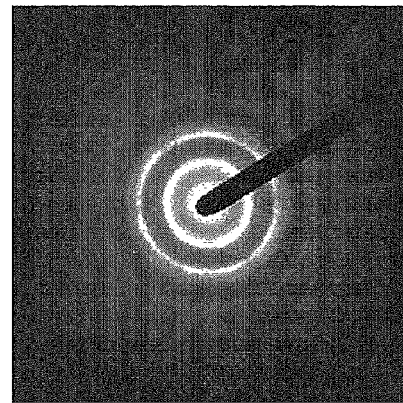

Cross Section

Plan View

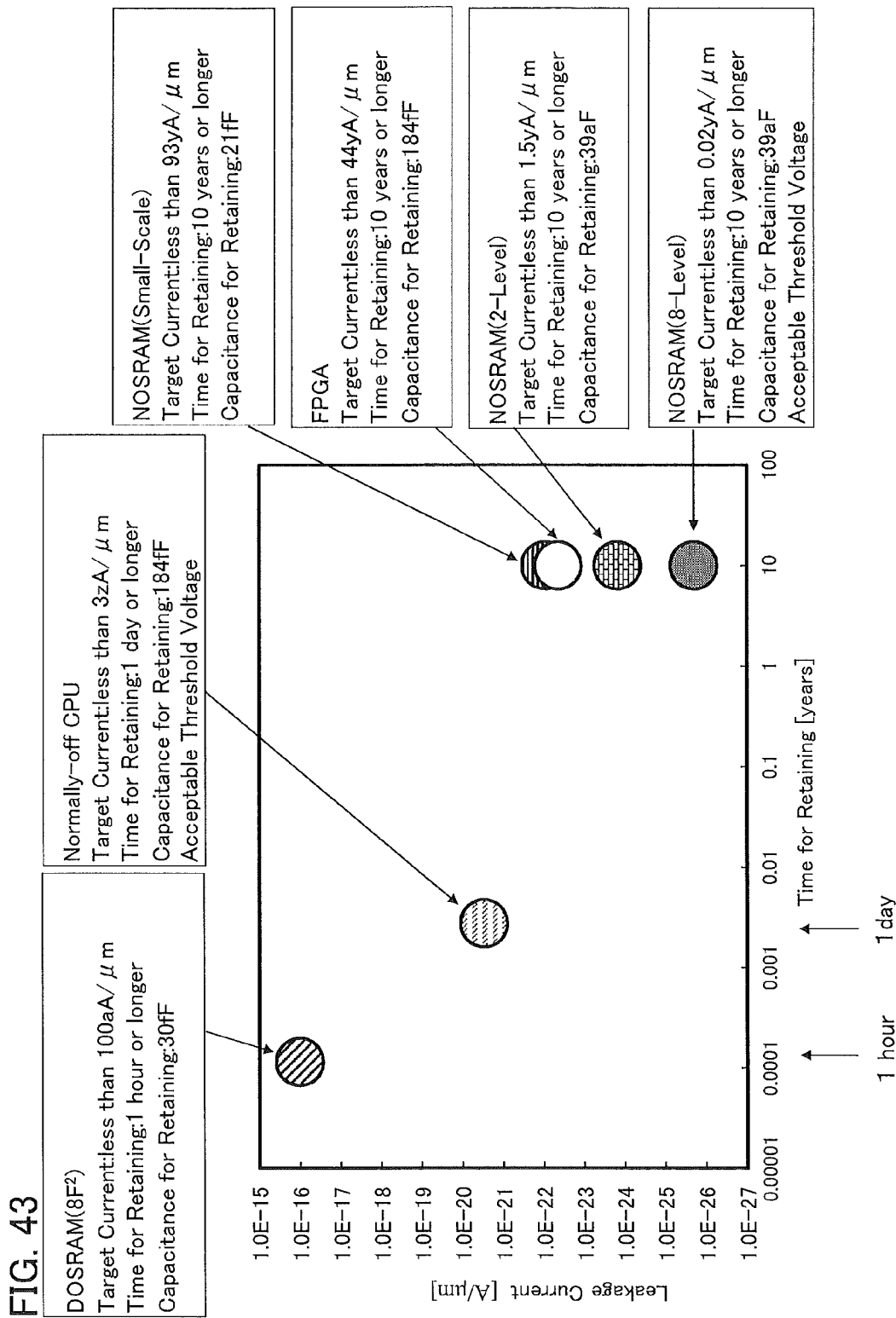

SEMICONDUCTOR DEVICE AND MANUFACTURING METHOD OF THE SAME

CROSS-REFERENCE TO RELATED APPLICATIONS

This application is a divisional of U.S. application Ser. No. 14/520,196, filed Oct. 21, 2014, now U.S. Pat. No. 9,431,435 now allowed, which claims the benefit of a foreign priority application filed in Japan as Serial No. 2013-219682 on Oct. 22, 2013, both of which are incorporated by reference.

TECHNICAL FIELD

The present invention relates to an object, a method, or a manufacturing method. The present invention also relates to a process, a machine, manufacture, or a composition of matter. In particular, one embodiment of the present invention relates to a semiconductor device, a display device, a light-emitting device, a memory device, a driving method thereof, or a manufacturing method thereof.

Note that in this specification and the like, a semiconductor device refers to any device that can function by utilizing semiconductor characteristics. An electro-optical device, an image display device (also simply referred to as a display device), a semiconductor circuit, a light-emitting device, a power storage device, a memory device, and an electronic device include a semiconductor device in some cases.

BACKGROUND ART

As silicon which is used as a semiconductor of a transistor, either amorphous silicon or polycrystalline silicon is used depending on the purpose. For example, in the case of a transistor included in a large-sized display device, it is preferable to use amorphous silicon, which can be formed using the established technique for forming a film on a large-sized substrate. On the other hand, in the case of a transistor included in a high-performance display device where driver circuits are formed over the same substrate, it is preferable to use polycrystalline silicon, which can form a transistor having a high field-effect mobility. As a method for forming polycrystalline silicon, a method of performing high-temperature heat treatment or laser light treatment on amorphous silicon has been known.

In recent years, an oxide semiconductor has attracted attention. For example, a transistor which includes an amorphous oxide semiconductor containing indium, gallium, and zinc is disclosed (see Patent Document 1).

An oxide semiconductor can be formed by a sputtering method or the like, and thus can be used for a channel formation region of a transistor in a large display device. A transistor including an oxide semiconductor has a high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

A transistor including an oxide semiconductor is known to have an extremely low leakage current in an off state. For example, a low-power-consumption CPU utilizing the low leakage current of the transistor including an oxide semiconductor is disclosed (see Patent Document 2).

It is also disclosed that a transistor having a high field-effect mobility can be obtained by a well potential formed using an active layer including a semiconductor (see Patent Document 3).

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. 2012-59860

DISCLOSURE OF INVENTION

An object of one embodiment of the present invention is to improve the electrical characteristics of a semiconductor device including an oxide semiconductor. Another object of one embodiment of the present invention is to manufacture a highly reliable semiconductor device with a small variation in electrical characteristics. Still another object of one embodiment of the present invention is to provide a novel semiconductor device.

Note that the descriptions of these objects do not disturb the existence of other objects. In one embodiment of the present specification, there is no need to achieve all the above objects. Other objects will be apparent from and can be derived from the description of the specification, the drawings, the claims, and the like.

One embodiment of the present invention is a semiconductor device including a first insulating film, a first barrier film over the first insulating film, a second insulating film over the first barrier film, and a first transistor including a first oxide semiconductor film over the second insulating film. The amount of hydrogen molecules released from the first insulating film at a given temperature higher than or equal to 400° C., which is measured by thermal desorption spectroscopy, is less than or equal to 130% of the amount of released hydrogen molecules at 300° C. The second insulating film includes a region containing oxygen at a higher proportion than oxygen in the stoichiometric composition.

In the first insulating film of the above structure, the detection intensity of a mass-to-charge ratio of 2 with respect to temperature is less than or equal to $4 \times 10^{-11}$ A at 400° C., which is measured by thermal desorption spectroscopy.

One embodiment of the present invention is a semiconductor device including a first insulating film, a first barrier film over the first insulating film, a second insulating film over the first barrier film, and a first transistor including a first oxide semiconductor film over the second insulating film. The amount of hydrogen molecules released from the first insulating film at 450° C., which is measured by thermal desorption spectroscopy, is less than or equal to 130% of the amount of released hydrogen molecules at 350° C. The second insulating film includes a region containing oxygen at a higher proportion than oxygen in the stoichiometric composition.

One embodiment of the present invention is a semiconductor device including a first insulating film, a first barrier film over the first insulating film, a second insulating film over the first barrier film, and a first transistor including a first oxide semiconductor film over the second insulating film. The amount of hydrogen molecules released from the first insulating film at a given temperature higher than or equal to 400° C., which is measured by thermal desorption spectroscopy, is less than or equal to 130% of the amount of released hydrogen molecules at 300° C. The second insulating film includes a region containing oxygen at a higher proportion than oxygen in the stoichiometric composition. The first transistor includes the first oxide semiconductor film over the second insulating film, a source electrode and a drain electrode which are in contact with the first oxide semiconductor film, a gate insulating film over the first oxide semiconductor film, the source electrode, and the drain electrode, and a gate electrode over the gate insulating film. The concentration of hydrogen in each of the gate insulating film, the second insulating film, and the first oxide semiconductor film is lower than $5\times10^{18}$ atoms/cm$^3$.

In the above structure, the gate electrode faces a top surface and a side surface of the first oxide semiconductor film with the gate insulating film interposed therebetween.

In the above structure, the first barrier film includes aluminum oxide, and the amount of hydrogen molecules released from the first barrier film at a temperature higher than or equal to 20° C. and lower than or equal to 600° C., which is measured by thermal desorption spectroscopy, is less than $2\times10^{15}$/cm$^2$.

In the above structure, a second barrier film covering the first transistor is preferably provided.

In the above structure, the second barrier film includes aluminum oxide, and the amount of hydrogen molecules released from the second barrier film at a temperature higher than or equal to 20° C. and lower than or equal to 600° C., which is measured by thermal desorption spectroscopy, is less than $2\times10^{15}$/cm$^2$.

In the above structure, a second oxide semiconductor film and a third oxide semiconductor film are provided with the first oxide semiconductor film interposed therebetween. The second oxide semiconductor film and the third oxide semiconductor film each include one or more kinds of metal elements contained in the first oxide semiconductor film.

In the above structure, a capacitor is provided to be electrically connected to the source electrode or the drain electrode of the first transistor. An off-state current per microfarad of capacitance and per micrometer of channel width of the first transistor is lower than 4.3 yA at 85° C.

In the above structure, a capacitor is provided to be electrically connected to the source electrode or the drain electrode of the first transistor. An off-state current per microfarad of capacitance and per micrometer of channel width of the first transistor is lower than 1.5 yA at 95° C.

In the above structure, a second transistor formed in a substrate including a semiconductor material is provided under the first insulating film to be electrically connected to the first transistor.

In the above structure, the S value of the first transistor is greater than or equal to 60 mV/dec. and less than or equal to 100 mV/dec.

One embodiment of the present invention is a method for manufacturing a semiconductor device, which includes the steps of forming a first transistor in a substrate including a semiconductor material; performing first heat treatment after the formation of the first transistor; forming a first insulating film over the first transistor; performing second heat treatment after the formation of the first insulating film; forming a first barrier film over the first insulating film; forming a second insulating film over the first barrier film; forming an opening in the second insulating film, the first barrier film, and the first insulating film; and forming a second transistor including an oxide semiconductor film which is over the second insulating film and electrically connected to the first transistor through the opening.

One embodiment of the present invention is a method for manufacturing a semiconductor device, which includes the steps of forming a first transistor in a substrate including a semiconductor material; performing first heat treatment after the formation of the first transistor; forming a first insulating film over the first transistor; forming a first barrier film over the first insulating film; forming a second insulating film over the first barrier film; forming an opening in the second insulating film, the first barrier film, and the first insulating film; performing second heat treatment after the formation of the opening; and forming a second transistor including an oxide semiconductor film which is over the second insulating film and electrically connected to the first transistor through the opening.

In the above manufacturing method, the second heat treatment is performed for less than or equal to 10 hours at a temperature higher than or equal to 450° C. and lower than 650° C.

In the above manufacturing method, the first barrier film is formed by a DC sputtering method.

In the above manufacturing method, a second barrier film is formed over the second transistor.

In the above manufacturing method, the second barrier film is formed by a DC sputtering method.

In the above manufacturing method, after the first transistor is formed, a third insulating film containing hydrogen is formed before the first heat treatment.

It is possible to improve the electrical characteristics of a semiconductor device including an oxide semiconductor. It is also possible to manufacture a highly reliable semiconductor device with a small variation in electrical characteristics. Alternatively, it is possible to provide a novel semiconductor device. Note that the descriptions of these effects do not disturb the existence of other effects. In one embodiment of the present invention, there is no need to achieve all the effects. Other effects will be apparent from and can be derived from the description of the specification, the drawings, the claims, and the like.

BRIEF DESCRIPTION OF DRAWINGS

In the accompanying drawings:

FIGS. 13A to 13D are Cs-corrected high-resolution TEM images of a plane of a CAAC-OS;

FIGS. 15A and 15B show electron diffraction patterns of a CAAC-OS;

FIG. 43 shows required retention years of devices and target leakage current of transistors.

BEST MODE FOR CARRYING OUT THE INVENTION

Figure 1A:
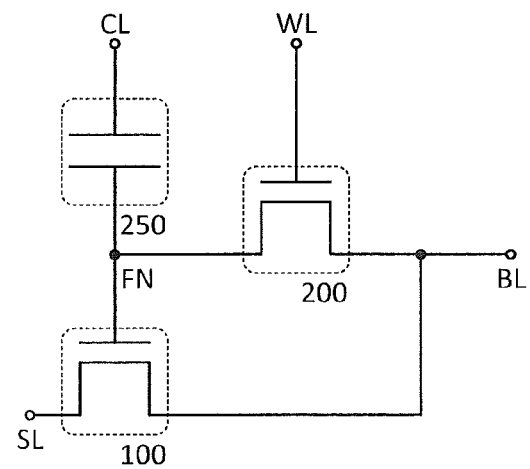
FIGS. 1A to 1C are a circuit diagram and cross-sectional views illustrating an example of a semiconductor device of one embodiment of the present invention.

Embodiments of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to the description of the embodiments. In describing the structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a ground potential (GND) or a source potential). A voltage can therefore be referred to as a potential.

Note that the ordinal numbers such as "first" and "second" in this specification are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as the ordinal numbers used to specify one embodiment of the present invention.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the width of a source or a drain in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a top surface of a semiconductor is higher than the proportion of a channel region formed in a side surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width, which is the length of a portion where a source and a drain face each other in a region where a semiconductor and a gate electrode overlap with each other, is referred to as a surrounded channel width (SCW) in some cases. Furthermore, in this specification, in the case where the term "channel width" is simply used, it may denote a surrounded channel width or an apparent channel width in some cases. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the field-effect mobility, current value per channel width, and the like of a transistor are obtained by calculation, a surrounded channel width may be used for the calculation. In that case, the values may be different from those calculated using an effective channel width in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification trigonal and rhombohedral crystal systems are included in a hexagonal crystal system.

(Embodiment 1)

In this embodiment, a structure and a manufacturing method of a semiconductor device of one embodiment of the present invention will be described with reference to drawings.

<Structure of Semiconductor Device>

FIG. 1A is an example of a circuit diagram of the semiconductor device of one embodiment of the present invention. The semiconductor device illustrated in FIG. 1A includes a transistor 100, a transistor 200, a capacitor 250, a wiring SL, a wiring BL, a wiring WL, and a wiring CL.

One of a source and a drain of the transistor 100 is electrically connected to the wiring BL, the other of the source and the drain of the transistor 100 is electrically connected to the wiring SL, and a gate of the transistor 100 is electrically connected to one of a source and a drain of the transistor 200 and one electrode of the capacitor 250. The other of the source and the drain of the transistor 200 is electrically connected to the wiring BL, and a gate of the transistor 200 is electrically connected to the wiring WL. The other electrode of the capacitor 250 is electrically connected to the wiring CL. Note that a node connecting the gate of the transistor 100, the one of the source and the drain of the transistor 200, and the one electrode of the capacitor 250 is referred to as a node FN.

Accordingly, in the semiconductor device in FIG. 1A, a potential based on the potential of the wiring BL is supplied to the node FN at the time when the transistor 200 is in a conduction state (on state). Moreover, the semiconductor device has a function of holding the potential of the node FN at the time when the transistor 200 is in a non-conduction state (off state). In other words, the semiconductor device in FIG. 1A serves as a memory cell of a memory device. In the case where a display element such as a liquid crystal element or an organic electroluminescence (EL) element is electrically connected to the node FN, the semiconductor device in FIG. 1A can serve as a pixel of a display device.

Conduction and non-conduction states of the transistor 200 can be controlled by the potential supplied to the wiring WL. When a transistor with a low off-state current is used as the transistor 200, the potential of the node FN at the time when the transistor 200 is in a non-conduction state can be held for a long time. This reduces the frequency of refresh operations of the semiconductor device, resulting in a lower power consumption of the semiconductor device. An example of the transistor with a low off-state current includes a transistor including an oxide semiconductor.

A transistor including an oxide semiconductor film can have n-type conductivity or p-type conductivity; the description below will made on n-type transistors. In this specification, a transistor that can be regarded as having no drain current flowing therein when a gate voltage is 0 V is defined as a transistor having normally-off characteristics.

A constant potential such as a ground potential is supplied to the wiring CL. In that case, the apparent threshold voltage of the transistor 100 varies depending on the potential of the node FN. When the apparent threshold voltage changes, conduction and non-conduction states of the transistor 100 are changed, so that data can be read.

To hold a potential in the node FN at 85° C. for 10 years ($3.15 \times 10^8$ seconds), off-state current is preferably lower than 4.3 yA (yoctoamperes, where 1 yA is $10^{-24}$ A) per microfarad of capacitance and per micrometer of channel width of the transistor. In that case, the allowable potential variation in the node FN is preferably within 0.5 V. Alternatively, the off-state current is preferably lower than 1.5 yA at 95° C. As described below, in the semiconductor device of one embodiment of the present invention, the hydrogen concentration in layers below a barrier film is sufficiently reduced. As a result, hydrogen diffusion from the layers below the barrier film to an oxide semiconductor above the barrier film can be prevented, the transistor including the oxide semiconductor can therefore have such an extremely low off-state current.

The subthreshold swing (S value) of the transistor including an oxide semiconductor is greater than or equal to 66 mV/dec., preferably greater than or equal to 60 mV/dec., and more preferably greater than or equal to 50 mV/dec., and less than or equal to 200 mV/dec., preferably less than or equal to 150 mV/dec., more preferably less than or equal to 100 mV/dec., and still more preferably less than or equal to 80 mV/dec. A smaller S value leads to a decrease in the off-state current at a certain voltage at which the transistor is turned off.

When the semiconductor device illustrated in FIG. 1A is arranged in a matrix, a memory device (memory cell array) can be formed.

Figure 1B:
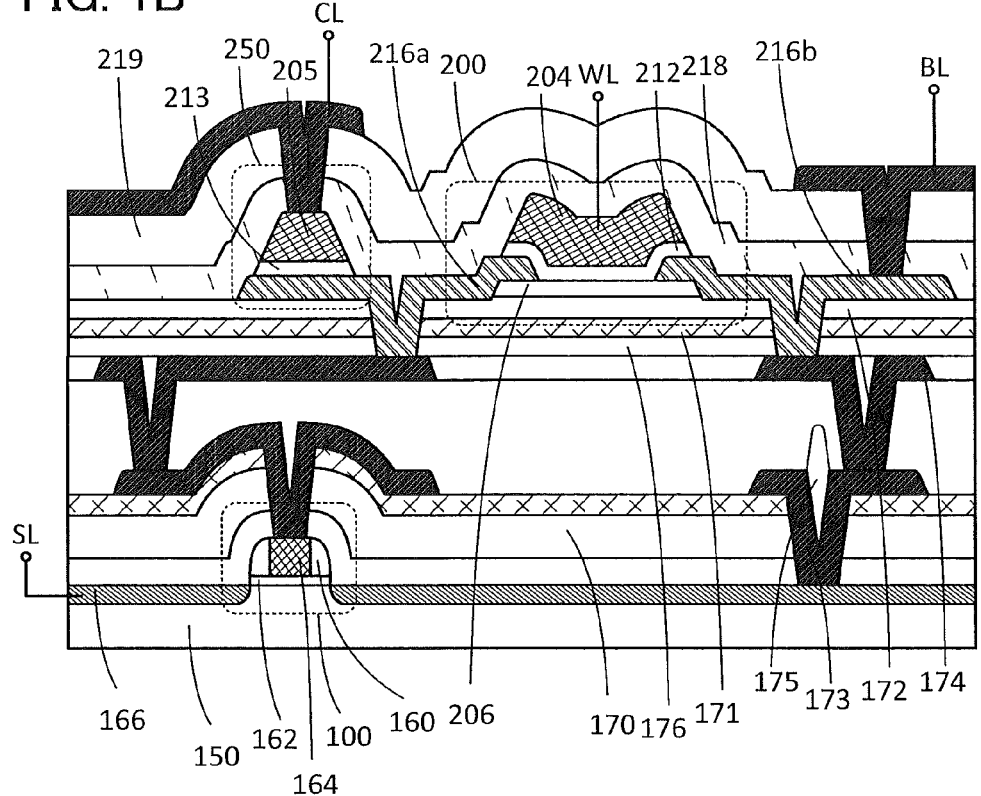

FIG. 1B is an example of a cross-sectional view of the semiconductor device in FIG. 1A.

The semiconductor device illustrated in FIG. 1B includes the transistor 100, the transistor 200, and the capacitor 250.

The transistor 100 is formed using a semiconductor substrate 150. The transistor 100 includes a projection of the semiconductor substrate 150, impurity regions 166 in the projection, an insulating film 162 including a region in contact with a top surface and a side surface of the projection, a conductive film 164 facing the top surface and the side surface of the projection with the insulating film 162 provided therebetween, and an insulating film 160 in contact with a side surface of the conductive film 164. The conductive film 164 serves as a gate electrode of the transistor 100. The impurity regions 166 serve as a source region and a drain region of the transistor 100. The transistor 100 does not necessarily include the insulating film 160. An insulating film may be provided over the projection of the semiconductor substrate 150. The insulating film serves as a mask for forming the projection.

Note that here is shown an example in which the semiconductor substrate 150 includes the projection; however, a semiconductor device of one embodiment of the present invention is not limited thereto. For example, a semiconductor having a projection may be formed by processing an SOI (silicon on insulator) substrate.

The transistor 100 may be either an n-channel transistor or a p-channel transistor, and an appropriate transistor is used in accordance with a circuit.

For example, single crystal silicon can be used for the semiconductor substrate 150, in which case the transistor 100 can operate at high speed.

In the semiconductor device illustrated in FIG. 1B, the transistor 200 is provided over the transistor 100 with an insulating film (e.g., an insulating film 176) provided therebetween. Between the transistor 100 and the transistor 200, a plurality of conductive films (e.g., a conductive film 173 and a conductive film 174) which serve as wirings are provided. Wirings and electrodes provided in an upper layer and a lower layer are electrically connected to each other by a plurality of conductive films embedded in insulating films.

For example, an insulating film 170 illustrated in FIG. 1B is preferably an insulating film containing hydrogen. In the case where a silicon-based semiconductor material is used for the transistor 100 provided below the insulating film 170 containing hydrogen, hydrogen in the insulating film 170 terminates dangling bonds of silicon when first heat treatment is performed; as a result, the electrical characteristics of the transistor 100 can be improved.

However, the amount of hydrogen in the insulating film 170 is larger than that needed to terminate dangling bonds of silicon, so that hydrogen remains in the insulating film or the conductive films serving as wirings. The remaining hydrogen adversely affects the transistor 200 including the oxide semiconductor film above the insulating film 170. Specifically, the hydrogen transfers to the transistor 200 in manufacturing steps of the transistor 200 or the subsequent long-term operation. The hydrogen causes generation of carriers in the oxide semiconductor film, which might deteriorate the electrical characteristics of the transistor 200.

Therefore, in the case where the transistor 200 including an oxide semiconductor is provided over the transistor 100 including a silicon-based semiconductor material, it is preferable that a barrier film 171 having a function of preventing diffusion of hydrogen be provided between the transistors.

However, when an opening is formed in the barrier film 171 so that the transistor 200 is electrically connected to the transistor 100 through the conductive films, hydrogen transfers to the transistor 200 through the opening and enters the oxide semiconductor film.

Hence, dehydrogenation or dehydration is performed by second heat treatment before the formation of the barrier film 171. The second heat treatment is preferably performed at as high a temperature as possible within the range that does not adversely affect the heat resistance of the conductive films and the like in the semiconductor device and the electrical characteristics of the transistor 100. Specifically, the second heat treatment is performed for less than or equal to 10 hours at a temperature higher than or equal to 450° C. and lower than 650° C., preferably higher than or equal to 490° C. and lower than 650° C., and more preferably higher than or equal to 530° C. and lower than 650° C., or may be performed at a temperature higher than or equal to 650° C. Note that the second heat treatment is preferably performed at a temperature lower than or equal to the temperature of the first heat treatment. This prevents the electrical characteristics of the transistor 100 from being deteriorated by the second heat treatment. In addition, the second heat treatment is preferably performed for a longer period than the first heat treatment. This improves the electrical characteristics of the transistor 200 without deteriorating the electrical characteristics of the transistor 100. Alternatively, the second heat treatment may be performed at a temperature higher than the temperature of the first heat treatment. In that case, dehydrogenation or dehydration can be performed completely, resulting in a further improvement of the electrical characteristics of the transistor 200. The first heat treatment can be omitted when the second heat treatment serves also as the first treatment.

The second heat treatment may be performed more than once. It is preferable that the second heat treatment be performed with a metal film or the like covered with an insulating film or the like.

The amount of hydrogen molecules released from the insulating films below the barrier film 171 at a given temperature higher than or equal to 400° C., preferably higher than or equal to 450° C., which is measured by thermal desorption spectroscopy (hereinafter referred to as TDS), is less than or equal to 130%, preferably less than or equal to 110% of the amount of released hydrogen molecules at 300° C. Alternatively, the amount of released hydrogen molecules at 450° C., which is measured by TDS, is less than or equal to 130%, preferably less than or equal to 110% of the amount of released hydrogen molecules at 350° C. Furthermore, the detection intensity of a mass-to-charge ratio of 2 with respect to temperature is preferably less than or equal to $4 \times 10^{-11}$ A at 400° C.

The amount of water and hydrogen contained in the barrier film 171 itself is also preferably low. For example, the barrier film 171 is preferably formed using a material where the amount of released hydrogen molecules (mass-to-charge ratio m/z=2) at a substrate surface temperature of 20° C. to 600° C., which is measured by TDS, is less than $2 \times 10^{15}/cm^2$, preferably less than $1 \times 10^{15}/cm^2$, and more preferably less than $5 \times 10^{14}/cm^2$. Alternatively, the barrier film 171 is preferably formed using a material where the amount of released water molecules (mass-to-charge ratio m/z=18) at a substrate surface temperature of 20° C. to 600° C., which is measured by TDS, is less than $1 \times 10^{16}/\text{cm}^2$, preferably less than $5 \times 10^{15}/\text{cm}^2$, and more preferably less than $2 \times 10^{12}/\text{cm}^2$. In addition, a barrier film (an insulating film in contact with the top surface of the insulating film 170 in FIG. 1B) is preferably provided in contact with the insulating film 170. The barrier film in contact with the insulating film 170 is not necessarily provided, and may be omitted as illustrated in FIG. 4B.

Such a structure improves the electrical characteristics of the transistor 100 and also improves the electrical characteristics of the transistor 200 because hydrogen is prevented from being diffused from the lower portion to the upper portion.

Such a structure including the plurality of stacked transistors leads to an increase in the degree of integration of the semiconductor device.

An opening may be formed in an insulating film and a void 175 may be formed between a conductive film embedded in the opening (e.g., the conductive film 173 illustrated in FIG. 1B) and an insulating film covering the conductive film. An opening may also be formed in an insulating film and a void may be formed between a conductive film embedded in the opening (e.g., the conductive film 174 illustrated in FIG. 1B) and an insulating film that has been planarized. Slurry used in the planarization treatment may remain in the void or on the film surface subjected to the treatment. The void or the slurry relieves the stress of the film to suppress peeling, resulting in high yield production.

The transistor 200 includes the insulating film 172 having a projection over the barrier film 171; an oxide semiconductor film 206 over the projection of the insulating film 172; a conductive film 216a and a conductive film 216b which are in contact with the oxide semiconductor film 206; a gate insulating film 212 over the oxide semiconductor film 206, the conductive film 216a, and the conductive film 216b; and a conductive film 204 which is in contact with a top surface of the gate insulating film 212 and faces top and side surfaces of the oxide semiconductor film 206. Note that the insulating film 172 does not necessarily include the projection. The conductive film 204 serves as a gate electrode of the transistor 200. The conductive films 216a and 216b serve as a source electrode and a drain electrode of the transistor 200.

Moreover, a barrier film 218 having a function of blocking hydrogen is preferably formed over the transistor 200 to cover the transistor 200. An insulating film 219 may be further provided over the barrier film 218.

With the projection of the insulating film 172, the transistor 200 has a structure in which the oxide semiconductor film 206 can be electrically surrounded by an electric field of the conductive film 204 (a structure of a transistor in which a semiconductor is electrically surrounded by an electric field of a conductive film is referred to as a surrounded channel (s-channel) structure). Therefore, a channel is formed in the entire oxide semiconductor film 206 (bulk) in some cases. In the s-channel structure, the drain current of the transistor can be increased, so that a larger amount of on-state current can be obtained. Furthermore, the entire channel formation region of the oxide semiconductor film 206 can be depleted by the electric field of the conductive film 204. Accordingly, the off-state current of the transistor with an s-channel structure can be further reduced. A semiconductor device with the s-channel structure will be described below in Modification example 4.

At least part (or all) of the conductive film 216a (and/or the conductive film 216b) is provided on at least part (or all) of a surface, a side surface, a top surface, and/or a bottom surface of a semiconductor, e.g., the oxide semiconductor film 206.

Alternatively, at least part (or all) of the conductive film 216a (and/or the conductive film 216b) is in contact with at least part (or all) of a surface, a side surface, a top surface, and/or a bottom surface of a semiconductor, e.g., the oxide semiconductor film 206. Further alternatively, at least part (or all) of the conductive film 216a (and/or the conductive film 216b) is in contact with at least part (or all) of a semiconductor, e.g., the oxide semiconductor film 206.

Alternatively, at least part (or all) of the conductive film 216a (and/or the conductive film 216b) is electrically connected to at least part (or all) of a surface, a side surface, a top surface, and/or a bottom surface of a semiconductor, e.g., the oxide semiconductor film 206. Further alternatively, at least part (or all) of the conductive film 216a (and/or the conductive film 216b) is electrically connected to at least part (or all) of a semiconductor, e.g., the oxide semiconductor film 206.

Alternatively, at least part (or all) of the conductive film 216a (and/or the conductive film 216b) is provided near at least part (or all) of a surface, a side surface, a top surface, and/or a bottom surface of a semiconductor, e.g., the oxide semiconductor film 206. Further alternatively, at least part (or all) of the conductive film 216a (and/or the conductive film 216b) is provided near at least part (or all) of a semiconductor, e.g., the oxide semiconductor film 206.

Alternatively, at least part (or all) of the conductive film 216a (and/or the conductive film 216b) is provided on a side of at least part (or all) of a surface, a side surface, a top surface, and/or a bottom surface of a semiconductor, e.g., the oxide semiconductor film 206. Further alternatively, at least part (or all) of the conductive film 216a (and/or the conductive film 216b) is provided on a side of at least part (or all) of a semiconductor, e.g., the oxide semiconductor film 206.

Alternatively, at least part (or all) of the conductive film 216a (and/or the conductive film 216b) is provided obliquely above at least part (or all) of a surface, a side surface, a top surface, and/or a bottom surface of a semiconductor, e.g., the oxide semiconductor film 206. Further alternatively, at least part (or all) of the conductive film 216a (and/or the conductive film 216b) is provided obliquely above at least part (or all) of a semiconductor, e.g., the oxide semiconductor film 206.

Alternatively, at least part (or all) of the conductive film 216a (and/or the conductive film 216b) is provided above at least part (or all) of a surface, a side surface, a top surface, and/or a bottom surface of a semiconductor, e.g., the oxide semiconductor film 206. Further alternatively, at least part (or all) of the conductive film 216a (and/or the conductive film 216b) is provided above at least part (or all) of a semiconductor, e.g., the oxide semiconductor film 206.

The capacitor 250 illustrated in FIG. 1B includes the conductive film 216a; an insulating film 213 which is in contact with the conductive film 216a and is formed in the same step as the gate insulating film 212; and a conductive film 205 which is in contact with the insulating film 213 and is found in the same step as the conductive film 204. Note that the conductive film 216a serves as one electrode of the capacitor 250, and the conductive film 205 serves as the other electrode of the capacitor 250.

The conductive film 216b is electrically connected to the wiring BL. The conductive film 205 is electrically connected to the wiring CL. The conductive film 204 is electrically connected to the wiring WL.

Hereinafter, the components of the transistors 100 and 200 and the capacitor 250, and the insulating films and the conductive films between the components will be described in detail.

There is no large limitation on the semiconductor substrate 150. For example, a single crystal semiconductor substrate or a polycrystalline semiconductor substrate made of silicon, silicon carbide, gallium arsenide, or the like, a compound semiconductor substrate made of silicon germanium or the like, or an SOI substrate may be used. Alternatively, any of these substrates provided with a semiconductor element may be used. It is also possible to use a semiconductor substrate made of silicon having lattice distortion. The transistor 110 may be a high-electron-mobility transistor (HEMT) using GaAs and GaAlAs.

The impurity regions 166 are formed by adding phosphorus (P), arsenic (As), or the like to the semiconductor substrate 150. Note that phosphorus or arsenic is added here in order to form an n-type transistor; an impurity element such as boron (B) or aluminum (Al) may be added in the case of forming a p-type transistor.

The insulating film 162 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulating film 160 can be formed using a material similar to that of the insulating film 162.

The conductive film 164 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example. The conductive film 164 may be formed by a sputtering method, a chemical vapor deposition (CVD) method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, and the like. The CVD methods can be further classified into a metal CVD (MCVD) method and a metal organic CVD (MOCVD) method depending on a source gas.

By using the PECVD method, a high-quality film can be formed at a relatively low temperature. By using the TCVD method, in which plasma is not used, a film with few defects can be formed because damage caused by plasma does not occur.

When the CVD method is used, the composition of a film to be formed can be controlled with the flow rate ratio of source gases. For example, by the MCVD method and the MOCVD method, a film with a certain composition can be formed depending on the flow rate ratio of the source gases. Moreover, with the MCVD method and the MOCVD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors can be manufactured with improved productivity.

The insulating film 170 is preferably an insulating film containing hydrogen, that is, an insulating film that can release hydrogen. For example, a silicon nitride film or a silicon nitride oxide film can be used as the insulating film 170. In the case where a silicon-based semiconductor material is used for the transistor 100, hydrogen in the insulating film 170 terminates dangling bonds of silicon in the semiconductor substrate 150; as a result, the electrical characteristics of the transistor 100 can be improved.

The barrier film 171 has a function of preventing diffusion of impurities from the transistor 100. The barrier film 171 may be, for example, formed to have a single-layer structure or a stacked-layer structure using an insulating film containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like. The barrier film 171 may be formed by a sputtering method, a CVD method, an MBE method, a PLD method, an ALD method, or the like. In particular, a DC sputtering method is preferably employed because dust generated in the deposition can be reduced and the film thickness can be uniform.

The insulating film 172 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulating film 172 preferably includes a region containing oxygen at a higher proportion than oxygen in the stoichiometric composition. The insulating film 172 including a region containing oxygen at a higher proportion than oxygen in the stoichiometric composition can have a function of supplying oxygen to the oxide semiconductor film 206.

The insulating film 172 may be formed by a sputtering method, a CVD method, an MBE method, a PLD method, an ALD method, or the like.

Note that in the case where the insulating film 172 is a stacked-layer film, films in the stacked-layer film may be formed by different formation methods such as the above formation methods. For example, the first layer may be formed by a CVD method and the second layer may be formed by an ALD method. Alternatively, the first layer may be formed by a sputtering method and the second layer may be formed by an ALD method. By thus using different formation methods, the films can have different functions or different properties. Then, by stacking the films, a more appropriate film can be formed as a stacked-layer film.

In other words, an n-th film is formed by at least one of a sputtering method, a CVD method, an MBE method, a PLD method, an ALD method, and the like, and an (n+1)th film is formed by at least one of a sputtering method, a CVD method, an MBE method, a PLD method, an ALD method, and the like (n is a natural number). Note that the n-th film and the (n+1)th film may be formed by the same formation method or different formation methods. Note that the n-th film and an (n+2)th film may be formed by the same formation method. Alternatively, all the films may be formed by the same formation method.

To planarize the surface of the insulating film to be the insulating film 172, chemical mechanical polishing (CMP) treatment may be performed. By CMP treatment, the insulating film to be the insulating film 172 has an average surface roughness (Ra) of 1 nm or less, preferably 0.3 nm or less, and more preferably 0.1 nm or less. In some cases, Ra that is less than or equal to the above value can increase the crystallinity of the oxide semiconductor film 206. Ra can be measured using an atomic force microscope (AFM).

The oxide semiconductor which can be used for the oxide semiconductor film 206 is an oxide containing indium. An oxide can have a high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element that can increase the energy gap of the oxide, for example. Furthermore, the oxide semiconductor preferably contains zinc. When the oxide contains zinc, the oxide can be easily crystallized, for example.

Note that the oxide semiconductor is not limited to the oxide containing indium. The oxide semiconductor may be, for example, zinc tin oxide or gallium tin oxide.

For the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, and more preferably greater than or equal to 3 eV and less than or equal to 3.5 eV.

An influence of impurities in the oxide semiconductor is described below. In order to obtain stable electrical characteristics of a transistor, it is effective to reduce the concentration of impurities in the oxide semiconductor to have a lower carrier density so that the oxide semiconductor is highly purified. The carrier density of the oxide semiconductor is set to be lower than $1\times10^{17}/cm^3$, lower than $1\times10^{15}/cm^3$, or lower than $1\times10^{13}/cm^3$. In order to reduce the concentration of impurities in the oxide semiconductor, the concentration of impurities in a film which is adjacent to the oxide semiconductor is also preferably reduced.

Note that an impurity in a semiconductor film refers to, for example, elements other than the main components of the semiconductor film. For example, an element with a concentration of lower than 0.1 atomic % is an impurity. When an impurity is contained, density of states (DOS) may be formed in the semiconductor film, the carrier mobility may be decreased, or the crystallinity may be lowered, for example. In the case where the semiconductor film is an oxide semiconductor film, examples of an impurity which changes the characteristics of the semiconductor film include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor film is an oxide semiconductor film, oxygen vacancies may be formed by entry of impurities.

When DOS exists inside an oxide semiconductor film and in the vicinity of the interface between the oxide semiconductor film and the outside, DOS can cause deterioration of a transistor including the oxide semiconductor film. The DOS inside the oxide semiconductor film and in the vicinity of the interface of the oxide semiconductor film can be explained on the basis of the positions of and the bonding relation among oxygen (O), an oxygen vacancy ($V_O$), and hydrogen (H). A concept of out model is described below for understanding of characteristics.

Our conclusion is that: in order to fabricate a transistor with stable electrical characteristics, it is important to reduce the DOS inside the oxide semiconductor film and in the vicinity of the interface of the oxide semiconductor film (to make a highly purified intrinsic state). To reduce the DOS, oxygen vacancies and hydrogen should be reduced. It is explained below with a model why oxygen vacancies and hydrogen should be reduced for minimizing the DOS inside the oxide semiconductor film and in the vicinity of the interface.

Figure 10:
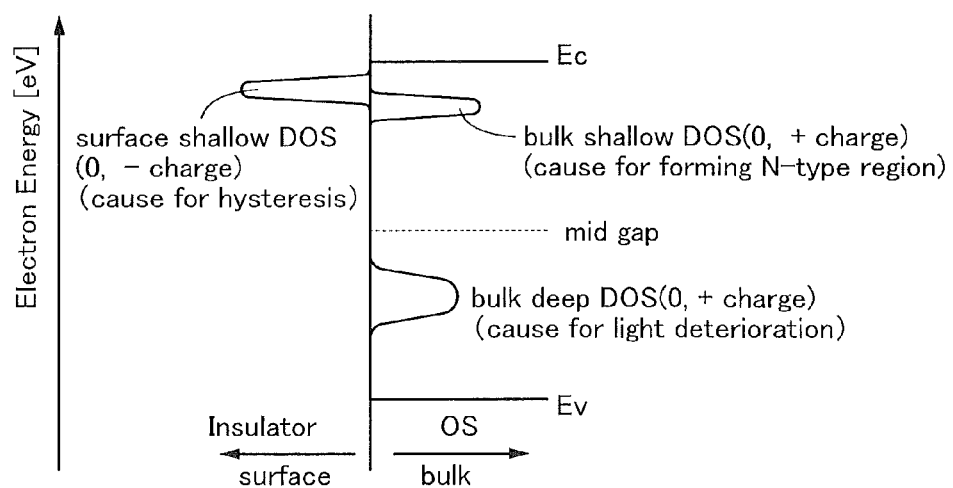
FIG. 10 illustrates a band structure of DOS inside an oxide semiconductor film and in the vicinity of the interface of the oxide semiconductor film.

FIG. 10 illustrates a band structure of DOS inside an oxide semiconductor film and in the vicinity of the interface of the oxide semiconductor film. Description is made below on the assumption that the oxide semiconductor film is an oxide semiconductor film containing indium, gallium, and zinc.

There are two types of DOS, DOS at a shallow level (shallow level DOS) and DOS at a deep level (deep level DOS). Note that in this specification, the shallow level DOS refers to DOS between energy at the conduction band minimum (Ec) and the mid gap. Thus, for example, the shallow level DOS is located closer to energy at the conduction band minimum. Note that in this specification, the deep level DOS refers to DOS between energy at the valence band maximum (Ev) and the mid gap. Thus, for example, the deep level DOS is located closer to the mid gap than to energy at the valence band maximum.

Hence, in the oxide semiconductor film, there are two types of shallow level DOS. One is DOS in the vicinity of a surface of an oxide semiconductor film (at the interface with an insulating film (insulator) or in the vicinity of the interface with the insulating film), that is, surface shallow DOS. The other is DOS inside the oxide semiconductor film, that is, bulk shallow DOS. Furthermore, as a type of the deep level DOS, there is DOS inside the oxide semiconductor film, that is, bulk deep DOS.

These types of DOS are likely to act in the following manner. The surface shallow DOS in the vicinity of the surface of an oxide semiconductor film is located at a shallow level from the conduction band minimum, and thus trap and loss of an electric charge are likely to occur in the surface shallow DOS. The bulk shallow DOS inside the oxide semiconductor film is located at a deep level from the conduction band minimum as compared to the surface shallow DOS in the vicinity of the surface of the oxide semiconductor film, and thus loss of an electric charge does not easily occur in the bulk shallow DOS.

An element causing DOS in an oxide semiconductor film is described below.

For example, when a silicon oxide film is formed over an oxide semiconductor film, indium contained in the oxide semiconductor film is taken into the silicon oxide film and replaced with silicon to form shallow level DOS.

For example, in the interface between the oxide semiconductor film and the silicon oxide film, a bond between oxygen and indium contained in the oxide semiconductor film is broken and a bond between the oxygen and silicon is generated. This is because the bonding energy between silicon and oxygen is higher than the bonding energy between indium and oxygen, and the valence of silicon (tetravalence) is larger than the valence of indium (trivalence). Oxygen contained in the oxide semiconductor film is trapped by silicon, so that a site of oxygen that has been bonded to indium becomes an oxygen vacancy. In addition, this phenomenon occurs similarly when silicon is contained inside the oxide semiconductor film, as well as in the surface. Such an oxygen vacancy forms deep level DOS.

Another cause as well as silicon can break the bond between indium and oxygen. For example, in an oxide semiconductor film containing indium, gallium, and zinc, the bond between indium and oxygen is weaker and cut more easily than the bond between oxygen and gallium or zinc. For this reason, the bond between indium and oxygen is broken by plasma damages or damages due to sputtered particles, so that an oxygen vacancy can be produced. The oxygen vacancy foul's deep level DOS. The deep level DOS can trap a hole and thus serve as a hole trap (hole trapping center). This means that the oxygen vacancy forms bulk deep DOS inside the oxide semiconductor film.

Such deep level DOS due to an oxygen vacancy is one of causes for forming the surface shallow DOS in the vicinity of the surface of the oxide semiconductor film or the bulk shallow DOS inside the oxide semiconductor film because of hydrogen.

Since such an oxygen vacancy forms DOS, the oxygen vacancy is an instability factor to the oxide semiconductor film. In addition, an oxygen vacancy in the oxide semiconductor film traps hydrogen to be metastable. That is, when an oxygen vacancy that forms deep level DOS and is a hole trap being capable of trapping a hole traps hydrogen, a shallow level DOS is formed. As a result, the shallow level DOS can serve as an electron trap that can capture an electron or serve as a generator of an electron. In this manner, an oxygen vacancy captures hydrogen. However, an oxygen vacancy can be positively (neutrally or positively) charged or negatively (neutrally or negatively) charged, depending on the location of hydrogen in the oxide semiconductor film. Thus, hydrogen might give an adverse effect on a transistor including the oxide semiconductor film.

The concentration of hydrogen in the oxide semiconductor measured by SIMS is set to be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, and still more preferably lower than or equal to $5 \times 10^{18}$ atoms/cm$^3$. When nitrogen is contained in the oxide semiconductor, the carrier density is increased in some cases. The concentration of nitrogen in the oxide semiconductor measured by SIMS is set to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, and still more preferably lower than or equal to $5 \times 10^{17}$ atoms/cm$^3$.

It is preferable to reduce the concentration of hydrogen in the insulating film 172 in order to reduce the concentration of hydrogen in the oxide semiconductor. The concentration of hydrogen in the insulating film 172 measured by SIMS is set to be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, and still more preferably lower than or equal to $5 \times 10^{18}$ atoms/cm$^3$. It is preferable to reduce the concentration of nitrogen in the insulating film 172 in order to reduce the concentration of nitrogen in the oxide semiconductor. The concentration of nitrogen in the insulating film 172 measured by SIMS is set to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, and still more preferably lower than or equal to $5 \times 10^{17}$ atoms/cm$^3$.

It is preferable to reduce the concentration of hydrogen in the gate insulating film 212 in order to reduce the concentration of hydrogen in the oxide semiconductor. The concentration of hydrogen in the gate insulating film 212 measured by SIMS is set to be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, and still more preferably lower than $5 \times 10^{18}$ atoms/cm$^3$. It is preferable to reduce the concentration of nitrogen in the gate insulating film 212 in order to reduce the concentration of nitrogen in the oxide semiconductor. The concentration of nitrogen in the gate insulating film 212 measured by SIMS is set to be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, and still more preferably lower than or equal to $5 \times 10^{17}$ atoms/cm$^3$.

Silicon in the oxide semiconductor might serve as a carrier trap or a carrier generation source in some cases. Therefore, the concentration of silicon in a region between the oxide semiconductor and the insulating film 172 measured by secondary ion mass spectrometry (SIMS) is set to be lower than $1 \times 10^{19}$ atoms/cm$^3$, preferably lower than $5 \times 10^{18}$ atoms/cm$^3$, and more preferably lower than $2 \times 10^{18}$ atoms/cm$^3$. The concentration of silicon in a region between the oxide semiconductor and the insulating film 172 measured by SIMS is set to be lower than $1 \times 10^{19}$ atoms/cm$^3$, preferably lower than $5 \times 10^{18}$ atoms/cm$^3$, and more preferably lower than $2 \times 10^{18}$ atoms/cm$^3$.

<Structure of Oxide Semiconductor Film>

The structure of the oxide semiconductor film will be described below.

An oxide semiconductor film is classified into a single crystal oxide semiconductor film and a non-single-crystal oxide semiconductor film. Examples of the non-single-crystal oxide semiconductor film include a c-axis aligned crystalline oxide semiconductor (CAAC-OS) film, a polycrystalline oxide semiconductor film, a microcrystalline oxide semiconductor film, and an amorphous oxide semiconductor film.

From another perspective, an oxide semiconductor film is classified into an amorphous oxide semiconductor film and a crystalline oxide semiconductor film. Examples of the crystalline oxide semiconductor film include a single crystal oxide semiconductor film, a CAAC-OS film, a polycrystalline oxide semiconductor film, and a microcrystalline oxide semiconductor film.

<CAAC-OS Film>

First, a CAAC-OS film is described. Note that a CAAC-OS film can be referred to as an oxide semiconductor film including c-axis aligned nanocrystals (CANC).

A CAAC-OS film is one of oxide semiconductor films having a plurality of c-axis aligned crystal parts (also referred to as pellets).

In a combined analysis image (also referred to as a high-resolution TEM image) of a bright-field image and a diffraction pattern of a CAAC-OS film, which is obtained using a transmission electron microscope (TEM), a plurality of pellets can be observed. However, in the high-resolution TEM image, a boundary between pellets, that is, a grain boundary is not clearly observed. Thus, in the CAAC-OS film, a reduction in electron mobility due to the grain boundary is less likely to occur.

Figure 12A:
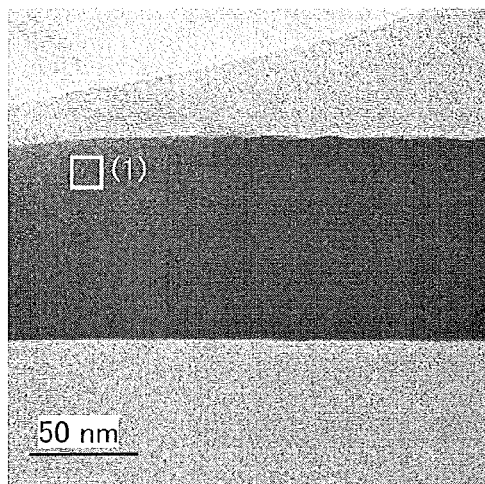
FIGS. 12A to 12C are Cs-corrected high-resolution TEM images of a cross section of a CAAC-OS.

A CAAC-OS film observed with TEM is described below. FIG. 12A shows a high-resolution TEM image of a cross section of the CAAC-OS film which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 12B:
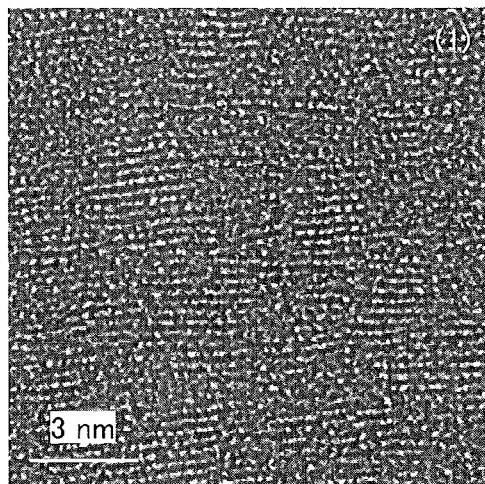

FIG. 12B is an enlarged Cs-corrected high-resolution TEM image of a region (1) in FIG. 12A. FIG. 12B shows that metal atoms are arranged in a layered manner in a pellet. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

Figure 12C:
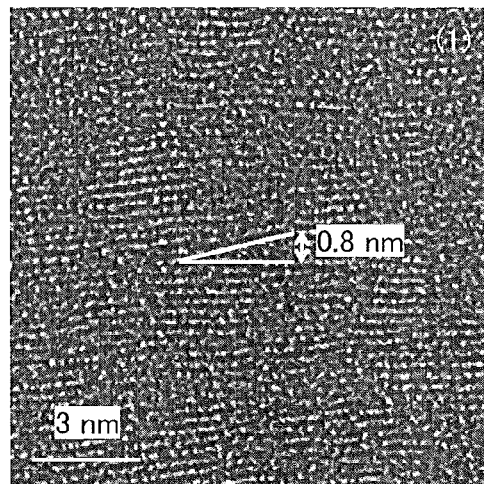

As shown in FIG. 12B, the CAAC-OS film has a characteristic atomic arrangement. The characteristic atomic arrangement is denoted by an auxiliary line in FIG. 12C. FIGS. 12B and 12C prove that the size of a pellet is approximately 1 nm to 3 nm, and the size of a space caused by tilt of the pellets is approximately 0.8 nm. Therefore, the pellet can also be referred to as a nanocrystal (nc).

Figure 12D:
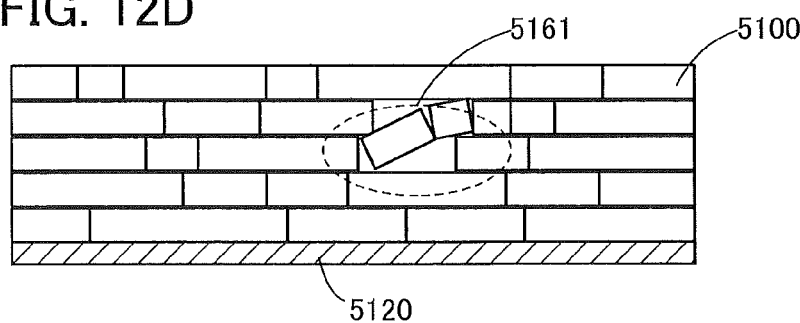
FIG. 12D is a cross-sectional schematic view of the CAAC-OS.

Here, according to the Cs-corrected high-resolution TEM images, the schematic arrangement of pellets 5100 of a CAAC-OS film over a substrate 5120 is illustrated by such a structure in which bricks or blocks are stacked (see FIG. 12D). The part in which the pellets are tilted as observed in FIG. 12C corresponds to a region 5121 shown in FIG. 12D.

FIG. 13A shows a Cs-corrected high-resolution TEM image of a plane of the CAAC-OS film observed from a direction substantially perpendicular to the sample surface. FIGS. 13B, 13C, and 13D are enlarged Cs-corrected high-resolution TEM images of regions (1), (2), and (3) in FIG. 13A, respectively. FIGS. 13B, 13C, and 13D indicate that metal atoms are arranged in a triangular, quadrangular, or hexagonal configuration in a pellet. However, there is no regularity of arrangement of metal atoms between different pellets.

Figure 14A:
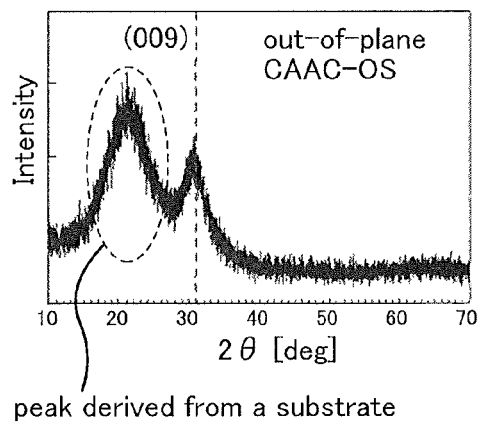
FIGS. 14A to 14C show structural analysis of a CAAC-OS and a single crystal oxide semiconductor by XRD.

Next, a CAAC-OS film analyzed by X-ray diffraction (XRD) is described. For example, when the structure of a CAAC-OS film including an $InGaZnO_4$ crystal is analyzed by an out-of-plane method, a peak appears at a diffraction angle ($2\theta$) of around 31° as shown in FIG. 14A. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS film. It is preferable that in the CAAC-OS film analyzed by an out-of-plane method, a peak appear when $2\theta$ is around 31° and that a peak not appear when $2\theta$ is around 36°.

Figure 14B:
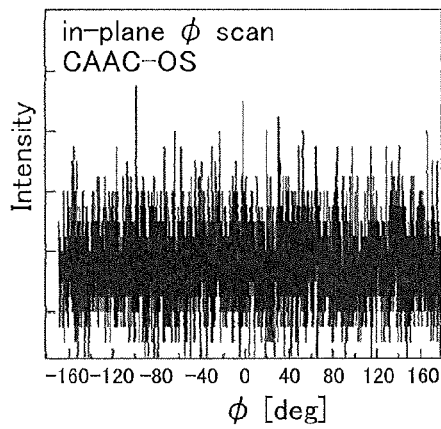
Figure 14C:
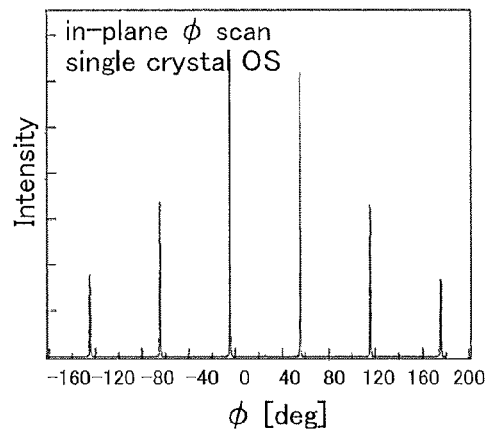

On the other hand, in structural analysis of the CAAC-OS film by an in-plane method in which an X-ray is incident on a sample in a direction substantially perpendicular to the c-axis, a peak appears when $2\theta$ is around 56°. This peak is attributed to the (110) plane of the $InGaZnO_4$ crystal. In the case of the CAAC-OS film, when analysis ($\phi$ scan) is performed with $2\theta$ fixed at around 56° and with the sample rotated using a normal vector of the sample surface as an axis ($\phi$ axis), as shown in FIG. 14B, a peak is not clearly observed. In contrast, in the case of a single crystal oxide semiconductor of $InGaZnO_4$, when $\phi$ scan is performed with $2\theta$ fixed at around 56°, as shown in FIG. 14C, six peaks which are derived from crystal planes equivalent to the (110) plane are observed. Accordingly, the structural analysis using XRD shows that the directions of a-axes and b-axes are different in the CAAC-OS film.

Next, a CAAC-OS film analyzed by electron diffraction is described. For example, when an electron beam with a probe diameter of 300 nm is incident on a CAAC-OS film including an $InGaZnO_4$ crystal in a direction parallel to the sample surface, a diffraction pattern (also referred to as a selected-area transmission electron diffraction pattern) shown in FIG. 15A might be obtained. In this diffraction pattern, spots derived from the (009) plane of an $InGaZnO_4$ crystal are included. Thus, the electron diffraction also indicates that pellets included in the CAAC-OS film have c-axis alignment and that the c-axes are aligned in a direction substantially perpendicular to the formation surface or the top surface of the CAAC-OS film. Meanwhile, FIG. 15B shows a diffraction pattern obtained in such a manner that an electron beam with a probe diameter of 300 nm is incident on the same sample in a direction perpendicular to the sample surface. As shown in FIG. 15B, a ring-like diffraction pattern is observed. Thus, the electron diffraction also indicates that the a-axes and b-axes of the pellets included in the CAAC-OS film do not have regular alignment. The first ring in FIG. 15B is considered to be derived from the (010) plane, the (100) plane, and the like of the $InGaZnO_4$ crystal. The second ring in FIG. 15B is considered to be derived from the (110) plane and the like.

Moreover, the CAAC-OS film is an oxide semiconductor film having a low density of defect states. Defects in the oxide semiconductor film are, for example, a defect due to impurity and oxygen vacancy. Therefore, the CAAC-OS film can be regarded as an oxide semiconductor film with a low impurity concentration, or an oxide semiconductor film having a small amount of oxygen vacancy.

The impurity contained in the oxide semiconductor film might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor film, such as hydrogen, carbon, silicon, or a transition metal element. For example, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity.

An oxide semiconductor film having a low density of defect states (a small amount of oxygen vacancy) can have a low carrier density. Such an oxide semiconductor film is referred to as a highly purified intrinsic or substantially highly purified intrinsic oxide semiconductor film. A CAAC-OS film has a low impurity concentration and a low density of defect states. That is, a CAAC-OS film is likely to be highly purified intrinsic or substantially highly purified intrinsic oxide semiconductor film. Thus, a transistor including a CAAC-OS film rarely has negative threshold voltage (is rarely normally on). The highly purified intrinsic or substantially highly purified intrinsic oxide semiconductor film has few carrier traps. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics. However, a transistor including a CAAC-OS film has small variation in electrical characteristics and high reliability.

Since the CAAC-OS film has a low density of defect states, carriers generated by light irradiation or the like are less likely to be trapped in defect states. Therefore, in a transistor using the CAAC-OS film, change in electrical characteristics due to irradiation with visible light or ultraviolet light is small.

<Microcrystalline Oxide Semiconductor Film>

Next, a microcrystalline oxide semiconductor film is described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS, for example, a grain boundary is not clearly observed in some cases. Note that there is a possibility that the origin of the nanocrystal is the same as that of a pellet in a CAAC-OS film. Therefore, a crystal part of the nc-OS film may be referred to as a pellet in the following description.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the size of a pellet, a peak that shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS film when an electron beam having a probe diameter close to or smaller than the size of a pellet is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since there is no regularity of crystal orientation between the pellets (nanocrystals) as mentioned above, the nc-OS film can also be referred to as an oxide semiconductor film including random aligned nanocrystals (RANC) or an oxide semiconductor film including non-aligned nanocrystals (NANC).

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different pellets in the nc-OS film. Therefore, the nc-OS film has a higher density of defect states than the CAAC-OS film.

<Amorphous Oxide Semiconductor Film>

Next, an amorphous oxide semiconductor film is described.

The amorphous oxide semiconductor film is an oxide semiconductor film having disordered atomic arrangement and no crystal part and exemplified by an oxide semiconductor film which exists in an amorphous state as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and only a halo pattern appears when the amorphous oxide semiconductor film is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor film to be called an amorphous oxide semiconductor film as long as even a negligible degree of ordering is present in an atomic arrangement. At least an oxide semiconductor film having long-term ordering cannot be called an amorphous oxide semiconductor film. Accordingly, because of the presence of crystal part, for example, a CAAC-OS film and an nc-OS film cannot be called an amorphous oxide semiconductor film or a completely amorphous oxide semiconductor film.

<Amorphous-Like Oxide Semiconductor Film>

Note that an oxide semiconductor film may have a structure intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed.

The a-like OS film has an unstable structure because it includes a void. To verify that an a-like OS film has an unstable structure as compared with a CAAC-OS film and an nc-OS film, a change in structure caused by electron irradiation is described below.

An a-like OS film (sample A), an nc-OS film (sample B), and a CAAC-OS film (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 16:
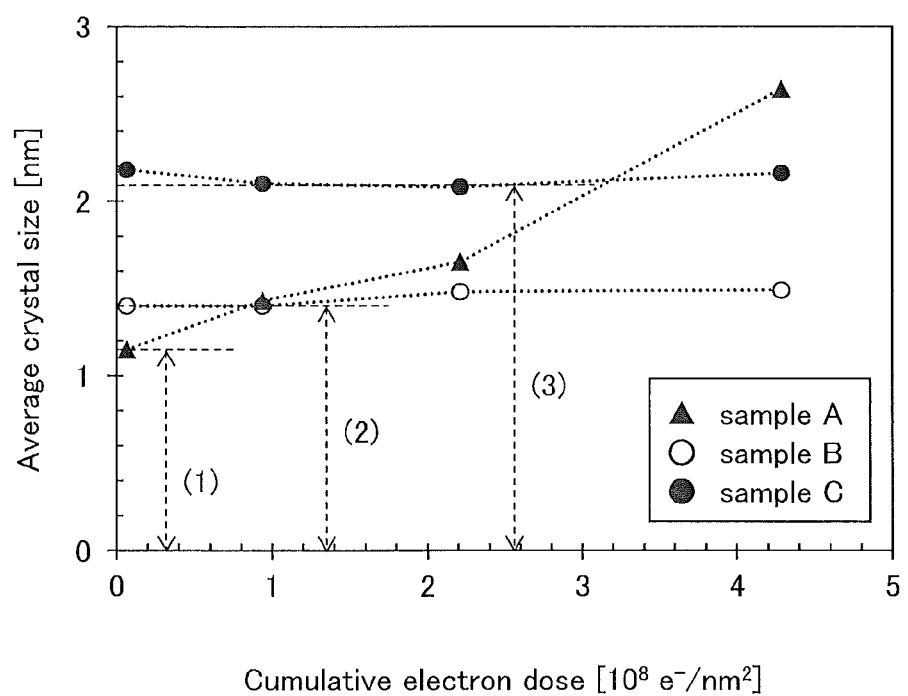
FIG. 16 shows a change in the crystal part of an In—Ga—Zn oxide induced by electron irradiation.

FIG. 16 shows a change in the average size of crystal parts (at 22 points to 45 points) in each sample. Note that the crystal part size corresponds to the length of a lattice fringe. FIG. 16 indicates that the crystal part size in the a-like OS film increases with an increase in the cumulative electron dose. Specifically, as shown by (1) in FIG. 16, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS film and the CAAC-OS film shows little change from the start of electron irradiation to a cumulative electron dose of $4.2\times10^8$ $e^-/nm^2$. Specifically, as shown by (2) and (3) in FIG. 16, the average crystal sizes in an nc-OS film and a CAAC-OS film are approximately 1.4 nm and approximately 2.1 nm, respectively, regardless of the cumulative electron dose.

In this manner, growth of the crystal part in the a-like OS film is induced by electron irradiation. In contrast, in the nc-OS film and the CAAC-OS film, growth of the crystal part is hardly induced by electron irradiation. Therefore, the a-like OS film has an unstable structure as compared with the nc-OS film and the CAAC-OS film.

The a-like OS film has a lower density than the nc-OS film and the CAAC-OS film because it includes a void. Specifically, the density of the a-like OS film is higher than or equal to 78.6% and lower than 92.3% of the density of the single crystal oxide semiconductor film having the same composition. The density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate the density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductor films have various structures and various properties. Note that an oxide semiconductor film may be a stacked film including two or more films of an amorphous oxide semiconductor film, an a-like OS film, a microcrystalline oxide semiconductor film, and a CAAC-OS film, for example.

<Deposition Model>

Examples of deposition models of a CAAC-OS film and an nc-OS film are described below.

Figure 17A:
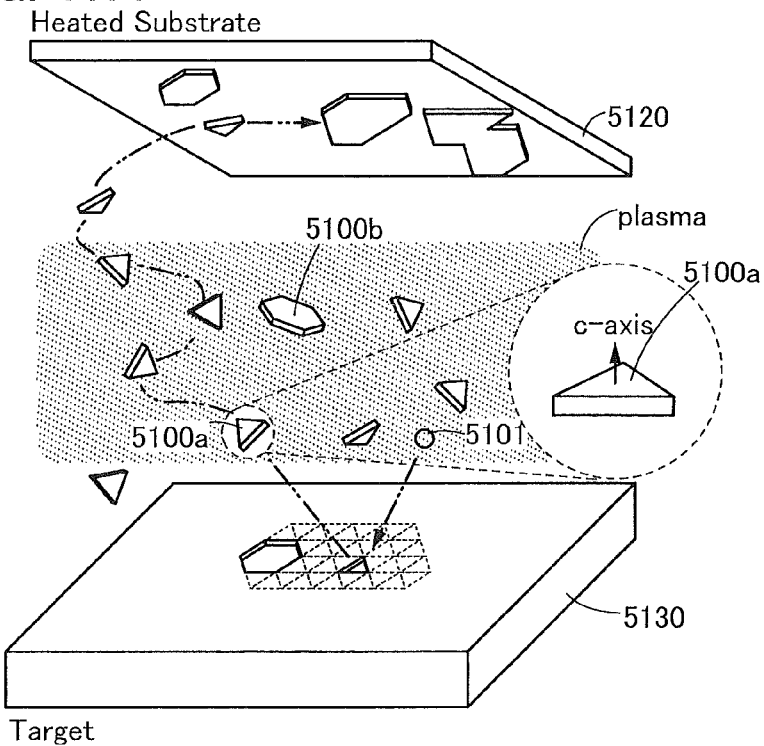
FIGS. 17A and 17B are schematic views showing deposition models of a CAAC-OS and an nc-OS.

FIG. 17A is a schematic view of the inside of a deposition chamber where a CAAC-OS film is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 18A:
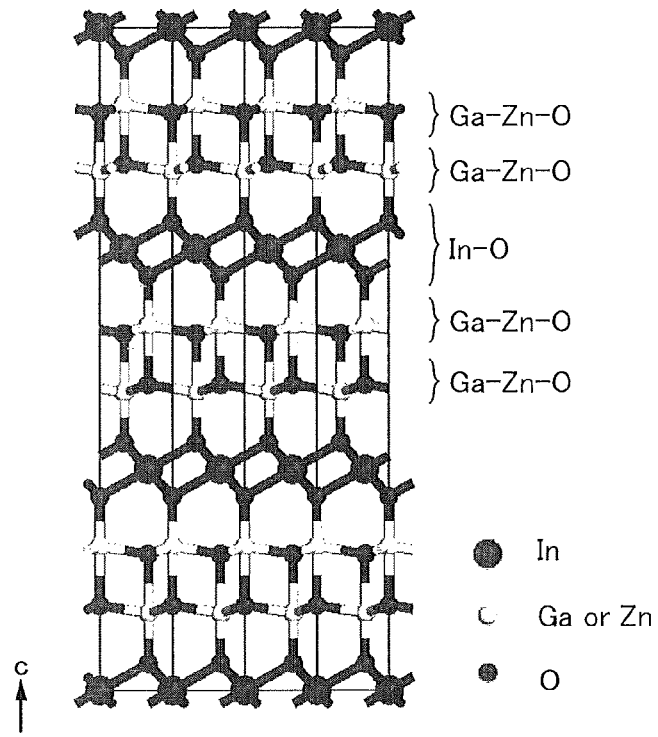
FIGS. 18A to 18C show an InGaZnO$_4$ crystal and a pellet.

Here, the target 5130 has a polycrystalline structure which includes a plurality of crystal grains and in which a cleavage plane exists in at least one crystal grain. FIG. 18A shows a structure of an $InGaZnO_4$ crystal included in the target 5130 as an example. Note that FIG. 18A shows a structure of the case where the $InGaZnO_4$ crystal is observed from a direction parallel to the b-axis. FIG. 18A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet

5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 18B:
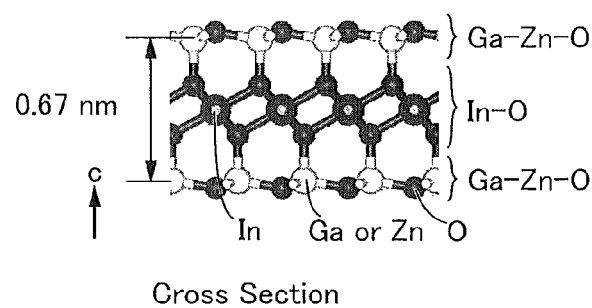
Figure 18C:
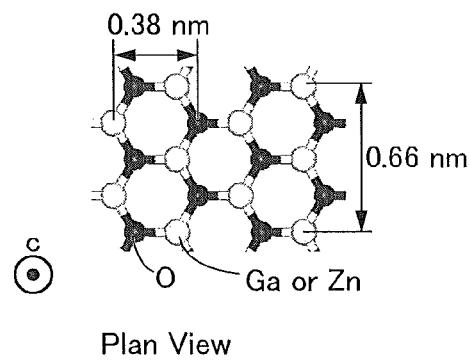

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness rather than a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 16. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 18B is separated. Note that FIG. 18C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS film is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in the size between (2) and (1) in FIG. 16 corresponds to the amount of growth in plasma. Here, in the case where the temperature of the substrate 5120 is at around room temperature, the pellet 5100 on the substrate 5120 hardly grows; thus, an nc-OS film is formed (see FIG. 17B). An nc-OS film can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 17B:
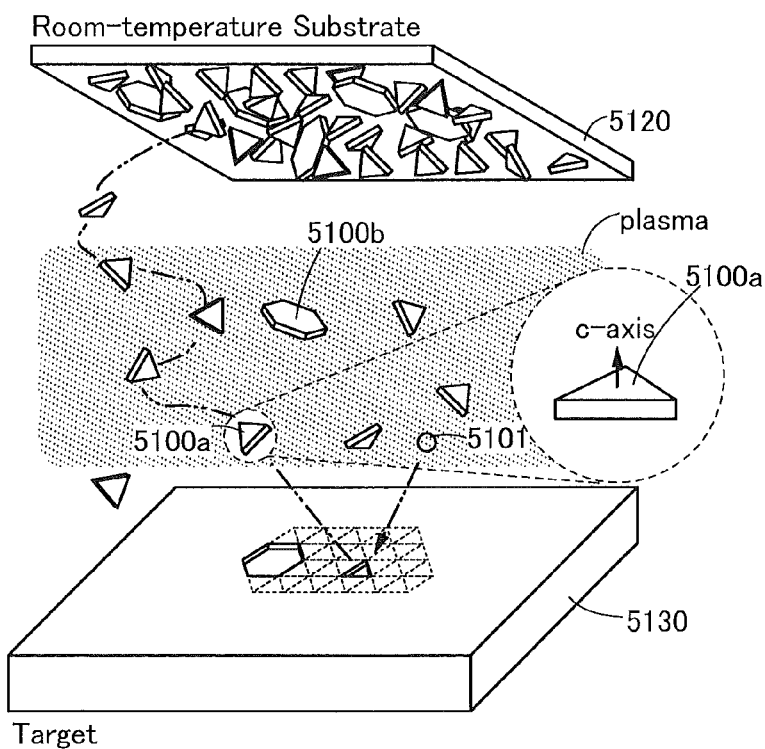

As shown in FIGS. 17A and 17B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5200, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, more preferably 30 G or higher, and still more preferably 50 G or higher. Alternatively, it is preferable to provide, on the top surface, a region where the magnetic field in a direction parallel to the top surface of the substrate 5120 is 1.5 times or more, preferably twice or more, more preferably 3 times or more, and still more preferably 5 times or more as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 17A, when the substrate 5120 is heated, the resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS film might be filled; thus, the CAAC-OS film has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS film.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur because the pellet 5100 is substantially single crystal. Thus, formation of defects such as a grain boundary due to expansion of a space between the pellets 5100 can be prevented, and accordingly, generation of crevasses can be prevented.

The CAAC-OS film does not have a structure like a board of a single crystal oxide semiconductor film but has arrangement with a group of pellets 5100 (nanocrystals) like stacked bricks or blocks. Furthermore, a grain boundary does not exist between the pellets 5100. Therefore, even when deformation such as shrink occurs in the CAAC-OS film owing to heating during deposition, or heating or bending after deposition, it is possible to relieve local stress or release distortion. Therefore, this structure is suitable for a flexible semiconductor device. Note that the nc-OS film has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 19A to 19D are cross-sectional schematic views.

Figure 19A:
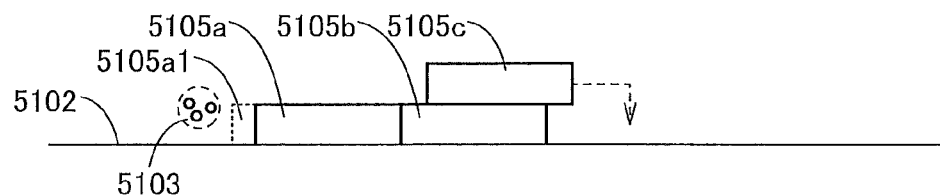
FIGS. 19A to 19D are schematic views showing a deposition model of a CAAC-OS.

As illustrated in FIG. 19A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide are crystallized by heat from the substrate 5120 to form a region 5105a1 on another side surface of the pellet 5105a. Note that the plurality of particles 5103 may contain oxygen, zinc, indium, gallium, or the like.

Figure 19B:
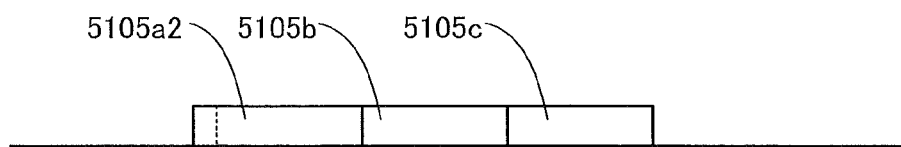

Then, as illustrated in FIG. 19B, the region 5105a1 grows to part of the pellet 5105a to form a pellet 5105a2. In addition, a side surface of the pellet 5105c is in contact with another side surface of the pellet 5105b.

Figure 19C:
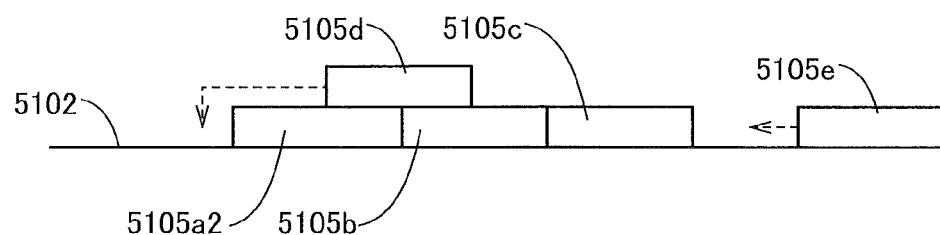

Next, as illustrated in FIG. 19C, a pellet 5105d is deposited over the pellet 5105a2 and the pellet 5105b, and then glides over the pellet 5105a2 and the pellet 5105b. Further more, a pellet 5105e glides toward another side surface of the pellet 5105c over the zinc oxide layer 5102.

Figure 19D:
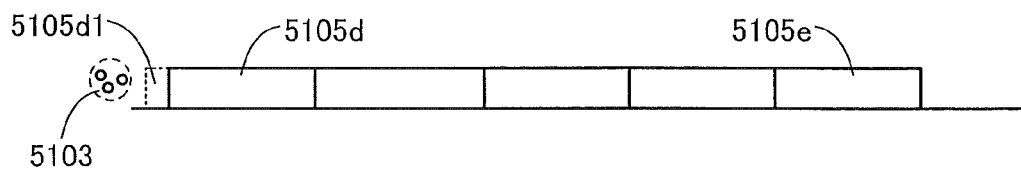

Then, as illustrated in FIG. 19D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with zinc oxide are crystallized by heat from the substrate 5120 to form a region 5105d1 on another side surface of the pellet 5105d.

As described above, deposited pellets are placed to be in contact with each other and then crystal growth is caused at side surfaces of the pellets, whereby a CAAC-OS film is formed over the substrate 5120. Therefore, each pellet of the CAAC-OS film is larger than that of the nc-OS film A difference in the size between (3) and (2) in FIG. 16 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor layer used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS film can be deposited even when a formation surface does not have a crystal structure; therefore, a growth mechanism in this case is different from epitaxial growth. In addition, laser crystallization is not needed for formation of a CAAC-OS film, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS film can be formed.

In addition, it is found that in formation of the CAAC-OS film, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thickness of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS film to be formed has a structure in which n layers (n is a natural number) in each of which the pellets 5100 are arranged along the unevenness are stacked. Since the substrate 5120 has unevenness, a gap is easily generated between the pellets 5100 in the CAAC-OS film in some cases. Note that, even in such a case, owing to intermolecular force, the pellets 5100 are arranged so that a gap between the pellets is as small as possible even on the unevenness surface. Therefore, even when the formation surface has unevenness, a CAAC-OS film with high crystallinity can be obtained.

Since a CAAC-OS film is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS film with high crystallinity can be formed even on a formation surface with an amorphous structure.

Here, the case where the oxide semiconductor has a three-layer structure is described with reference to FIG. 1C.

For an oxide semiconductor film 206b (middle layer), the description of the above-described oxide semiconductor can be referred to. An oxide semiconductor film 206a (bottom layer) and an oxide semiconductor film 206c (top layer) include one or more elements other than oxygen included in the oxide semiconductor film 206b. Since the oxide semiconductor film 206a and the oxide semiconductor film 206c each include one or more elements other than oxygen included in the oxide semiconductor film 206b, an interface state is less likely to be formed at the interface between the oxide semiconductor film 206a and the oxide semiconductor film 206b and the interface between the oxide semiconductor film 206b and the oxide semiconductor film 206c.

In the case of using an In-M-Zn oxide as the oxide semiconductor film 206a, when Zn and O are not taken into consideration, the proportions of In and M are preferably set to be less than 50 atomic % and greater than or equal to 50 atomic %, respectively, more preferably less than 25 atomic % and greater than or equal to 75 atomic %, respectively. In the case of using an In-M-Zn oxide as the oxide semiconductor film 206b, when Zn and O are not taken into consideration, the proportions of In and M are preferably set to be greater than or equal to 25 atomic % and less than 75 atomic %, respectively, more preferably greater than or equal to 34 atomic % and less than 66 atomic %, respectively. In the case of using an In-M-Zn oxide as the oxide semiconductor film 206c, when Zn and O are not taken into consideration, the proportions of In and M are preferably set to be less than 50 atomic % and greater than or equal to 50 atomic %, respectively, more preferably less than 25 atomic % and greater than or equal to 75 atomic %, respectively. Note that the oxide semiconductor film 206c may be formed using the same kind of oxide as that of the oxide semiconductor film 206a.

Here, in some cases, there is a mixed region of the oxide semiconductor film 206a and the oxide semiconductor film 206b between the oxide semiconductor film 206a and the oxide semiconductor film 206b. Furthermore, in some cases, there is a mixed region of the oxide semiconductor film 206b and the oxide semiconductor film 206c between the oxide semiconductor film 206b and the oxide semiconductor film 206c. The mixed region has a low interface state density. For that reason, the stack of the oxide semiconductor film 206a, the oxide semiconductor film 206b, and the oxide semiconductor film 206c has a band structure where energy at each interface and in the vicinity of the interface is changed continuously (continuous junction).

Here, the band structure is described. For easy understanding, the band structure is illustrated with the energy (Ec) at the bottom of the conduction band of each of the insulating film 172, the oxide semiconductor film 206a, the oxide semiconductor film 206b, the oxide semiconductor film 206c, and the gate insulating film 212.

Figure 9A:
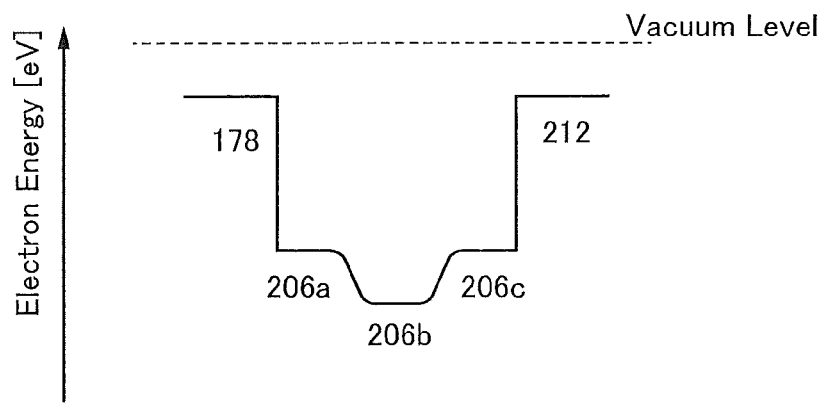
FIGS. 9A and 9B are band diagrams.
Figure 9B:
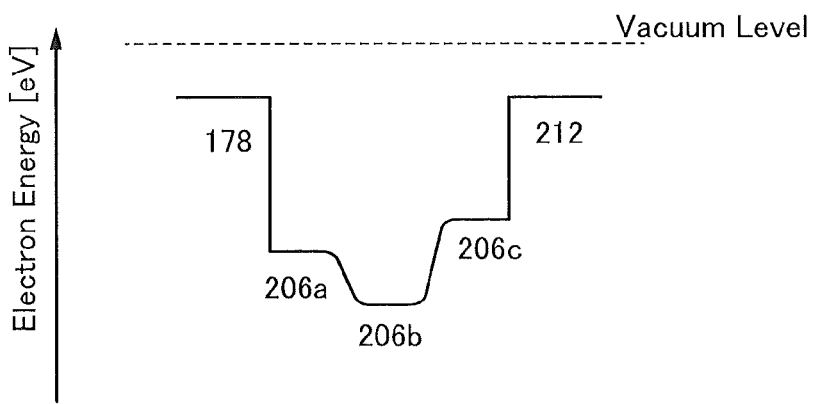

As illustrated in FIGS. 9A and 9B, the energy at the bottom of the conduction band changes continuously in the oxide semiconductor film 206a, the oxide semiconductor film 206b, and the oxide semiconductor film 206c. This can be understood also from the fact that the constituent elements are common among the oxide semiconductor film 206a, the oxide semiconductor film 206b, and the oxide semiconductor film 206c and oxygen easily diffuses among the oxide semiconductor film 206a, the oxide semiconductor film 206b, and the oxide semiconductor film 206c. Thus, the oxide semiconductor film 206a, the oxide semiconductor film 206b, and the oxide semiconductor film 206c have a continuous physical property although they are a stack of films having different compositions.

The oxide semiconductor films, which contain the same main components and are stacked, are not simply stacked but are formed to have continuous junction (here, particularly a U-shaped well structure where the energy at the bottom of the conduction band is continuously changed between the layers. In other words, a stacked-layer structure is formed such that there exist no impurities that form a defect level such as a trap center or a recombination center at each interface. If impurities exist between the stacked layers in the multilayer film, the continuity of the energy band is lost and carriers disappear by a trap or recombination.

Note that FIG. 9A illustrates the case where the Ec of the oxide semiconductor film 206a and the Ec of the oxide semiconductor film 206c are equal to each other; however, they may be different from each other. For example, part of the band structure in the case where the Ec of the oxide semiconductor film 206c is higher than the Ec of the oxide semiconductor film 206a is illustrated in FIG. 9B.

As illustrated in FIGS. 9A and 9B, the oxide semiconductor film 206b serves as a well and a channel of the transistor 200 is formed in the oxide semiconductor film 206b. Note that since the energies at the bottoms of the conduction bands are changed continuously, the oxide semiconductor film 206a, the oxide semiconductor film 206b, and the oxide semiconductor film 206c can also be referred to as a U-shaped well. A channel formed to have such a structure can also be referred to as a buried channel.

Note that trap states caused by impurities or defects might be formed in the vicinity of the interface between an insulating film such as a silicon oxide film and each of the oxide semiconductor film 206a and the oxide semiconductor film 206c. The oxide semiconductor film 206b can be distanced away from the trap states owing to the existence of the oxide semiconductor film 206a and the oxide semiconductor film 206c. However, when the energy difference between the Ec of the oxide semiconductor film 206a or the oxide semiconductor film 206c and the Ec of the oxide semiconductor film 206b is small, electrons in the oxide semiconductor film 206b might reach the trap states across the energy difference. When electrons to be negative charge are captured by the trap states, a negative charge is generated at the interface with the insulating film, whereby the threshold voltage of the transistor is shifted in the positive direction.

Thus, to reduce a change in the threshold voltage of the transistor, an energy difference between the Ec of the oxide semiconductor film 206b and the Ec of each of the oxide semiconductor films 206a and 206c is necessary. The energy difference is preferably greater than or equal to 0.1 eV, more preferably greater than or equal to 0.15 eV.

The oxide semiconductor films 206a, 206b, and 206c preferably include crystal parts. In particular, when a crystal in which c-axes are aligned is used, the transistor can have stable electrical characteristics.

In the band structure illustrated in FIG. 9B, instead of the oxide semiconductor film 206c, an In—Ga oxide (e.g., with an atomic ratio of In:Ga=7:93) may be provided between the oxide semiconductor film 206b and the gate insulating film 212.

For the oxide semiconductor film 206b, an oxide having an electron affinity higher than that of each of the oxide semiconductor films 206a and 206c is used. For example, for the oxide semiconductor film 206b, an oxide having an electron affinity higher than that of each of the oxide semiconductor films 206a and 206c by 0.07 eV or higher and 1.3 eV or lower, preferably 0.1 eV or higher and 0.7 eV or lower, and more preferably 0.15 eV or higher and 0.4 eV or lower is used. Note that the electron affinity refers to an energy difference between the vacuum level and the bottom of the conduction band.

When In—Ga—Zn oxide is used the oxide semiconductor films 206a and 206c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the oxide semiconductor film 206a and the oxide semiconductor film 206c each have an electron affinity lower than that of the oxide semiconductor film 206b.

At this time, when an electric field is applied to the gate electrode, a channel is formed in the oxide semiconductor film 206b having the highest electron affinity in the oxide semiconductor films 206a and 206c.

Moreover, the thickness of the oxide semiconductor film 206c is preferably as small as possible to increase the on-state current of the transistor. The thickness of the oxide semiconductor film 206c is set to be less than 10 nm, preferably less than or equal to 5 nm, and more preferably less than or equal to 3 nm, for example. Meanwhile, the oxide semiconductor film 206c has a function of blocking elements other than oxygen (such as silicon) included in the adjacent insulating film from entering the oxide semiconductor film 206b where a channel is formed. For this reason, it is preferable that the oxide semiconductor film 206c have a certain thickness. The thickness of the oxide semiconductor film 206c is set to be greater than or equal to 0.3 nm, preferably greater than or equal to 1 nm, and more preferably greater than or equal to 2 nm, for example.

To improve reliability, preferably, the thickness of the oxide semiconductor film 206a is large and the thickness of the oxide semiconductor film 206c is small. Specifically, the thickness of the oxide semiconductor film 206a is set to be greater than or equal to 20 nm, preferably greater than or equal to 30 nm, more preferably greater than or equal to 40 nm, and still more preferably greater than or equal to 60 nm. With the oxide semiconductor film 206a having a thickness greater than or equal to 20 nm, preferably greater than or equal to 30 nm, more preferably greater than or equal to 40 nm, and still more preferably greater than or equal to 60 nm, the distance from the interface between the adjacent insulating film and the oxide semiconductor film 206a to the oxide semiconductor film 206b where the channel is formed can be greater than or equal to 20 nm, preferably greater than or equal to 30 nm, more preferably greater than or equal to 40 nm, and still more preferably greater than or equal to 60 nm. Note that since the productivity of a semiconductor device might be reduced, the thickness of the oxide semiconductor film 206a is set to be less than or equal to 200 nm, preferably less than or equal to 120 nm, and more preferably less than or equal to 80 nm.

For example, the concentration of silicon in a region between the oxide semiconductor film 206b and the oxide semiconductor film 206a measured by SIMS is set to be lower than $1\times10^{19}$ atoms/cm$^3$, preferably lower than $5\times10^{18}$ atoms/cm$^3$, and more preferably lower than $2\times10^{18}$ atoms/cm$^3$. The concentration of silicon in a region between the oxide semiconductor film 206b and the oxide semiconductor film 206c measured by SIMS is set to be lower than $1\times10^{19}$ atoms/cm$^3$, preferably lower than $5\times10^{18}$ atoms/cm$^3$, and more preferably lower than $2\times10^{18}$ atoms/cm$^3$.

It is preferable to reduce the concentration of hydrogen in the oxide semiconductor film 206a and the oxide semiconductor film 206c in order to reduce the concentration of hydrogen in the oxide semiconductor film 206b. The concentration of hydrogen in the oxide semiconductor film 206a and the oxide semiconductor film 206c measured by SIMS is set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, and still more preferably lower than or equal to $5\times10^{18}$ atoms/cm$^3$. It is preferable to reduce the concentration of nitrogen in the oxide semiconductor film 206a and the oxide semiconductor film 206c in order to reduce the concentration of nitrogen in the oxide semiconductor film 206b. The concentration of nitrogen in the oxide semiconductor film 206a and the oxide semiconductor film 206c measured by SIMS is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, and still more preferably lower than or equal to $5\times10^{17}$ atoms/cm$^3$.

The above three-layer structure is an example. For example, a two-layer structure without the oxide semiconductor film 206a or the oxide semiconductor film 206c may be employed.

Figure 2A:
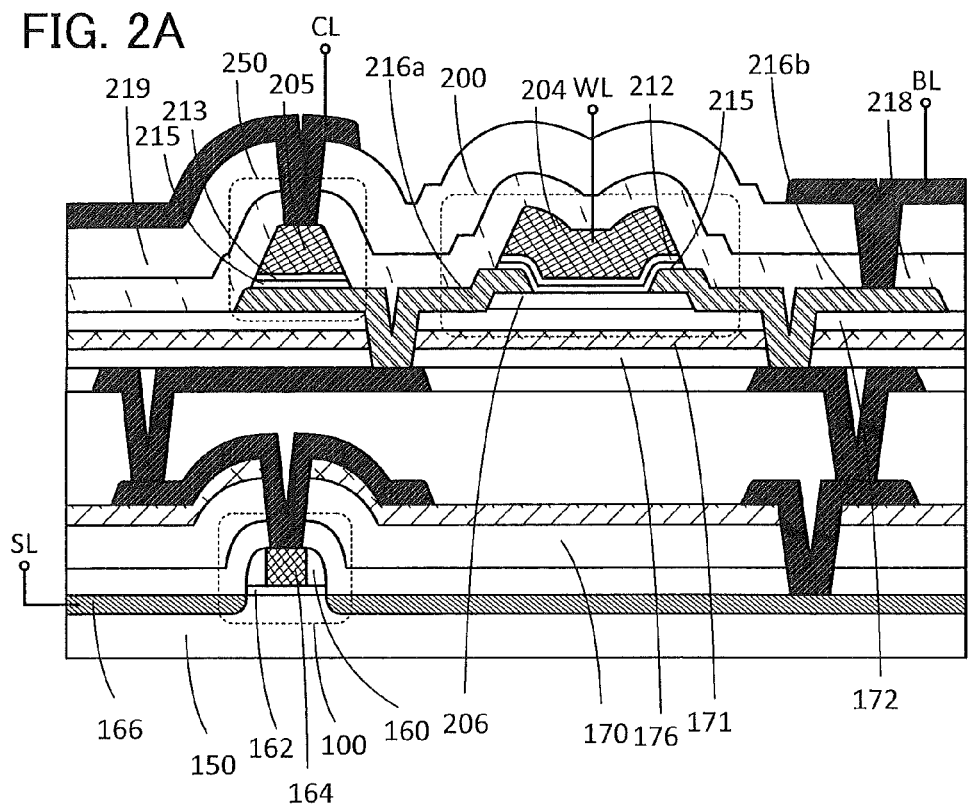
FIGS. 2A and 2B are cross-sectional views illustrating examples of the semiconductor device of one embodiment of the present invention.

As illustrated in FIG. 2A, an oxide semiconductor film 215 may be provided between the oxide semiconductor film 206 and the gate insulating film 212. In other words, the oxide semiconductor film 215 includes a region in contact with the top and side surfaces of the oxide semiconductor film 206 in the channel width direction. The oxide semiconductor film 215 includes the region in contact with the side surface of the oxide semiconductor film 206, whereby the side surface of the oxide semiconductor film 206 can be protected. In this case, the interface state density in the side surface of the oxide semiconductor film 206 can be decreased compared to the case where the oxide semiconductor film 215 is not provided. Accordingly, with the oxide semiconductor film 215, variation in the electrical characteristics of the transistor can be suppressed, so that the semiconductor device can be highly reliable. Description of the oxide semiconductor film 206c is referred to for the oxide semiconductor film 215.

The conductive films 216a and 216b may each be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive films 216a and 216b may be formed by a sputtering method, a CVD method, an MBE method, a PLD method, an ALD method, or the like.

The conductive film 216a and the conductive film 216b are formed in such a manner that the conductive film to be the conductive films 216a and 216b is formed and then partly etched. Therefore, it is preferable to employ a formation method by which the oxide semiconductor film 206 is not damaged when the conductive film is formed. In other words, the conductive film is preferably formed by an MCVD method or the like.

Note that in the case where the conductive films 216a and 216b are each formed to have a stacked-layer structure, layers in the stacked-layer film may be formed by different formation methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. By thus using different formation methods, the films can have different functions or different properties. Then, by stacking the films, a more appropriate film can be formed as a stacked-layer film.

In other words, in the case where the conductive films 216a and 216b are each a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an (n+1)th film is formed by at least one of a CVD method (a plasma CVD method, a thermal CVD method, an MCVD method, an MOCVD method, or the like), an MBE method, a PLD method, an ALD method, and the like (n is a natural number). The n-th film and the (n+1)th film may be formed by different formation methods. Note that the n-th film and an (n+2)th film may be formed by the same formation method. Alternatively, all the films may be formed by the same formation method.

Note that the conductive film 216a (216b) or at least one film in the stacked conductive film 216a (216b), and the oxide semiconductor film 206 or at least one film in the stacked oxide semiconductor film 206 may be formed by the same formation method. For example, both of them may be formed by an ALD method. As a result, they can be formed without exposure to the air, and entry of impurities can therefore be prevented. Alternatively, for example, the conductive film 216a (216b) in contact with the oxide semiconductor film 206 and the oxide semiconductor film 206 in contact with the conductive film 216a (216b) may be formed by the same formation method. As a result, the formation can be performed in the same chamber, and entry of impurities can therefore be prevented. As described above, the same formation method may be employed in not only for the oxide semiconductor film 206 and the conductive film 216a (216b) but also for other films that are adjacent to each other. Note that the method for manufacturing a semiconductor device of one embodiment of the present invention is not limited thereto.

Note that the conductive film 216a (216b) or at least one film in the stacked conductive film 216a (216b), the oxide semiconductor film 206 or at least one film in the stacked oxide semiconductor film 206, and the insulating film 172 or at least one film in the stacked insulating film 172 may be formed by the same formation method. For example, all of them may be formed by an ALD method. As a result, they can be formed without exposure to the air, and entry of impurities can therefore be prevented. Note that the method for manufacturing a semiconductor device of one embodiment of the present invention is not limited thereto.

The gate insulating film 212 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that in the case where the gate insulating film 212 is formed to have a stacked-layer structure, films in the stacked structure may be formed by different formation methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. By thus using different formation methods, the films can have different functions or different properties. Then, by stacking the films, a more appropriate film can be formed as a stacked-layer film.

In other words, in the case where the gate insulating film 212 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an (n+1)th film is formed by at least one of a CVD method (a plasma CVD method, a thermal CVD method, an MCVD method, an MOCVD method, or the like), an MBE method, a PLD method, an ALD method, and the like (n is a natural number). The n-th film and the (n+1)th film may be formed by different formation methods. Note that the n-th film and an (n+2)th film may be formed by the same formation method. Alternatively, all the films may be formed by the same formation method.

Note that the gate insulating film 212 or at least one film in the stacked gate insulating film 212, and the conductive film 216a (216b) or at least one film in the stacked conductive film 216a (216b) may be formed by the same formation method. For example, both of them may be formed by an ALD method. As a result, they can be formed without exposure to the air, and entry of impurities can therefore be prevented. Alternatively, for example, the conductive film 216a (216b) in contact with the gate insulating film 212 and the gate insulating film 212 in contact with the conductive film 216a (216b) may be formed by the same formation method. As a result, the formation can be performed in the same chamber, and entry of impurities can therefore be prevented.

Note that the gate insulating film 212 or at least one film in the stacked gate insulating film 212, the conductive film 216a (216b) or at least one film in the stacked conductive film 216a (216b), the oxide semiconductor film 206 or at least one film in the stacked oxide semiconductor film 206, and the insulating film 172 or at least one film in the stacked insulating film 172 may be fondled by the same formation method. For example, all of them may be formed by an ALD method. As a result, they can be formed without exposure to the air, and entry of impurities can therefore be prevented. Note that the method for manufacturing a semiconductor device of one embodiment of the present invention is not limited thereto.

An example of a stacked-layer structure of the gate insulating film 212 will be described. The gate insulating film 212 includes, for example, oxygen, nitrogen, silicon, or hafnium. Specifically, the gate insulating film 212 preferably includes hafnium oxide and silicon oxide or silicon oxynitride.

Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to obtain a transistor with a low off-state current. Examples of the crystalline structure include a monoclinic crystal structure, a tetragonal crystal structure, and a cubic crystal structure. Note that one embodiment of the present invention is not limited to the above examples.

A surface over which the hafnium oxide having a crystal structure is formed might have interface states due to defects. The interface states might function as trap centers. Therefore, in the case where the hafnium oxide is provided close to the channel region of the transistor, the electrical characteristics of the transistor might deteriorate owing to the interface states. Thus, to reduce the influence of the interface states, it is in some cases preferable to provide another layer between the channel region and the hafnium oxide in the transistor so that the channel region and the hafnium oxide are apart from each other. The layer has a buffering function. The layer having a buffering function may be included in the gate insulating film 212 or may be included in the oxide semiconductor film 206. In other words, silicon oxide, silicon oxynitride, an oxide semiconductor, or the like can be used for the layer having a buffering function. For example, a semiconductor or an insulator that has a larger energy gap than the semiconductor serving as the channel region is used for the layer having a buffering function. Alternatively, for example, a semiconductor or an insulator that has smaller electron affinity than the semiconductor serving as the channel region is used for the layer having a buffering function. Further alternatively, for example, a semiconductor or an insulator having larger ionization energy than the semiconductor serving as the channel region is used for the layer having a buffering function.

Meanwhile, charge is trapped by the interface states (trap centers) of the hafnium oxide having a crystal structure, whereby the threshold voltage of the transistor may be controlled. In order that the charge stably exists, for example, an insulator having a larger energy gap than the hafnium oxide is provided layer between the channel region and the hafnium oxide. Alternatively, a semiconductor or an insulator having smaller electron affinity than the hafnium oxide is provided. Further alternatively, a semiconductor or an insulator having larger ionization energy than the hafnium oxide is provided layer. Use of such a semiconductor or an insulator inhibits discharge of the charge trapped by the interface states, so that the charge can be retained for a long time.

Examples of such an insulator include silicon oxide and silicon oxynitride. In order that the interface states in the gate insulating film 212 capture charge, electrons need to be moved from the oxide semiconductor film 206 to the conductive film 204 serving as the gate electrode. For a specific example, the potential of the conductive film 204 may be kept at a potential higher than the potential of the conductive films 216a and 216b functioning as source and drain electrodes, for one second or longer, typically, one minute or longer under a high temperature (e.g., higher than or equal to 125° C. and lower than or equal to 450° C., typically higher than or equal to 150° C. and lower than or equal to 300° C.).

In the transistor in which a desired amount of electrons is thus captured by the interface states of the gate insulating film 212 or the like, the threshold voltage is shifted in the positive direction. The amount of captured electrons (the amount of change in the threshold voltage) can be controlled by adjustment of the voltage of the conductive film 204 or the time for application of the voltage. Note that the film for capturing charge is not necessarily provided in the gate insulating film 212 as long as it can capture charge. A stacked-layer film having a similar structure may be used for the insulating film 172.

The conductive film 204 may be formed to have a single-layer structure or a stacked-layer structure using a conductive film containing one or more kinds of aluminum, titanium, chromium, cobalt, nickel, copper, yttrium, zirconium, molybdenum, ruthenium, silver, tantalum, and tungsten, for example.

A conductive film to be the conductive film 204 may be formed by a sputtering method, a CVD method, an MBE method, a PLD method, an ALD method, or the like. The conductive film 204 is preferably formed by a formation method by which the gate insulating film 212 is not damaged when the conductive film to be the conductive film 204 is formed. In other words, the conductive film is preferably formed by an MCVD method or the like.

Note that in the case where the conductive film 204 is formed to have a stacked-layer structure, films in the stacked structure may be formed by different formation methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. By thus using different formation methods, the films can have different functions or different properties. Then, by stacking the films, a more appropriate film can be formed as a stacked-layer film.

In other words, in the case where the conductive film 204 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an (n+1)th film is formed by at least one of a CVD method (a plasma CVD method, a thermal CVD method, an MCVD method, an MOCVD method, or the like), an MBE method, a PLD method, an ALD method, and the like (n is a natural number). The n-th film and the (n+1)th film may be formed by different formation methods. Note that the n-th film and an (n+2)th film may be formed by the same formation method. Alternatively, all the films may be formed by the same formation method.

Note that the conductive film 204 or at least one film in the stacked conductive film 204, and the gate insulating film 212 or at least one film in the stacked gate insulating film 212 may be formed by the same formation method. For example, both of them may be formed by an ALD method. As a result, they can be formed without exposure to the air, and entry of impurities can therefore be prevented. Alternatively, for example, the conductive film 204 in contact with the gate insulating film 212 and the gate insulating film 212 in contact with the conductive film 204 may be formed by the same formation method. As a result, the formation can be performed in the same chamber, and entry of impurities can therefore be prevented.

Note that the conductive film 204 or at least one film in the stacked conductive film 204, the gate insulating film 212 or at least one film in the stacked gate insulating film 212, the conductive film 216a (216b) or at least one film in the stacked conductive film 216a (216b), the oxide semiconductor film 206 or at least one film in the stacked oxide semiconductor film 206, and the insulating film 172 or at least one film in the stacked insulating film 172 may be formed by the same formation method. For example, all of them may be formed by an ALD method. As a result, they can be formed without exposure to the air, and entry of impurities can therefore be prevented. Note that the method for manufacturing a semiconductor device of one embodiment of the present invention is not limited thereto.

The barrier film 218 can be formed using a material and manufacturing method similar to those for the barrier film 171.

The insulating film 219 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. Alternatively, a resin such as polyimide, acrylic, or silicone may be used.

Note that in the case where the insulating film 219 is a stacked-layer film, films in the stacked-layer film may be formed by different formation methods such as a CVD method (a plasma CVD method, a thermal CVD method, an MCVD method, an MOCVD method, or the like), an MBE method, a PLD method, and an ALD method. For example, the first layer may be formed by an MOCVD method and the second layer may be formed by a sputtering method. Alternatively, the first layer may be formed by an ALD method and the second layer may be formed by an MOCVD method. Alternatively, the first layer may be formed by an ALD method and the second layer may be formed by a sputtering method. Alternatively, the first layer may be formed by an ALD method, the second layer may be formed by a sputtering method, and the third layer may be formed by an ALD method. By thus using different formation methods, the films can have different functions or different properties. Then, by stacking the films, a more appropriate film can be formed as a stacked-layer film.

In other words, in the case where the insulating film 219 is a stacked-layer film, for example, an n-th film is formed by at least one of a CVD method (a plasma CVD method, a thermal CVD method, an MCVD method, an MOCVD method, or the like), an MBE method, a PLD method, an ALD method, and the like and an (n+1)th film is formed by at least one of a CVD method (a plasma CVD method, a thermal CVD method, an MCVD method, an MOCVD method, or the like), an MBE method, a PLD method, an ALD method, and the like (n is a natural number). The n-th film and the (n+1)th film may be formed by different formation methods. Note that the n-th film and an (n+2)th film may be formed by the same formation method. Alternatively, all the films may be formed by the same formation method.

<Modification Example 1>

Figure 2B:
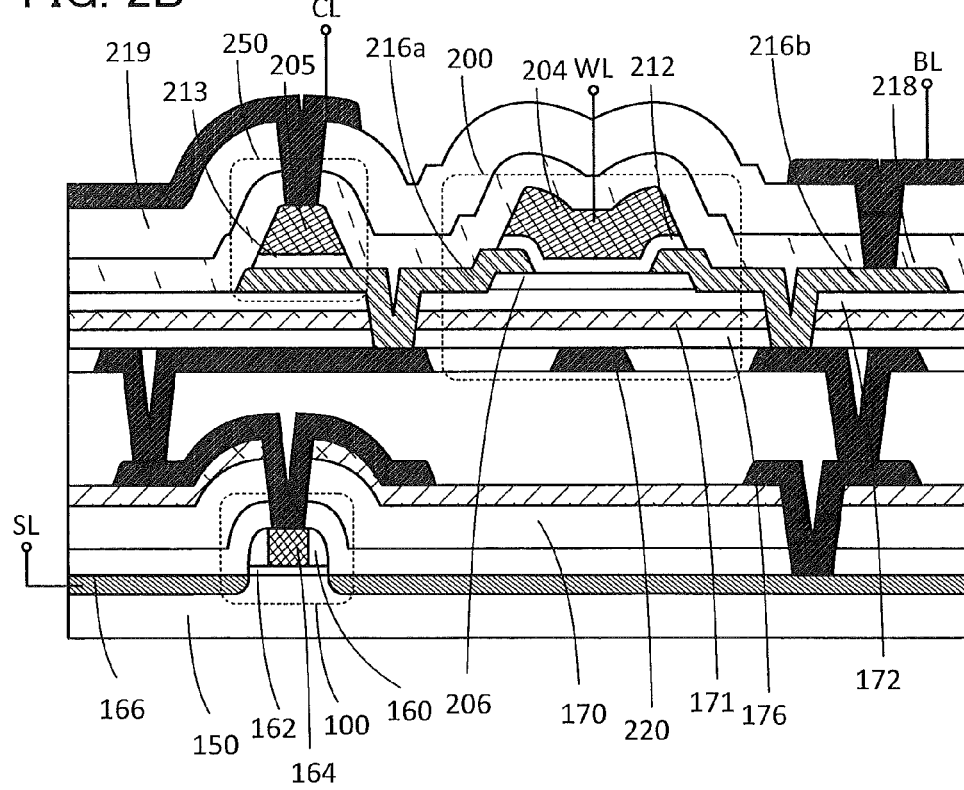

FIG. 2B is a modification example of the semiconductor device illustrated in FIG. 1B.

Specifically, the semiconductor device in FIG. 2B is different from that in FIG. 1B in the structure of the transistor 200.

The transistor 200 illustrated in FIG. 2B includes a conductive film 220 which is provided in the step of forming conductive films serving as wirings between the transistor 100 and the transistor 200. The oxide semiconductor film 206 is interposed between the conductive film 220 and the conductive film 204 with insulating films therebetween. The conductive film 220 serves as a second gate electrode of the transistor 200. The conductive film 220 results in a further increase in on-state current and a controlled threshold voltage. To increase the on-state current, for example, the conductive film 204 and the conductive film 220 are set to have the same potential, and the transistor is driven as a dual-gate transistor. Note that the conductive film 204 and the conductive film 220 may be electrically connected to each other to have the same potential. To control the threshold voltage, different constant potentials may be supplied to the conductive films 204 and 220.

<Modification Example 2>

Figure 3A:
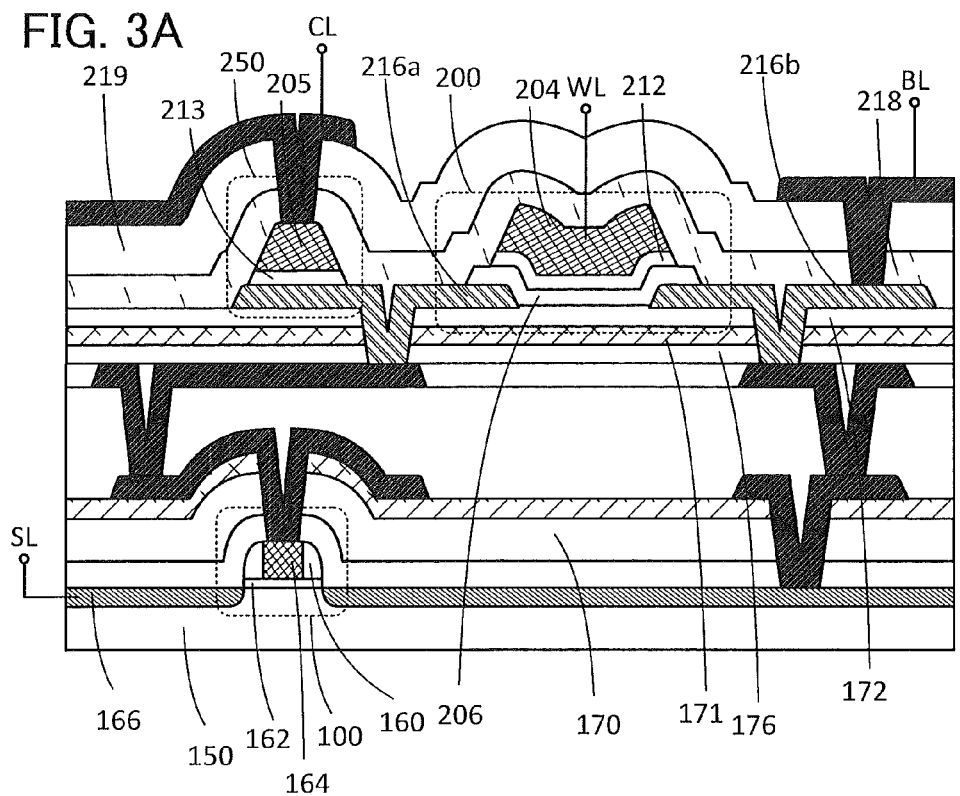
FIGS. 3A and 3B are cross-sectional views illustrating examples of the semiconductor device of one embodiment of the present invention.
Figure 3B:
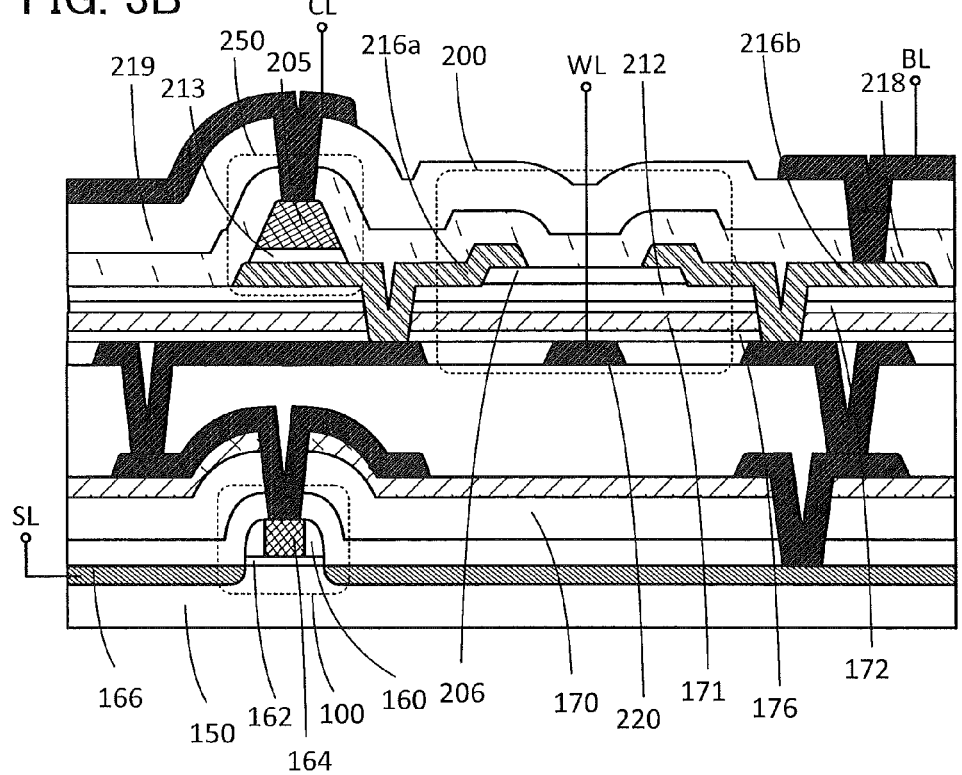

The transistor 200 is not limited to the top-gate top-contact structure, and may be a top-gate bottom-contact transistor as illustrated in FIG. 3A or a bottom-gate top-contact transistor as illustrated in FIG. 3B.

<Modification Example 3>

Figure 4A:
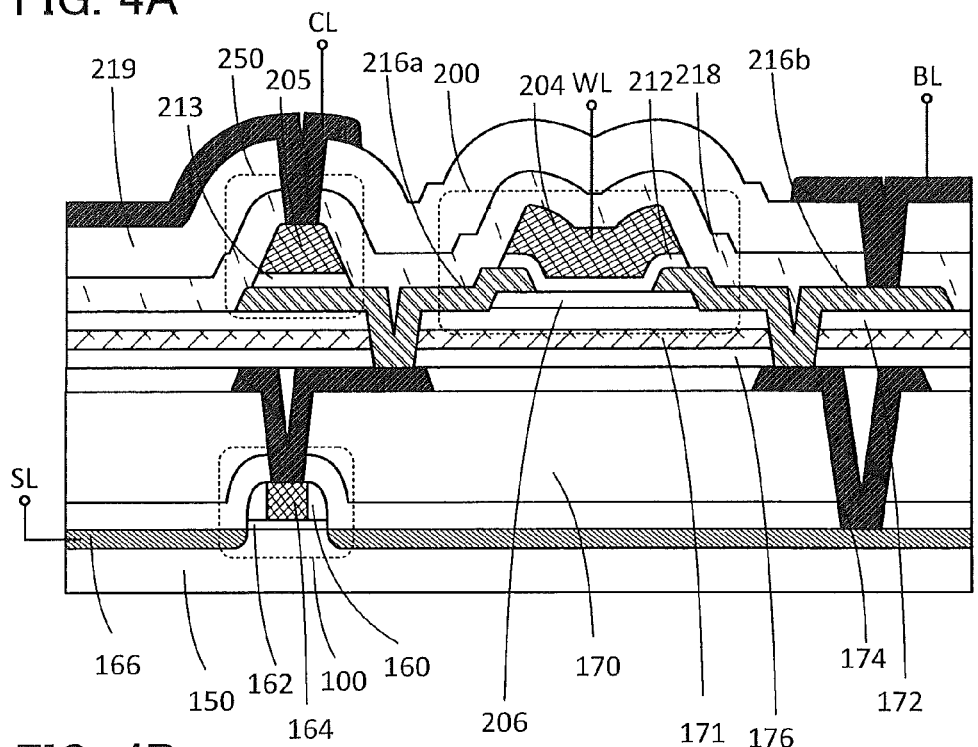
FIGS. 4A and 4B are cross-sectional views illustrating examples of the semiconductor device of one embodiment of the present invention.
Figure 4B:
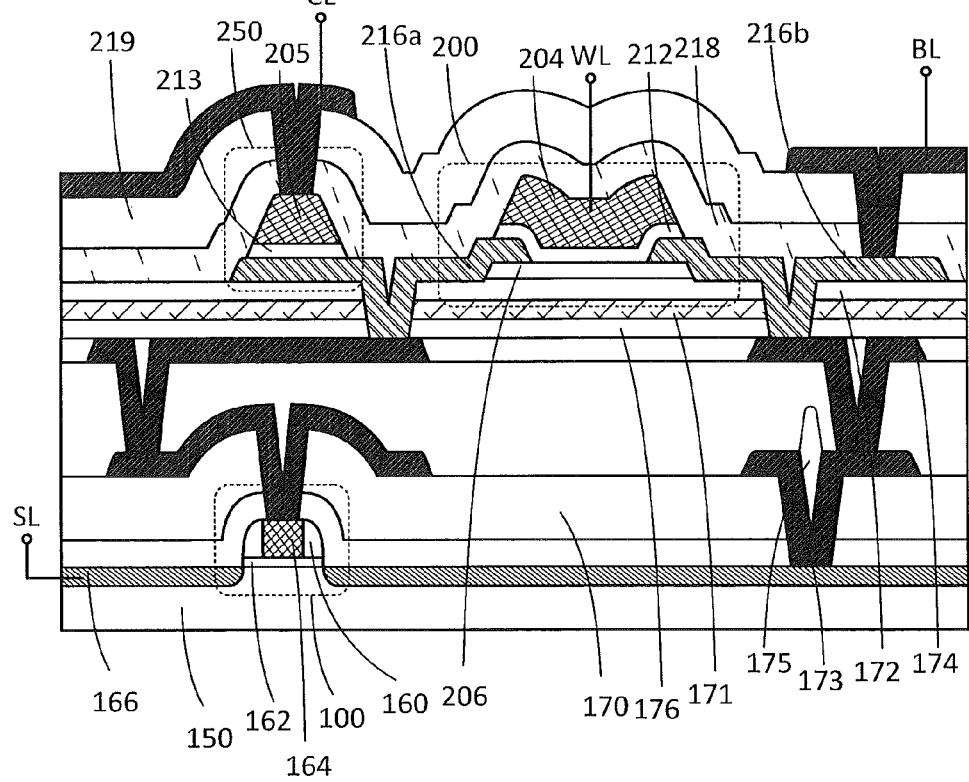

As illustrated in FIG. 4A, the number of insulating films and conductive films between the transistor 100 and the transistor 200 may be reduced. The semiconductor device illustrated in FIG. 4A does not include the conductive film 173, the conductive film formed in the same step as the conductive film 173, and the insulating film over the conductive film which are illustrated in FIG. 1B.

<Modification Example 4>

Figure 5:
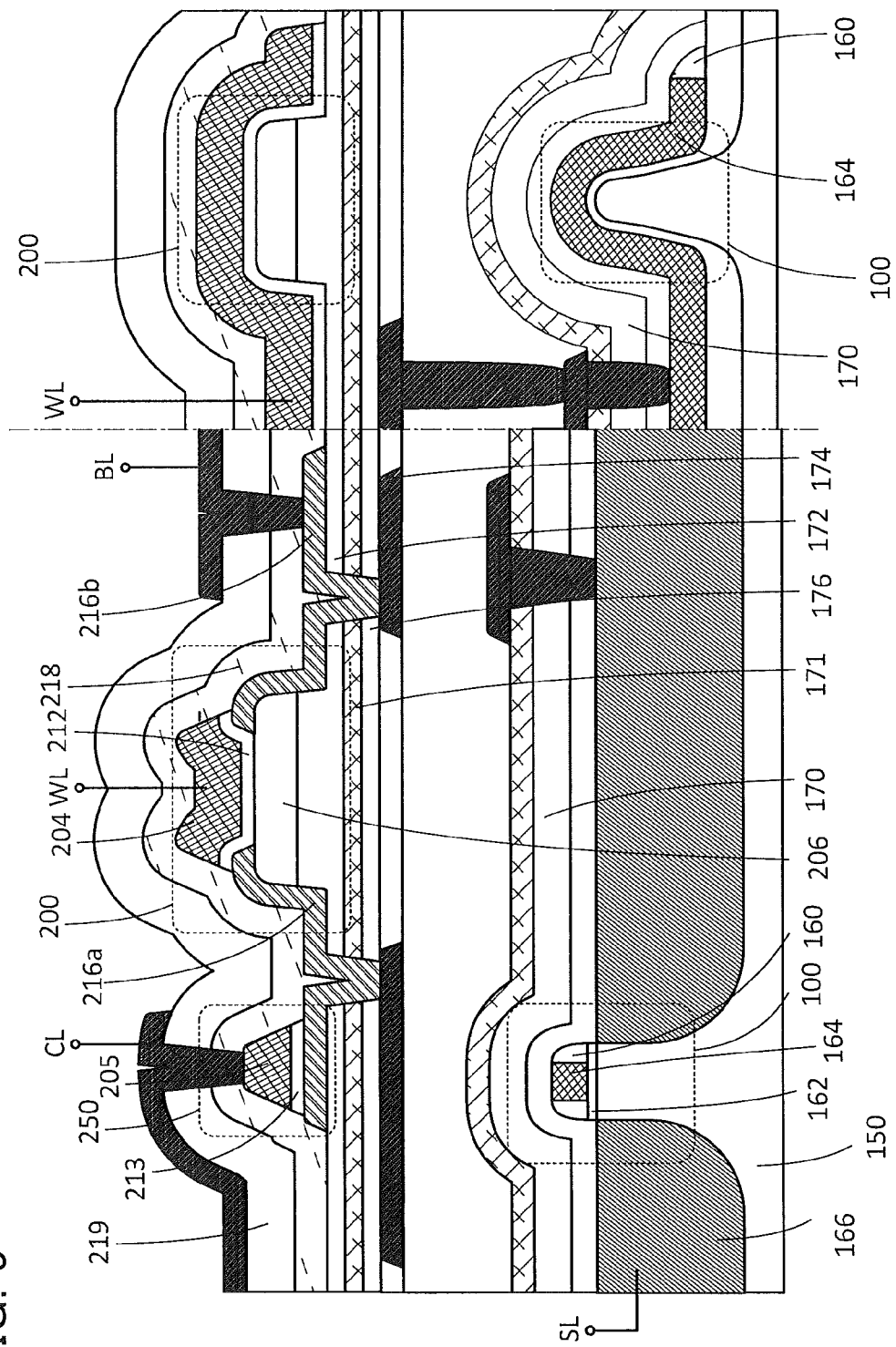
FIG. 5 is a cross-sectional view illustrating an example of the semiconductor device of one embodiment of the present invention.

The semiconductor device may have a structure illustrated in FIG. 5. Note that on the left side of a dashed-dotted line is a cross-sectional view in the channel length direction (also referred to as a longitudinal direction or a long-side direction) of the transistors 100 and 200, and on the right side of the dashed-dotted line is a cross-sectional view in the channel width direction (also referred to as a lateral direction or a short-side direction) of the transistors 100 and 200.

The transistor 200 has the aforementioned s-channel structure. In the cross-sectional view in the channel width direction of the transistor 200, the height (thickness) of the oxide semiconductor film 206 is 0.8 times or more, preferably 1 times or more, more preferably 1.2 times or more, and still more preferably 1.5 times or more the horizontal width (channel length) of the oxide semiconductor film 206. When the height of the oxide semiconductor film 206 is in the above range, the amount of drain current flowing in the side surface of the oxide semiconductor film 206 can be larger than the amount of drain current flowing in the top surface of the oxide semiconductor film 206 at the time when the transistor 200 is on. Therefore, the transistor 200 has a large on-state current for the area occupied thereby. That is, the area occupied by the transistor 200 can be small for required on-state current. Note that in the cross-sectional view in the channel width direction of the transistor 200, the horizontal width of the oxide semiconductor film 206 is preferably smaller than or equal to 40 nm, more preferably smaller than or equal to 30 nm, and still more preferably smaller than or equal to 20 nm.

The transistor 100 is also referred to as a FIN transistor because it utilizes a projection of the semiconductor substrate 150. Note that an insulating film may be provided over the projection. The insulating film serves as a mask for forming the projection.

Instead of the conductive films between the transistor 100 and the transistor 200, a plug may be provided to fill the opening in the insulating films as illustrated in FIG. 5. Although not illustrated, the conductive film 164 and the conductive film 216a are electrically connected to each other through a conductive film extending in the channel width direction.

Figure 6A:
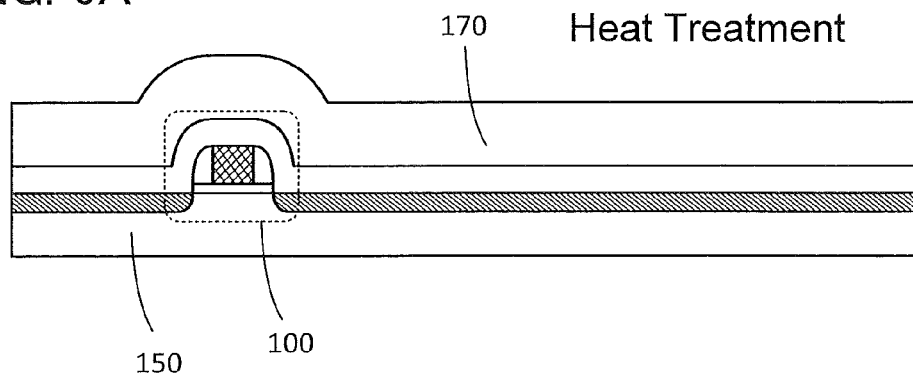
FIGS. 6A to 6C are cross-sectional views illustrating an example of a method for manufacturing the semiconductor device of one embodiment of the present invention.

Next, a method for manufacturing the transistor 100, the transistor 200, and the capacitor 250 which are illustrated in FIG. 4B will be described with reference to FIGS. 6A to 6C. Description here is made on the assumption that the transistor 100 uses a silicon-based semiconductor material and the transistor 200 uses an oxide semiconductor.

First, the transistor 100 is formed over the semiconductor substrate 150. Next, the insulating film 170 is formed to cover the transistor 100, and first heat treatment is performed (see FIG. 6A).

Hydrogen contained in the insulating film 170 transfers to the transistor 100 by the first heat treatment, so that dangling bonds of silicon in the transistor 100 can be terminated. As a result, the electrical characteristics of the transistor 100 can be improved.

Figure 6B:
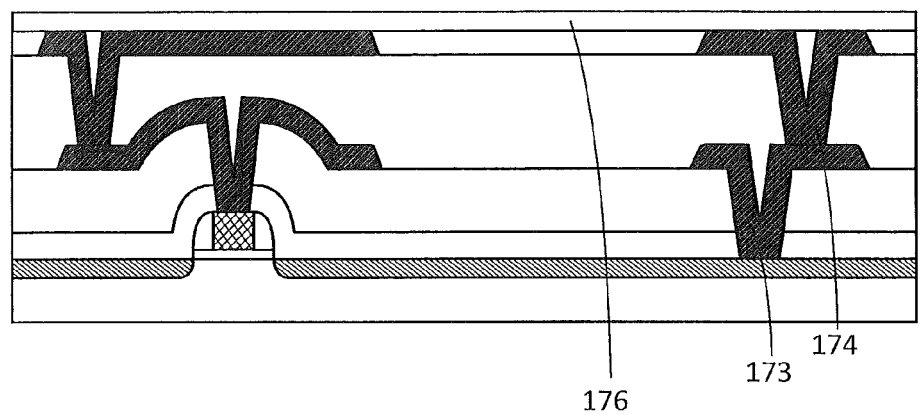

Then, the conductive films 173 and 174 for electrically connecting the transistors 100 and 200, the insulating films where the conductive films 173 and 174 are embedded, and the insulating film 176 are formed over the insulating film 170, and second heat treatment is performed (see FIG. 6B).

The amount of hydrogen in the insulating film 170 is larger than that needed to terminate dangling bonds of silicon, so that hydrogen remains in the insulating film (e.g., the insulating film 176) or the conductive film (e.g., the conductive film 173 or 174). The second heat treatment is performed for dehydration or dehydrogenation in order to prevent the remaining hydrogen or water from transferring to the transistor 200 including the oxide semiconductor film above the insulating film 170. The second heat treatment is preferably performed at as high a temperature as possible within the range that does not adversely affect the heat resistance of the conductive films in the semiconductor device and the electrical characteristics of the transistor 100. Specifically, the second heat treatment is performed for less than or equal to 10 hours at a temperature higher than or equal to 450° C. and lower than 650° C., preferably higher than or equal to 490° C. and lower than 650° C., and more preferably higher than or equal to 530° C. and lower than 650° C., or may be performed at a temperature higher than or equal to 650° C. Note that the second heat treatment is preferably performed at a temperature lower than or equal to the temperature of the first heat treatment. This prevents the electrical characteristics of the transistor 100 from being deteriorated by the second heat treatment. In addition, the second heat treatment is preferably performed for a longer period than the first heat treatment. This improves the electrical characteristics of the transistor 200 without deteriorating the electrical characteristics of the transistor 100. Alternatively, the second heat treatment may be performed at a temperature higher than the temperature of the first heat treatment. In that case, dehydrogenation or dehydration can be performed completely, resulting in a further improvement of the electrical characteristics of the transistor 200. The first heat treatment can be omitted when the second heat treatment serves also as the first treatment.

The second heat treatment may be performed more than once. It is preferable that the second heat treatment be performed with a metal film or the like covered with an insulating film or the like.

Figure 6C:
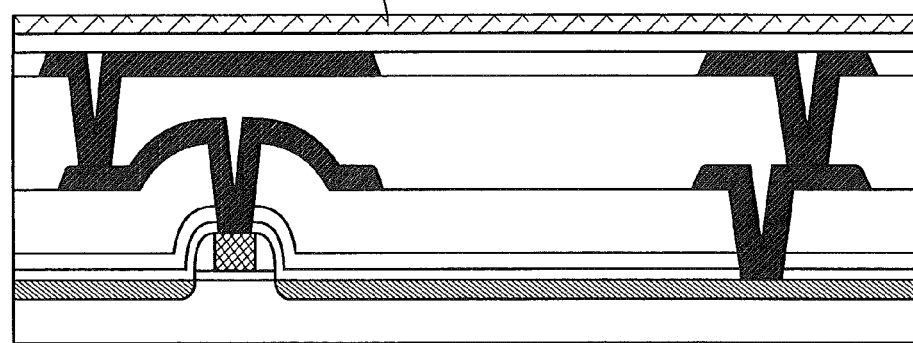

Next, the barrier film 171 is formed over the insulating film 176 (see FIG. 6C).

The barrier film 171 prevents hydrogen contained in the transistor 100 and the insulating films and the conductive films above the transistor 100 from being diffused to the transistor 200.

Figure 7A:
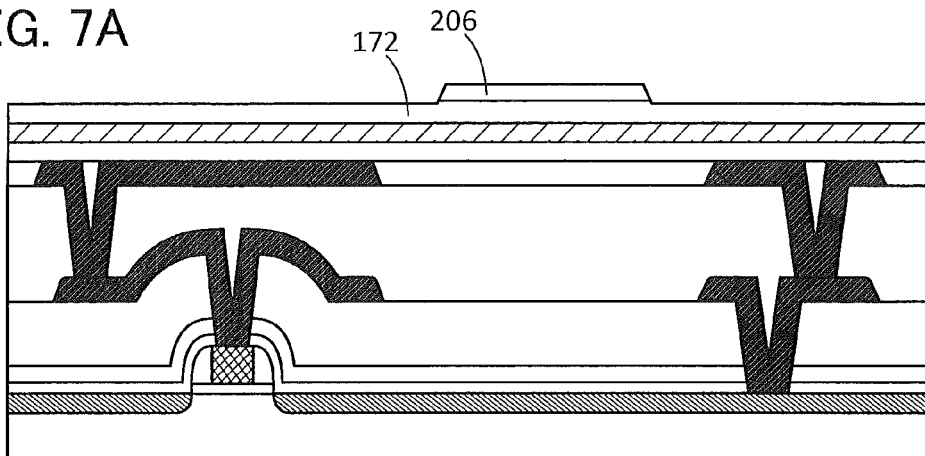
FIGS. 7A to 7C are cross-sectional views illustrating an example of the method for manufacturing the semiconductor device of one embodiment of the present invention.

Then, the insulating film 172 and the oxide semiconductor film 206 are formed over the barrier film 171 (see FIG. 7A).

Figure 7B:
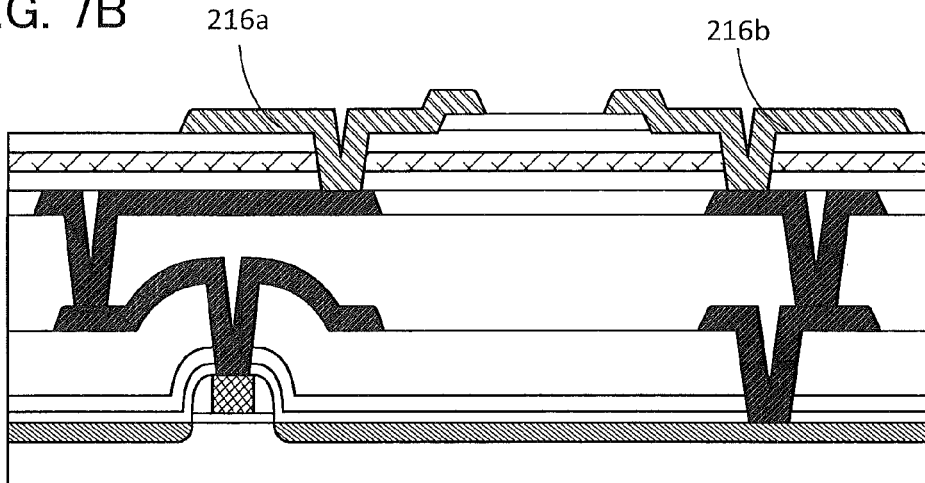

Subsequently, openings are Banned in the insulating film 172, the barrier film 171, and the insulating film 176 so as to reach conductive films electrically connected to the transistor 100. Then, the conductive film 216*a* and the conductive film 216*b* are formed. Through the openings, the conductive film 216*a* is in contact with a conductive film electrically connected to the gate electrode of the transistor 100, and the conductive film 216*b* is in contact with a conductive film electrically connected to the impurity region 166 serving as the source region or the drain region of the transistor 100 (see FIG. 7B).

Note that the aforementioned second heat treatment may be performed between the formation of the openings in the insulating film 172, the barrier film 171, and the insulating film 176 and the formation of the conductive films 216*a* and 216*b*.

Figure 7C:
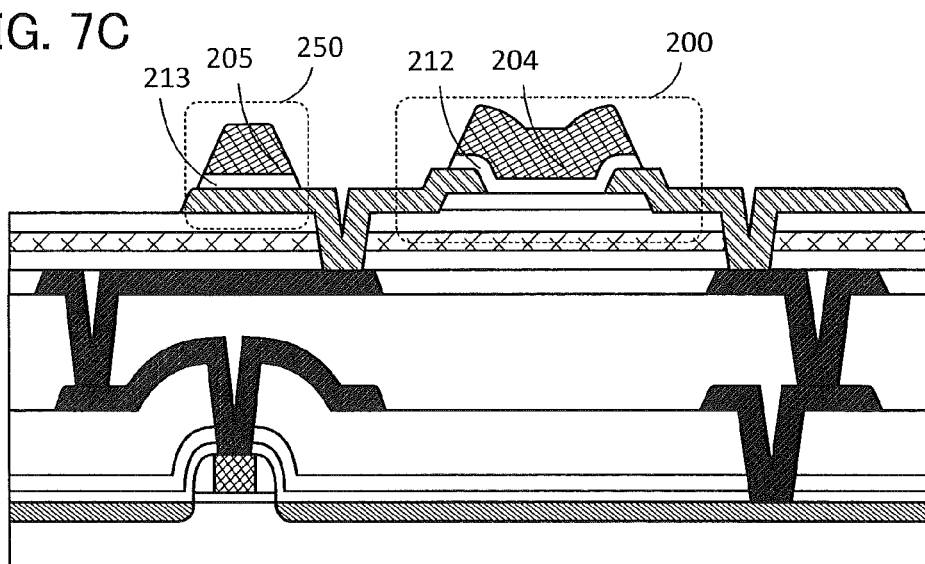

Next, the gate insulating film 212 and the conductive film 204 are formed over the oxide semiconductor film 206 and the conductive films 216*a* and 216*b*. At the same time, the insulating film 213 and the conductive film 205 are formed over the conductive film 216*a* (see FIG. 7C).

Figure 11A:
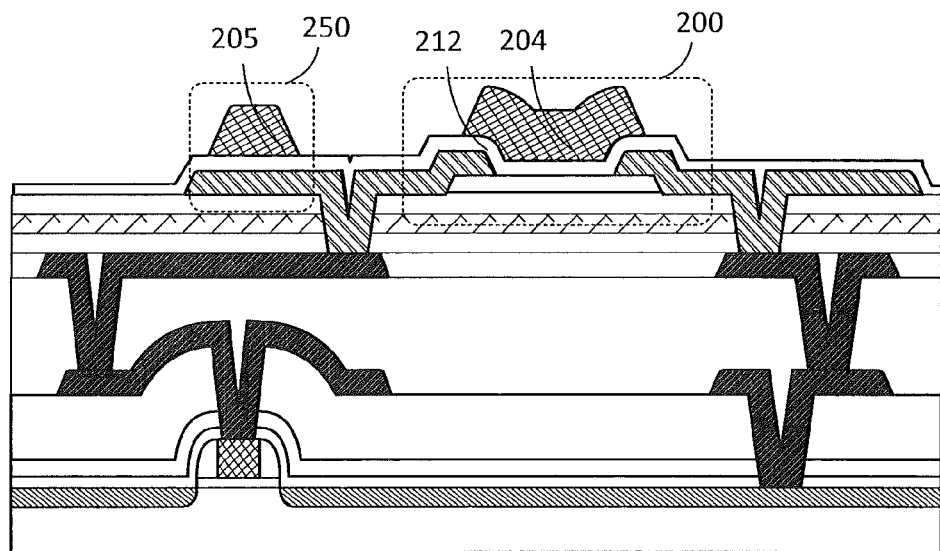
FIGS. 11A and 11B are cross-sectional views illustrating an example of the semiconductor device of one embodiment of the present invention.
Figure 11B:
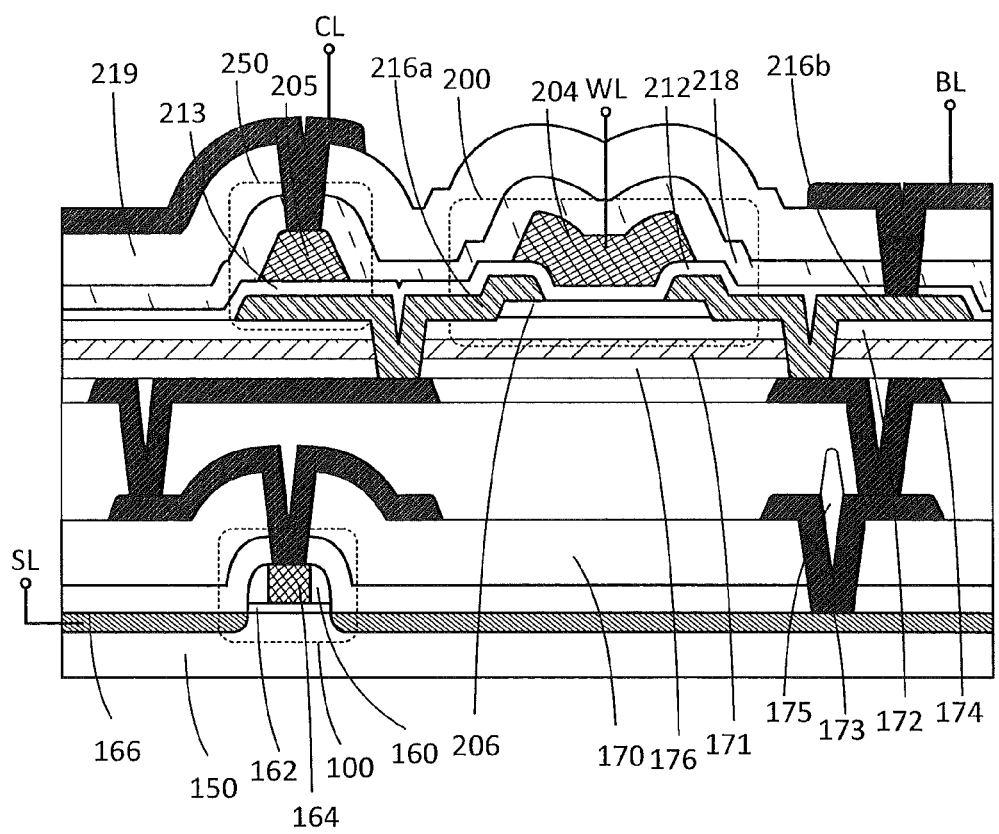

Note that as illustrated in FIG. 11A, the gate insulating film 212 is not necessarily etched into an island shape. In that case, the insulating film 213 is connected to the gate insulating film 212. FIG. 11B illustrates an example of a completed device having the structure illustrated in FIG. 11A.

Through the above steps, the transistor 200 and the capacitor 250 can be manufactured.

Figure 8A:
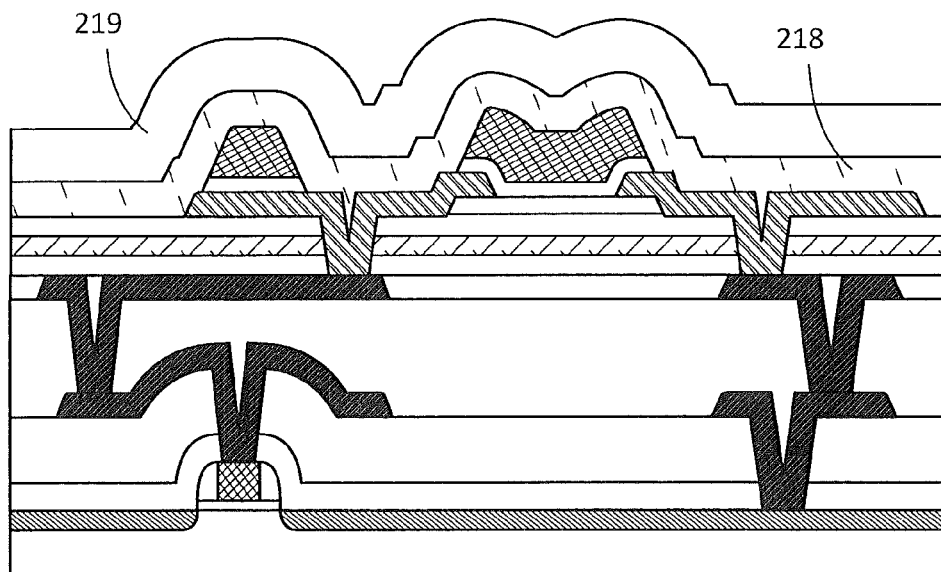
FIGS. 8A and 8B are cross-sectional views illustrating an example of the method for manufacturing the semiconductor device of one embodiment of the present invention.

Then, the barrier film 218 and the insulating film 219 are formed to cover the transistor 200 and the capacitor 250 (see FIG. 8A).

Figure 8B:
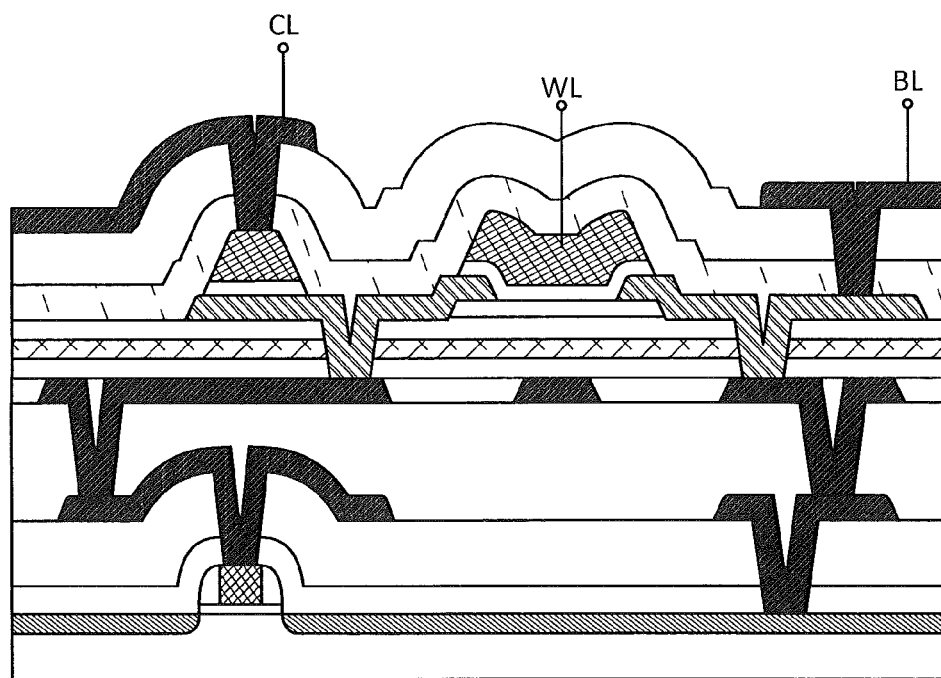

Subsequently, openings are formed in the barrier film 218 and the insulating film 219 so as to reach the transistor 200 and the capacitor 250. Then, the wiring CL, the wiring WL, and the wiring BL are formed so as to be electrically connected to the transistor 200 and the capacitor 250 through the openings (see FIG. 8B).

Through the above steps, the semiconductor device including the transistor 100, the transistor 200, and the capacitor 250 can be manufactured.

This embodiment shows, but is not limited to, an example of using the oxide semiconductor film 206. Depending on the circumstances or situation, a semiconductor film including another material may be used instead of the oxide semiconductor film 206. For example, a semiconductor film including one or more of elements such as silicon, germanium, gallium, and arsenic may be used instead of the oxide semiconductor film 206 in a channel region, a source and a drain region, an LDD region, or the like.

Note that the structures, methods, and the like described in this embodiment can be combined as appropriate with any of the structures, methods, and the like described in the other embodiments and modification examples thereof.

(Embodiment 2)

In this embodiment, a semiconductor device (memory device) that can retain stored data even when not powered, and that has an unlimited number of write cycles will be described with reference to FIGS. 1A to 1C.

The transistor 200 is a transistor in which a channel is formed in a semiconductor layer including an oxide semiconductor. Since the off-state current of the transistor 200 is low, stored data can be retained for a long period. In other words, it is possible to provide a semiconductor device that does not need refresh operation or has an extremely low frequency of refresh operation, and thus has a sufficiently reduced power consumption.

The semiconductor device in FIGS. 1A to 1C has a feature that the potential of the gate electrode of the transistor 100 can be retained, and thus enables writing, retaining, and reading of data in the following manner.

Writing and retaining of data are described. First, the potential of the wiring WL is set to a potential at which the transistor 200 is turned on, so that the transistor 200 is turned on. Accordingly, the potential of the wiring BL is supplied to the gate electrode of the transistor 100 and the capacitor 250. That is, a predetermined charge is supplied to the gate of the transistor 100 (writing). Here, one of two kinds of charges providing different potential levels (hereinafter referred to as a low-level charge and a high-level charge) is supplied. After that, the potential of the wiring WL is set to a potential at which the transistor 200 is turned off, so that the transistor 200 is turned off. Thus, the charge supplied to the gate of the transistor 100 is held (retaining).

Since the off-state current of the transistor 200 is extremely low, the charge of the gate of the transistor 100 is retained for a long time.

Next, reading of data is described. An appropriate potential (a reading potential) is supplied to the wiring CL while a predetermined potential (a constant potential) is supplied to the wiring BL, whereby the potential of the wiring SL varies depending on the amount of charge retained in the gate of the transistor 100. This is because in the case of using an n-channel transistor as the transistor 100, an apparent threshold voltage $V_{th\_H}$ at the time when the high-level charge is given to the gate electrode of the transistor 100 is lower than an apparent threshold voltage $V_{th\_L}$, at the time when the low-level charge is given to the gate electrode of the transistor 100. Here, the apparent threshold voltage refers to the potential of the wiring CL which is needed to turn on the transistor 100. Thus, when the potential of the wiring CL is set to a potential $V_0$ which is between $V_{th\_H}$ and $V_{th\_L}$, charge supplied to the gate the transistor 100 can be determined. For example, in the case where the high-level charge is supplied to the gate of the transistor 100 in writing and the potential of the wiring CL is $V_0$ ($>V_{th\_H}$), the transistor 100 is turned on. In the case where the low-level charge is supplied to the gate of the transistor 100 in writing, even when the potential of the wiring CL is $V_0$ ($<V_{th\_L}$), the transistor 100 remains off. Thus, the data retained in the gate of the transistor 100 can be read by determining the potential of the wiring SL.

Note that in the case where memory cells are arrayed, it is necessary that data of a desired memory cell is read. In the case where such reading is not performed, the wiring CL may be supplied with a potential at which the transistor 100 is turned off regardless of the state of the gate, that is, a potential lower than $V_{th\_H}$. Alternatively, the wiring CL may be supplied with a potential at which the transistor 100 is turned on regardless of the state of the gate, that is, a potential higher than $V_{th\_L}$.

Figure 1C:
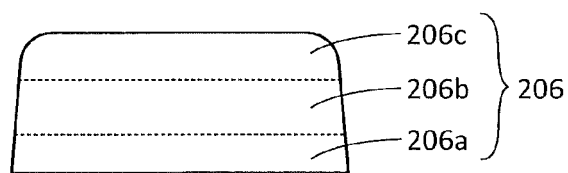
Figure 20:
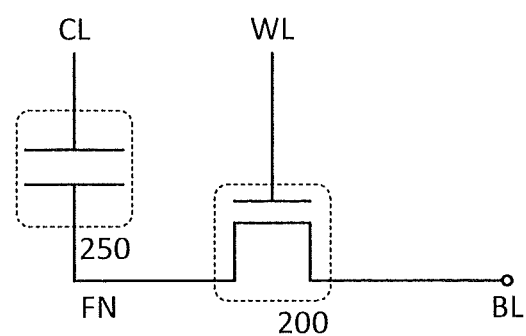
FIG. 20 illustrates an example of a configuration of a memory device.

A semiconductor device (memory device) illustrated in FIG. 20 is different from that illustrated in FIGS. 1A to 1C in that the transistor 100 is not provided. Also in this case, writing and retaining operation of data can be performed in a manner similar to the above.

Next, reading of data is described. When the transistor 200 is turned on, the wiring BL which is in a floating state and the capacitor 250 are electrically connected to each other, and the charge is redistributed between the wiring BL and the capacitor 250. As a result, the potential of the wiring BL is changed. The amount of change in the potential of the wiring BL varies depending on the potential of the one electrode of the capacitor 250 (or the charge accumulated in the capacitor 250).

For example, the potential of the wiring BL after the charge redistribution is $(C_B \times V_{B0} + C \times V)/(C_B + C)$, where V is the potential of the one electrode of the capacitor 250, C is the capacitance of the capacitor 250, $C_B$ is the capacitance component of the wiring BL, and $V_{B0}$ is the potential of the wiring BL before the charge redistribution. Thus, it can be found that, assuming that the memory cell is in either of two states in which the potential of the one electrode of the capacitor 250 is $V_1$ and $V_0$ ($V_1 > V_0$), the potential of the wiring BL in the case of retaining the potential $V_1$ (=$(C_B \times V_{B0} + C \times V_1)/(C_B + C)$) is higher than the potential of the wiring BL in the case of retaining the potential $V_0$ (=$(C_B \times V_{B0} + C \times V_0)/(C_B + C)$).

Then, by comparing the potential of the wiring BL with a predetermined potential, data can be read.

In that case, a transistor including the aforementioned semiconductor material such as silicon may be used for a driver circuit for driving a memory cell, and a transistor including the oxide semiconductor may be stacked over the driver circuit as the transistor 200.

When including a transistor in which a channel formation region is formed using an oxide semiconductor and which has an extremely low off-state current, the semiconductor device described in this embodiment can retain stored data for an extremely long time. In other words, power consumption can be sufficiently reduced because refresh operation becomes unnecessary or the frequency of refresh operation can be extremely low. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Moreover, data is written depending on the state of the transistor (on or off), whereby high-speed operation can be easily achieved.

The structures, methods, and the like described in this embodiment can be combined as appropriate with any of the structures, methods, and the like described in the other embodiments.

(Embodiment 3)

In this embodiment, an RF tag that includes the transistor or the memory device described in the above embodiments will be described with reference to FIG. 21.

The RF tag of this embodiment includes a memory circuit, stores necessary data in the memory circuit, and transmits and receives data to and from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 21. FIG. 21 is a block diagram illustrating a configuration example of the RF tag.

Figure 21:
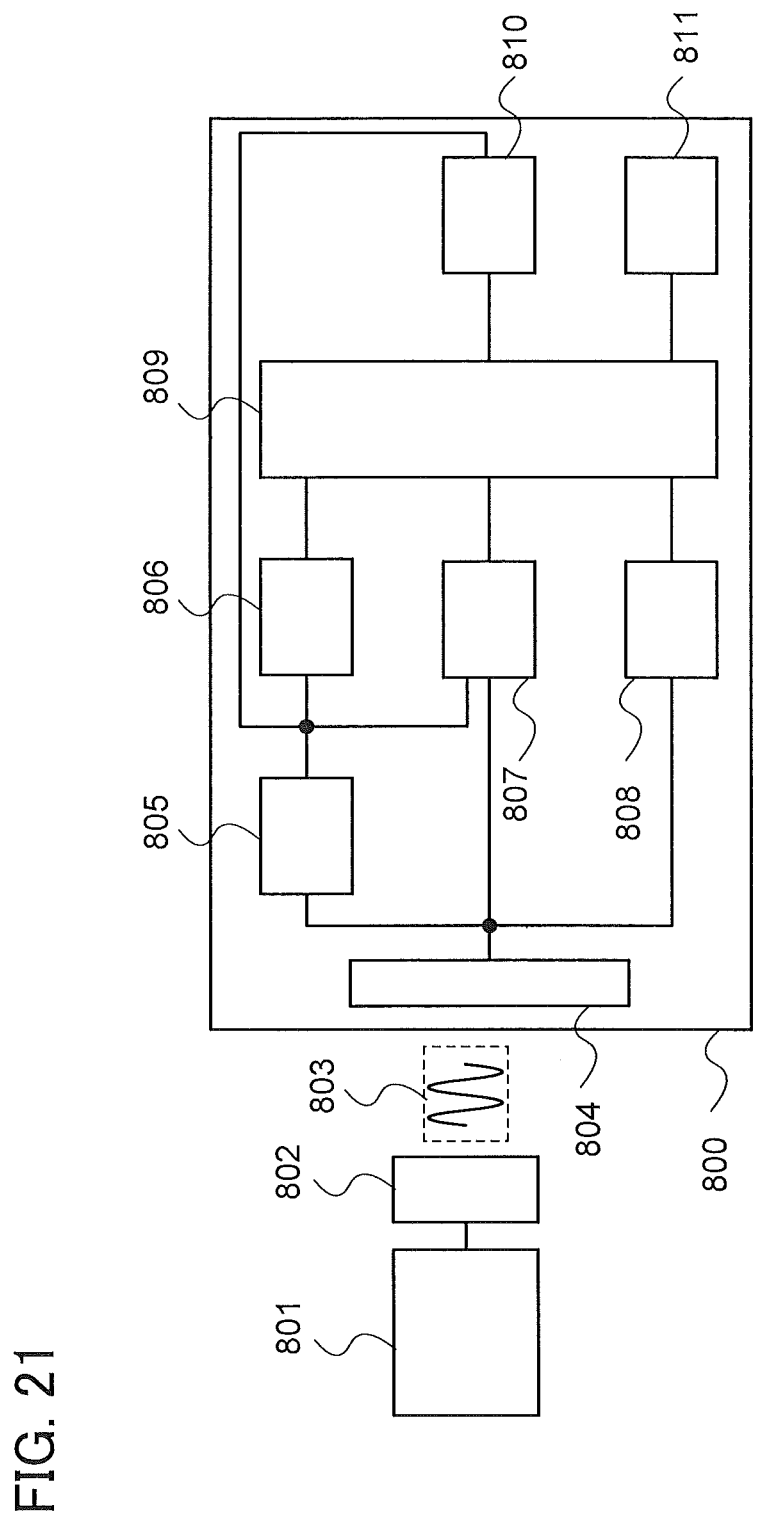
FIG. 21 illustrates an example of a configuration of an RF tag of one embodiment.

As illustrated in FIG. 21, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils are provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to a certain level is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit generates a reset signal of the logic circuit 809 by utilizing rise of the stable power supply voltage.

The demodulation circuit 807 demodulates the input alternating signal by envelope detection and generates a demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate.

Here, the above-described memory device can be used as the memory circuit 810. The memory device of one embodiment of the present invention can retain data even when not powered, and therefore is suitable for an RF tag. Furthermore, the memory device of one embodiment of the present invention needs power (voltage) needed for data writing lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. The manufacturer gives identification numbers before shipment and then starts shipment of products, instead of putting identification numbers to all the manufactured RF tags; as a result, it is possible to put identification numbers to only good products to be shipped. Thus, the identification numbers of the shipped products are in series, which facilitates customer management corresponding to the shipped products.

(Embodiment 4)

Described in this embodiment is a CPU in which at least the transistor described in any of the above embodiments can be used and the memory device described in the above embodiment is included.

Figure 22:
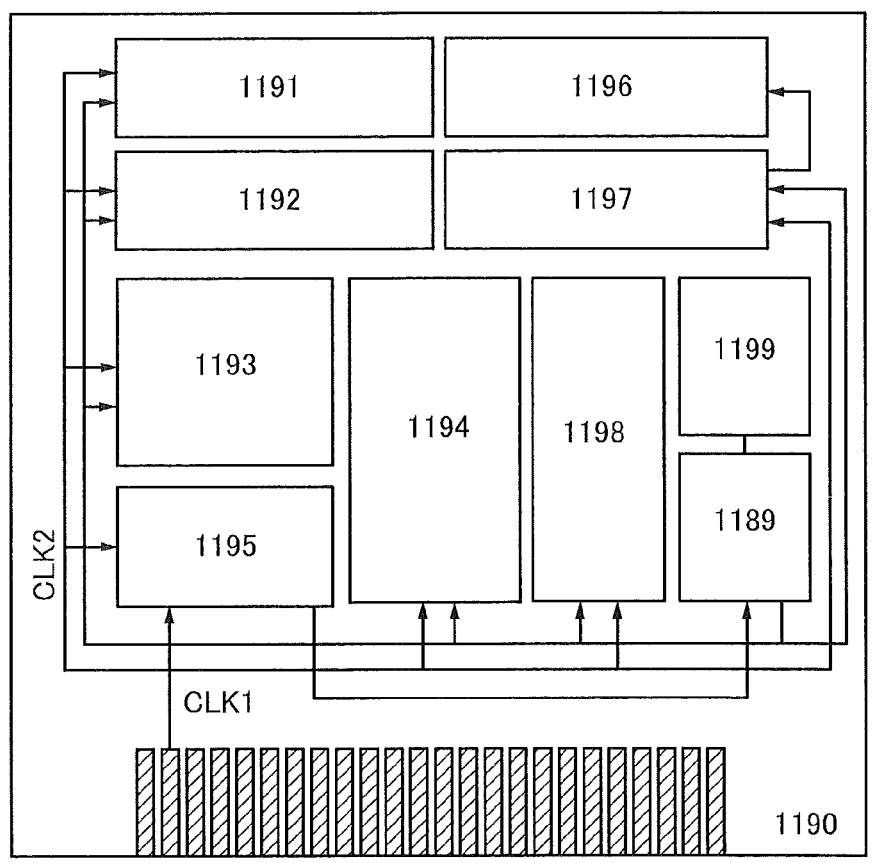
FIG. 22 illustrates an example of a configuration of a CPU of one embodiment.

FIG. 22 is a block diagram illustrating a configuration example of a CPU at least partly including any of the transistors that have normally-off characteristics as described in the above embodiments. Note that a CPU at least partly including a transistor having normally-off characteristics is referred to as a normally-off CPU in some cases.

The CPU illustrated in FIG. 22 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 22 is just an example in which the configuration is simplified, and an actual CPU may have a variety of configurations depending on the application. For example, the CPU may have the following configuration: a structure including the CPU illustrated in FIG. 22 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 22, a memory cell is provided in the register 1196. For the memory cell of the register 1196, any of the transistors described in the above embodiments can be used.

In the CPU illustrated in FIG. 22, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 23:
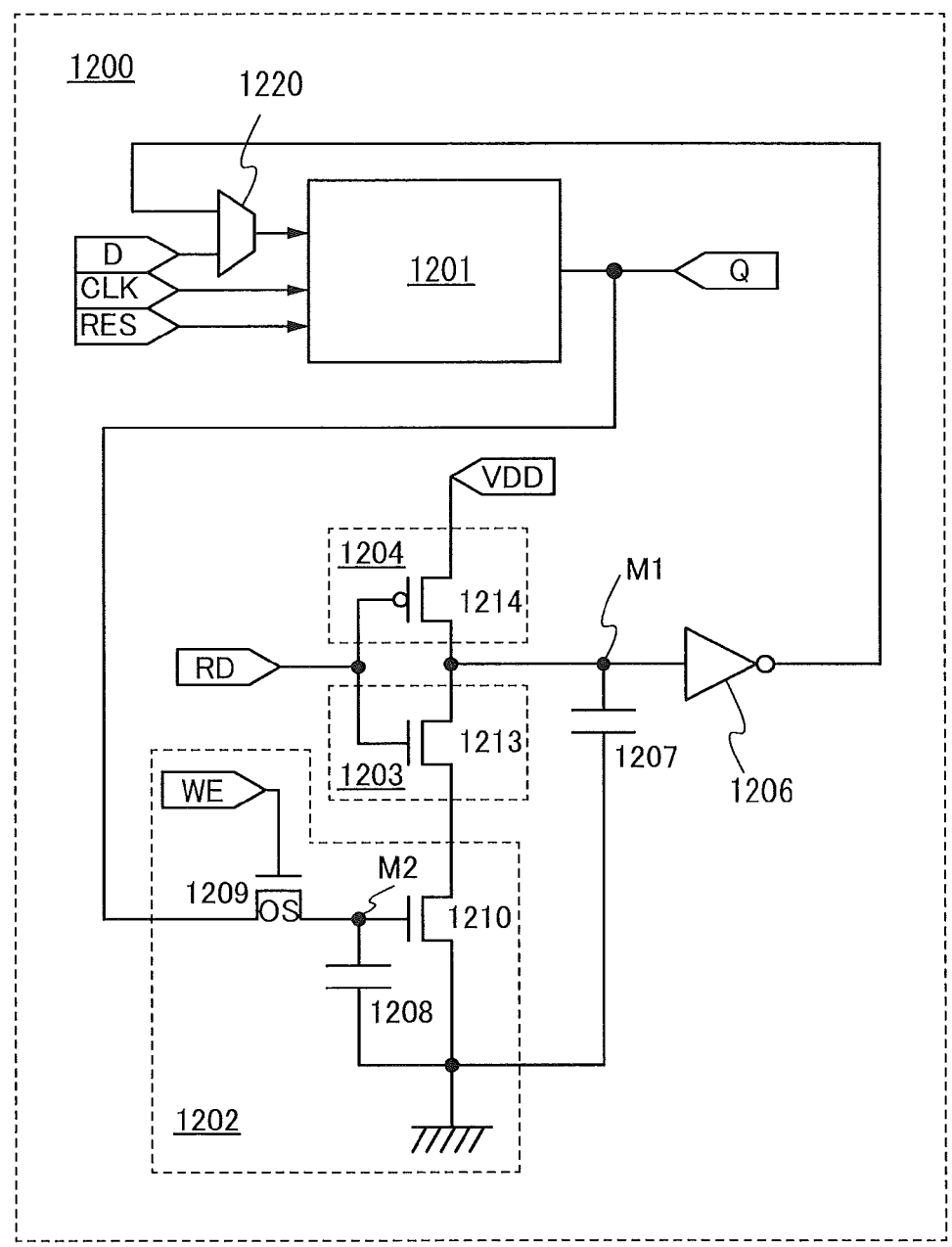
FIG. 23 is a circuit diagram of a memory element of one embodiment.

FIG. 23 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 can be omitted if the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When one of the switches is in the conduction state between the first terminal and the second terminal, the other of the switches is in the non-conduction state between the first terminal and the second terminal.

A signal corresponding to data retained in the circuit 1201 is input to the other of the source and the drain of the transistor 1209. FIG. 23 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 23, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 23, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory element 1200. Further alternatively, in the memory element 1200, a transistor in which a channel is formed in an oxide semiconductor layer can be included besides the transistor 1209, and a transistor in which a channel is formed in the substrate 1190 or a layer including a semiconductor other than an oxide semiconductor can be used for the rest of the transistors.

As the circuit 1201 in FIG. 23, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By using the above-described memory element 1200 for a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, a programmable logic device (PLD), or a field programmable gate array (FPGA), and a radio frequency (RF) device.

(Embodiment 5)

In this embodiment, an example of a structure of a display device of one embodiment of the present invention will be described.

[Example of Structure]

Figure 24A:
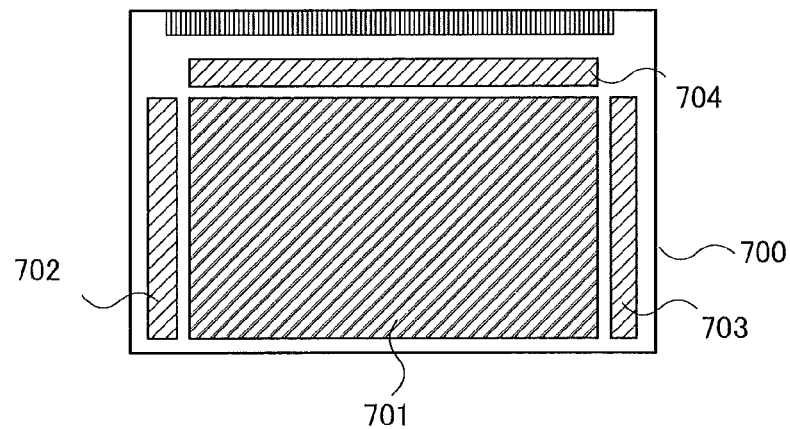
FIGS. 24A to 24C illustrate a display device of one embodiment.
Figure 24B:
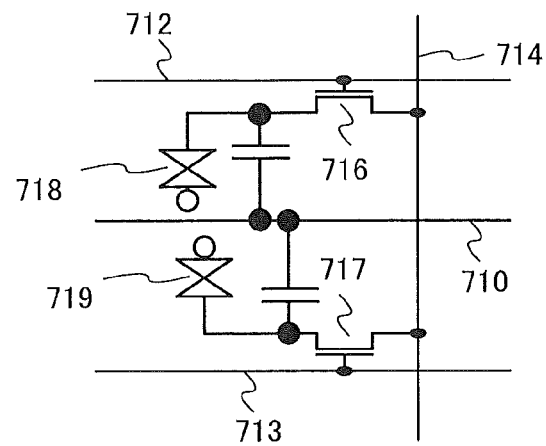
Figure 24C:
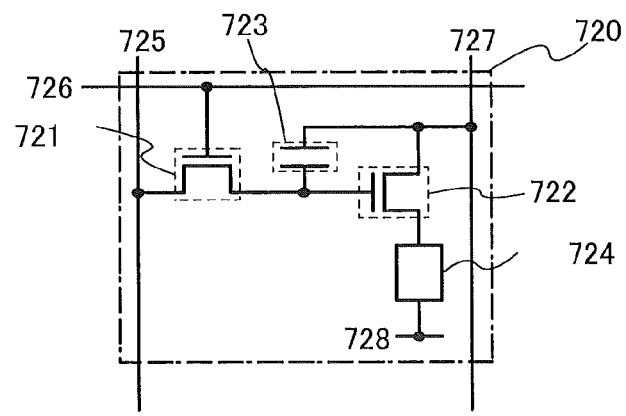

FIG. 24A is a top view of the display device of one embodiment of the present invention. FIG. 24B is a circuit diagram illustrating a pixel circuit that can be used in the case where a liquid crystal element is used in a pixel in the display device of one embodiment of the present invention. FIG. 24C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor is formed over the same substrate as the transistor of the pixel portion. With the use of any of the transistors described in the above embodiments for the pixel portion or the driver circuit in this manner, a highly reliable display device can be provided.

FIG. 24A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in the respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 24A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, leading to cost reduction. Furthermore, if the driver circuit is provided outside the substrate 700, wirings would need to be extended and the number of wiring connections would increase. When the driver circuit is provided over the substrate 700, the number of wiring connections can be reduced, resulting in an improvement in reliability or yield.

[Liquid Crystal Display Device]

FIG. 24B illustrates an example of a circuit configuration of the pixel. Here, a pixel circuit that can be used in a pixel of a VA liquid crystal display panel is illustrated.

This pixel circuit can be used for a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 which functions as a data line is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer is spread in a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

A storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 24B. For example, a switch, a resistor, a capacitor, a transistor, a sensor, a logic circuit, or the like may be added to the pixel illustrated in FIG. 24B.

[Organic EL Display Device]

FIG. 24C illustrates another example of a circuit configuration of the pixel. Here, a pixel structure of a display device including an organic EL element is shown.

In an organic EL element, by application of voltage to a light-emitting element, electrons are injected from one of a pair of electrodes and holes are injected from the other of the pair of electrodes into a layer containing a light-emitting organic compound, so that current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 24C illustrates an applicable example of a pixel circuit. Here, one pixel includes two n-channel transistors. Note that a metal oxide film of one embodiment of the present invention can be used for channel formation regions of the n-channel transistors. Furthermore, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that a voltage higher than or equal to the sum of power supply line voltage and the threshold voltage Vth of the driver transistor 722 is applied to the signal line 725.

In the case of performing analog grayscale driving, a voltage higher than or equal to the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that illustrated in FIG. 24C. For example, a switch, a resistor, a capacitor, a sensor, a transistor, a logic circuit, or the like may be added to the pixel circuit illustrated in FIG. 24C.

In the case where the transistor shown in any of the above embodiments is used for any of the circuits shown in FIGS. 24A to 24C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an electroluminescent (EL) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper.

At least part of this embodiment can be combined as appropriate with any of the other embodiments in this specification.

(Embodiment 6)

In this embodiment, a display module using a semiconductor device of one embodiment of the present invention will be described with reference to FIG. 25.

Figure 25:
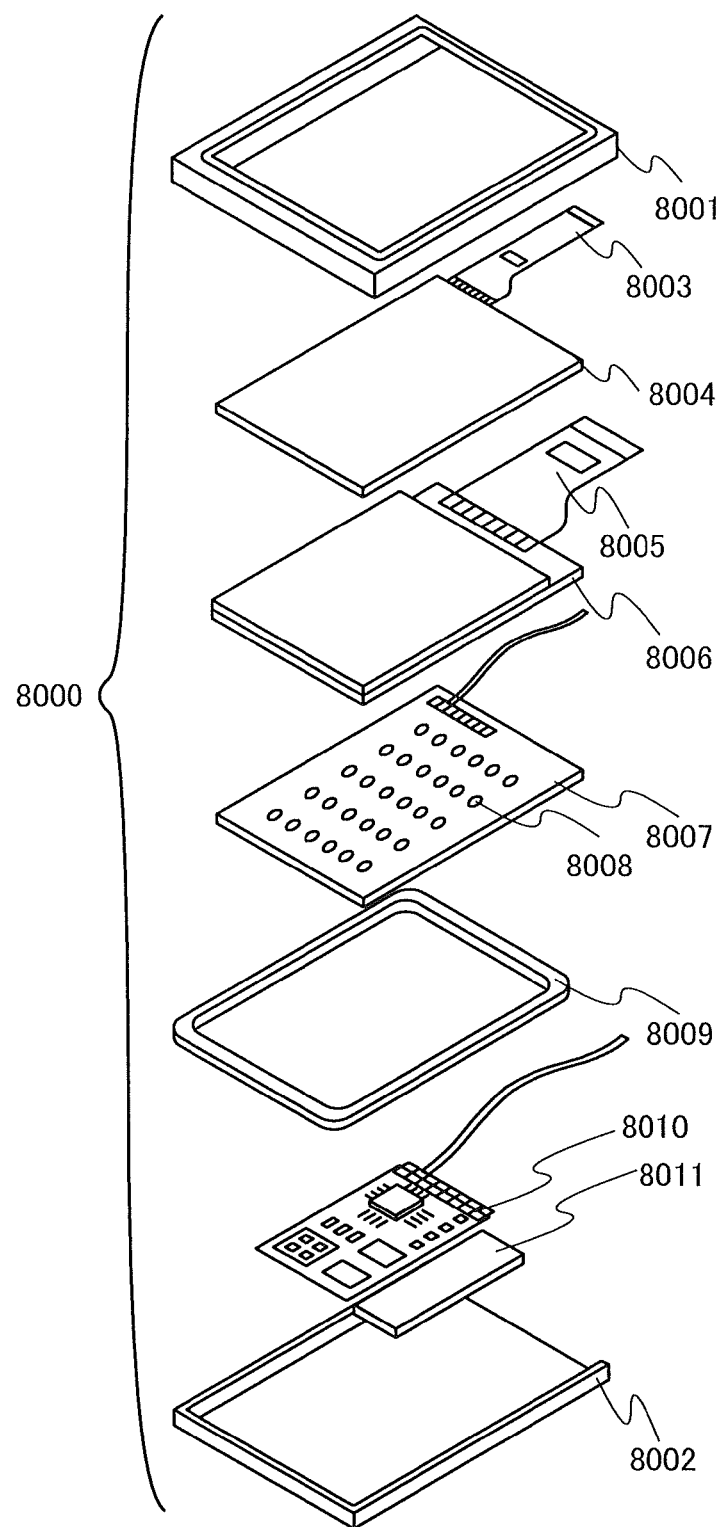
FIG. 25 illustrates a display module.

In a display module 8000 in FIG. 25, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

The structure described in this embodiment can be combined as appropriate with the any of the structures described in the other embodiments.

(Embodiment 7)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 26A to 26F illustrate specific examples of these electronic devices.

Figure 26A:
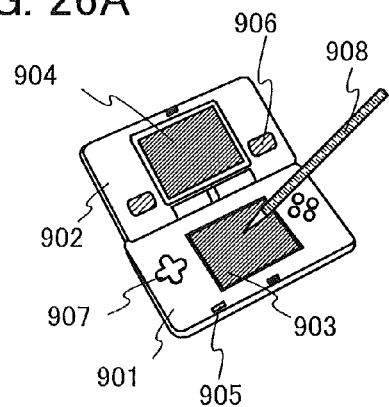
FIGS. 26A to 26F illustrate electronic devices of one embodiment.

FIG. 26A illustrates a portable game console including a housing 901, a housing 902, a display portion 903, a display portion 904, a microphone 905, a speaker 906, an operation key 907, a stylus 908, and the like. Although the portable game console in FIG. 26A has the two display portions 903 and 904, the number of display portions included in a portable game console is not limited to this.

Figure 26B:
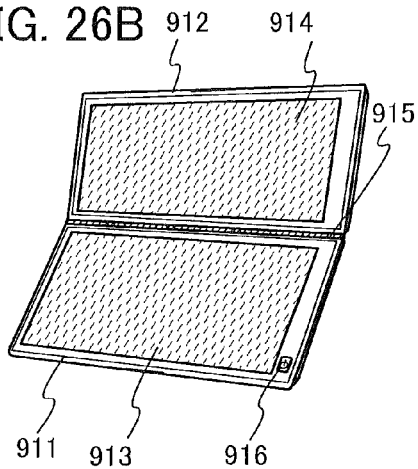

FIG. 26B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 26C:
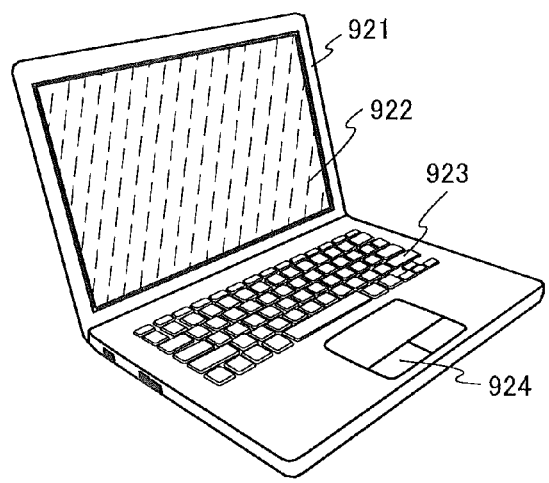

FIG. 26C illustrates a laptop personal computer including a housing 921, a display portion 922, a keyboard 923, a pointing device 924, and the like.

Figure 26D:
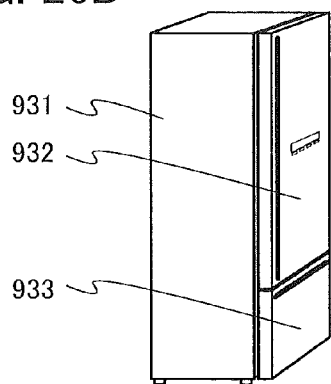

FIG. 26D illustrates an electric refrigerator-freezer including a housing 931, a door for a refrigerator 932, a door for a freezer 933, and the like.

Figure 26E:
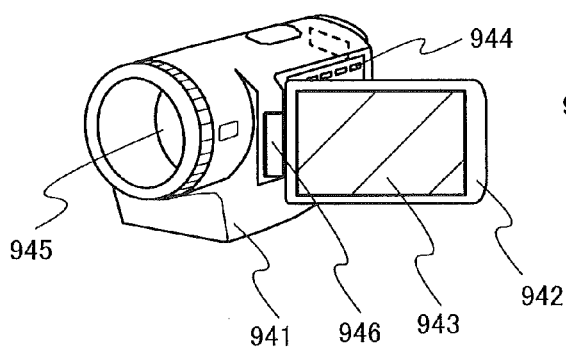

FIG. 26E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle between the first housing 941 and the second housing 942 at the joint 946.

Figure 26F:
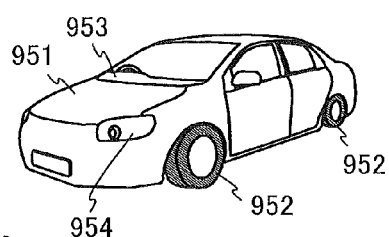
Figure 27A:
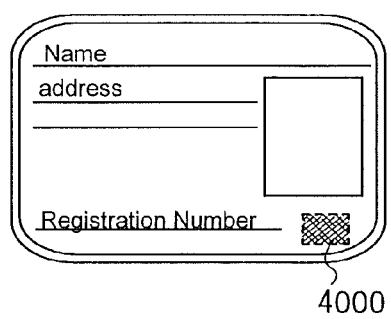
FIGS. 27A to 27F illustrate application examples of an RF device of one embodiment.
Figure 27B:
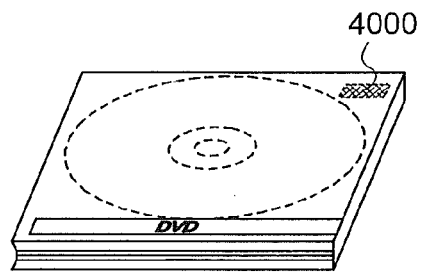
Figure 27C:
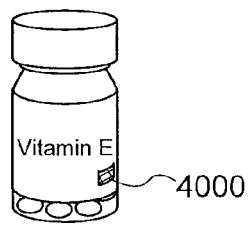
Figure 27D:
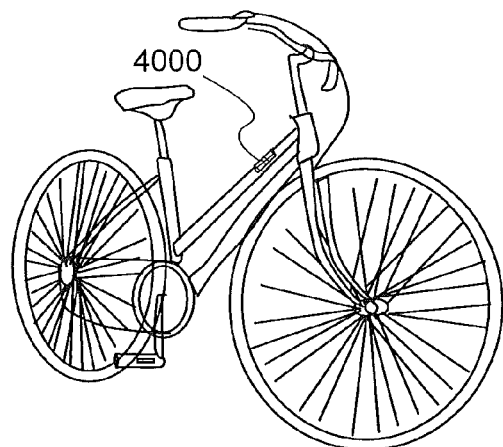
Figure 27E:
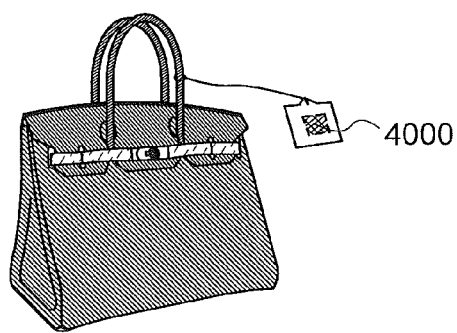
Figure 27F:
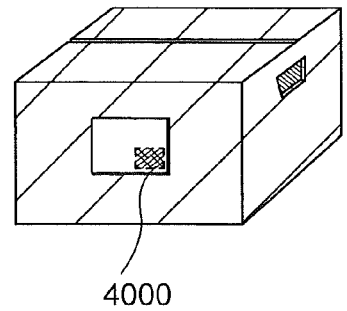

FIG. 26F illustrates an ordinary vehicle including a car body 951, wheels 952, a dashboard 953, lights 954, and the like.

(Embodiment 8)

In this embodiment, application examples of an RF device of one embodiment of the present invention will be described with reference to FIGS. 27A to 27F. The RF devices are widely used and can be provided for, for example, products such as bills, coins, securities, bearer bonds, documents (e.g., driver's licenses or resident's cards, see FIG. 27A), packaging containers (e.g., wrapping paper or bottles, see FIG. 27C), recording media (e.g., DVD or video tapes, see FIG. 27B), vehicles (e.g., bicycles, see FIG. 27D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 27E and 27F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic devices, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF device can be preferably used for application in which data is not frequently written or read.

Example 1

This example shows the results of TDS measurement of the dehydrogenation and dehydration effect on insulating films over a transistor using a silicon-based semiconductor material.

Samples used in this example will be described.

Thermal oxidation was performed on a silicon substrate, so that a 100-nm-thick thermal oxide film was formed on a surface of the silicon substrate. The thermal oxidation was performed at 950° C. for 4 hours in an atmosphere containing hydrogen chloride (HCl) at 3 vol % with respect to oxygen.

Then, a 280-nm-thick silicon nitride oxide film was deposited over the thermal oxide film by a CVD method in the following conditions: silane ($SiH_4$) at a flow rate of 40 sccm, dinitrogen monoxide ($N_2O$) at a flow rate of 30 sccm, ammonia ($NH_3$) at a flow rate of 300 sccm, and hydrogen ($H_2$) at a flow rate of 900 sccm were used as source gases; the pressure in a reaction chamber was 160 Pa; the substrate temperature was 325° C.; and a high-frequency power of 250 W was supplied to parallel plate electrodes by using a 27 MHz high-frequency power source.

A 300-nm-thick silicon oxynitride film was deposited by a thermal CVD method in the following conditions: silane ($SiH_4$) at a flow rate of 40 sccm and dinitrogen monoxide ($N_2O$) at a flow rate of 400 sccm were used as source gases; the pressure in a reaction chamber was 267 Pa (2 Torr); and the substrate temperature was 400° C.

Next, a 500-nm-thick silicon oxide film was deposited over the silicon oxynitride film by a CVD method in the following conditions: tetraethoxysilane (TEOS) at a flow rate of 15 sccm and oxygen ($O_2$) at a flow rate of 750 sccm were used as source gases; the substrate temperature was 300° C.; and a high-frequency power of 300 W was supplied to parallel plate electrodes by using a 27 MHz high-frequency power source.

Heat treatment was performed in the following conditions: Condition 1, 3-hour heat treatment at 490° C. under a nitrogen atmosphere; Condition 2, 5-hour heat treatment at 490° C. under a nitrogen atmosphere; Condition 3, 10-hour heat treatment at 490° C. under a nitrogen atmosphere; Condition 4, 1-hour heat treatment at 530° C. under a nitrogen atmosphere; Condition 5, 3-hour heat treatment at 530° C. under a nitrogen atmosphere; Condition 6, 5-hour heat treatment at 530° C. under a nitrogen atmosphere; Condition 7, 10-hour heat treatment at 530° C. under a nitrogen atmosphere; Condition 8, 1-hour heat treatment at 540° C. under a nitrogen atmosphere; Condition 9, 5-hour heat treatment at 450° C. under a nitrogen atmosphere; and Condition 10, no heat treatment.

Subsequently, the amount of gas released from each sample was measured. Note that the TDS analysis was performed using EMD-WA1000 S/W, a thermal desorption spectrometer manufactured by ESCO, Ltd. The measurement conditions were as follows: a SEM voltage of 1000 V, a substrate surface temperature ranging from room temperature to 530° C., a degree of vacuum of $1.9 \times 10^{-7}$ Pa or less, a Dwell Time of 0.2 (sec/U), and a temperature rising rate set to 32 (° C./min). Note that the temperature rising rate of the substrate surface was approximately 18 (° C./min).

Figure 28:
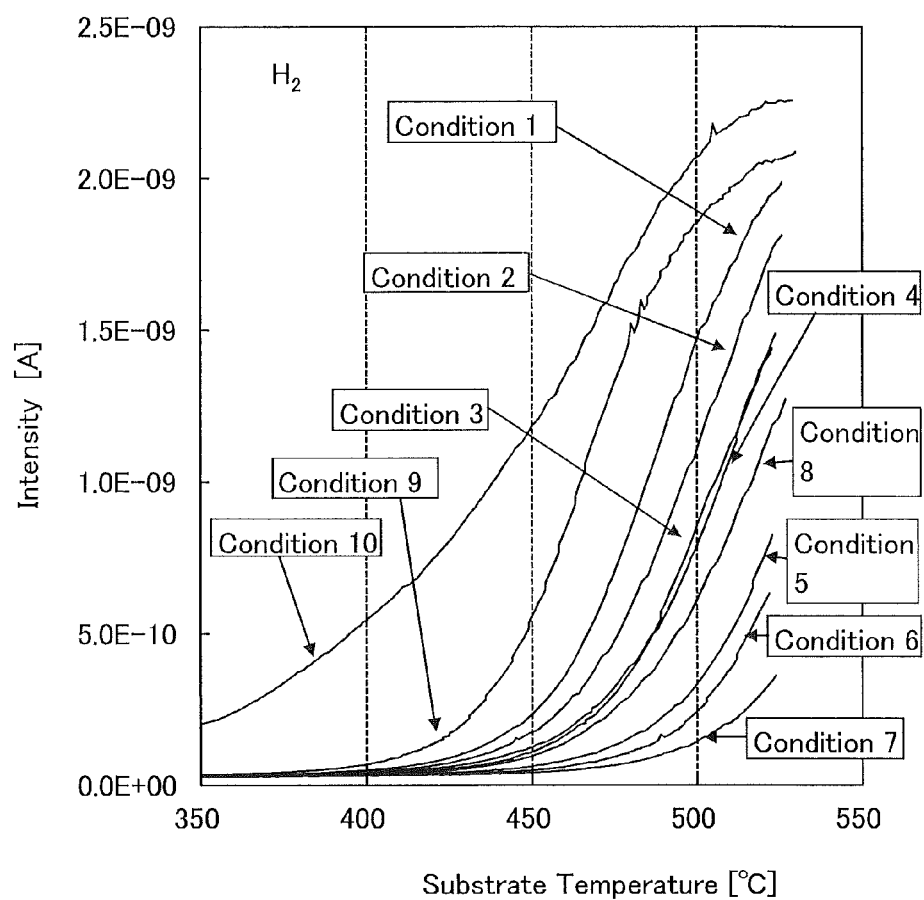
FIG. 28 shows the results of TDS measurement.
Figure 29:
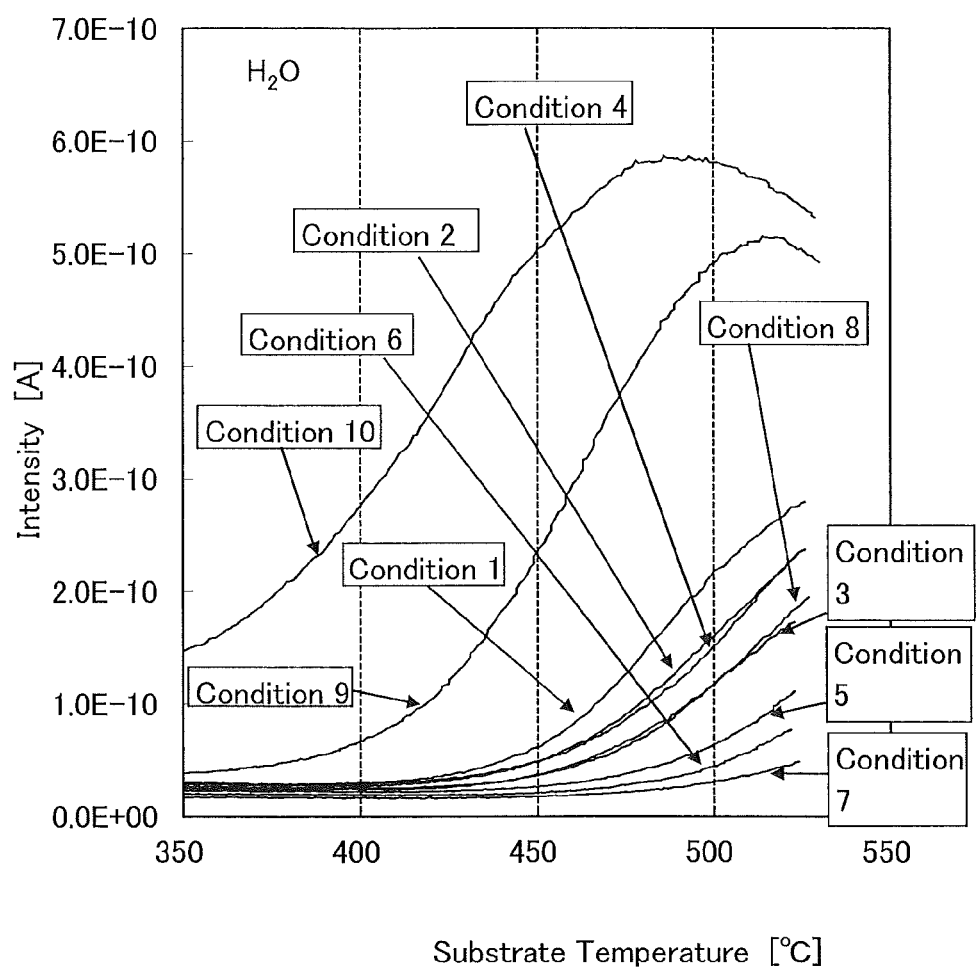
FIG. 29 shows the results of TDS measurement.

FIG. 28 and FIG. 29 show the amount of released hydrogen molecules, $H_2$ (mass-to-charge ratio m/z=2) and the amount of released water molecules, $H_2O$ (mass-to-charge ratio m/z=18), respectively, which were measured by TDS.

Under the conditions 4, 5, 6, and 7, hydrogen molecules and water molecules were quantified and measured. Hydrogen molecules were quantified in the range of 50° C. to 450° C., and water molecules were quantified in the range of 200° C. to 450° C.

Table 1 shows the results of quantification of hydrogen molecules and water molecules under the respective conditions.

TABLE 1

|  |  | Hydrogen molecule [/cm²] | Water molecule [/cm²] |
|---|---|---|---|
| Condition 1 | 490° C. 3 hr | 1.3E+15 | 3.1E+15 |
| Condition 2 | 490° C. 5 hr | 9.8E+14 | 2.8E+15 |
| Condition 3 | 490° C. 10 hr | 6.8E+14 | 2.2E+15 |
| Condition 4 | 530° C. 1 hr | 9.3E+14 | 3.1E+15 |
| Condition 5 | 530° C. 3 hr | 4.2E+14 | 1.9E+15 |
| Condition 6 | 530° C. 5 hr | 3.6E+14 | 1.5E+15 |
| Condition 7 | 530° C. 10 hr | 2.8E+14 | 1.1E+15 |
| Condition 8 | 540° C. 1 hr | 5.8E+14 | 2.3E+15 |
| Condition 9 | 450° C. 5 hr | 2.9E+15 | 6.4E+15 |
| Condition 10 | No heat treatment | 2.1E+16 | 2.3E+16 |

Table 1 and FIG. 28 indicate that the amount of released hydrogen was reduced with an increase in temperature and heating time. Under the conditions 5, 6, and 7, the amount of released hydrogen molecules at 450° C. was found to be less than or equal to 130% of the amount of released hydrogen molecules at 350° C. In addition, Table 1 and FIG. 29 indicate that the amount of released water was reduced with an increase in temperature and heating time.

Example 2

In this example, a semiconductor device that included a transistor including single crystal silicon and a transistor including an oxide semiconductor stacked over the transistor was manufactured, and the electrical characteristics of the transistors were measured.

[Samples]

Methods for manufacturing samples are described below.

First, an SOI substrate including a single crystal silicon film with a thickness of 52 nm was prepared as a substrate.

Next, part of the single crystal silicon film was etched by photolithography to form an island-shaped single crystal silicon film.

Next, a surface of the single crystal silicon film was oxidized by a microwave CVD method to form a silicon oxide film with a thickness of 10 nm. Note that the microwave CVD method is also called a high-density plasma CVD method or the like. Then, heat treatment was performed at 950° C. in a nitrogen atmosphere for 1 hour. In such a manner, a gate insulating film was formed.

Next, phosphorus ions were implanted into part of the single crystal silicon film in order to form a p-channel transistor. The phosphorus ions were implanted by an ion implantation apparatus with a mass separation function at an acceleration voltage of 18 kV and a concentration of $6.5 \times 10^{11}$ ions/cm².

Next, boron ions were implanted into part of the single crystal silicon film in order to form an n-channel transistor. The boron ions were implanted by the ion implantation apparatus at an acceleration voltage of 14 kV and a concentration of $3.0 \times 10^{12}$ ions/cm².

Next, a tantalum nitride film with a thickness of 30 nm and a tungsten film with a thickness of 170 inn were sequentially formed by a sputtering method. After that, parts of the tantalum nitride film and the tungsten film were etched by photolithography to form a gate electrode.

Next, boron ions were implanted into a region in the single crystal silicon film that was to be the p-channel transistor with the use of the gate electrode as a mask. The boron ions were implanted by the ion implantation apparatus at an acceleration voltage of 9 kV and a concentration of $1.0 \times 10^{13}$ ions/cm².

Next, phosphorus ions were implanted into a region in the single crystal silicon film that was to be the n-channel transistor with the use of the gate electrode as a mask. The phosphorus ions were implanted by the ion implantation apparatus at an acceleration voltage of 9 kV and a concentration of $1.0 \times 10^{13}$ ions/cm².

Next, a silicon oxynitride film was formed to a thickness of 300 nm by a plasma CVD method and subjected to anisotropic etching to form an insulating film (also referred to as a sidewall insulating film) in contact with a side surface of the gate electrode. Note that part of the gate insulating film was also etched when the silicon oxynitride film was etched. As a result, part of the single crystal silicon film was exposed.

Next, the region in the single crystal silicon film that was to be the p-channel transistor was doped with boron ions with the use of the gate electrode and the sidewall insulating film as masks. The region was doped with the boron ions by an ion doping apparatus without a mass separation function at an acceleration voltage of 10 kV and a concentration of $1.5 \times 10^{16}$ ions/cm². The region doped with the boron ions functions as a source region or a drain region of the p-channel transistor. In addition, a region directly under the sidewall insulating film has a carrier density between those of a channel formation region and the source or drain region, which were formed through the above-described steps, and thus functions as a lightly doped drain (LDD) region.

Next, the region in the single crystal silicon film that was to be the n-channel transistor was doped with phosphorus ions with the use of the gate electrode and the sidewall insulating film as masks. The region was doped with the phosphorus ions by the ion doping apparatus at an acceleration voltage of 10 kV and a concentration of $3.0 \times 10^{15}$ ions/cm². The region doped with the phosphorus ions functions as a source region or a drain region of the n-channel transistor. In addition, a region directly under the sidewall insulating film has a carrier density between those of a channel formation region and the source or drain region, which were formed through the above-described steps, and thus functions as an LDD region.

Next, a silicon oxynitride film was formed to a thickness of 50 nm by a plasma CVD method.

Then, heat treatment was performed at 550° C. in a nitrogen atmosphere for 1 hour.

Next, a silicon nitride oxide film was formed to a thickness of 280 nm by a plasma CVD method. Since the silicon nitride oxide film contains a large amount of hydrogen, it is also called a SiNOH film.

Next, a silicon oxynitride film was formed to a thickness of 300 nm by a thermal CVD method.

Then, heat treatment was performed at 490° C. in a nitrogen atmosphere for 1 hour. By the heat treatment, hydrogen is released from the SiNOH film. The released hydrogen reaches the single crystal silicon film and terminates dangling bonds of the single crystal silicon film. Such heat treatment is called hydrogenation treatment.

Next, parts of the 50-nm-thick silicon oxynitride film, the 280-nm-thick silicon nitride oxide film, and the 300-nm-thick silicon oxide film were etched to form openings reaching the source region, the drain region, the gate electrode, and the like.

Next, a tungsten film was formed to a thickness of 150 nm by a sputtering method.

Then, part of the tungsten film was etched by photolithography to form a first wiring layer.

Next, a silicon oxide film was formed to a thickness of 900 nm by a plasma CVD method.

Then, a top surface of the silicon oxide film was subjected to CMP treatment to be planarized so that the thickness of the silicon oxide film became approximately 400 nm to 500 nm.

Next, heat treatment was performed in a nitrogen atmosphere. Note that Sample 1 was subjected to heat treatment at 490° C. for 10 hours, whereas Sample 2 was subjected to heat treatment at 450° C. for 5 hours. The heat treatment diffuses, in the outward direction, hydrogen that remains in each layer without being diffused outward by the above-described hydrogenation treatment and without being used for termination of dangling bonds, and thus is called dehydrogenation treatment. The dehydrogenation treatment becomes more effective with a higher temperature and a longer time. Thus, Sample 1 has a smaller amount of remaining hydrogen than Sample 2.

Next, part of the silicon oxide film with a thickness of approximately 400 nm to 500 nm was etched to form an opening reaching the first wiring layer or the like.

Next, a tungsten film was formed to a thickness of 150 nm by a sputtering method.

Then, part of the tungsten film was etched by photolithography to form a conductive film 220 functioning as a second electrode and a conductive film 174 functioning as a second wiring layer.

Next, a silicon oxide film was formed to a thickness of 500 nm by a plasma CVD method.

Then, a top surface of the silicon oxide film was subjected to CMP treatment to be planarized so that the thickness of the silicon oxide film became approximately 0 nm to 50 nm, and a top surface of the tungsten film was exposed.

Next, a silicon oxide film was formed to a thickness of 100 nm by a plasma CVD method.

Next, heat treatment was performed in a nitrogen atmosphere. Note that Sample 1 was subjected to heat treatment at 490° C. for 10 hours, whereas Sample 2 was subjected to heat treatment at 450° C. for 1 hour. By the heat treatment, further dehydrogenation treatment was performed.

Next, an aluminum oxide film was formed to a thickness of 50 nm by a sputtering method. The aluminum oxide film has a function of blocking oxygen, hydrogen, and the like. Thus, by providing the aluminum oxide film, hydrogen released from the transistor including single crystal silicon or the insulating films, the conductive films, and the like provided near the transistor can be prevented from entering a transistor including an oxide semiconductor, which is to be manufactured later.

Next, a silicon oxynitride film containing excess oxygen was formed to a thickness of 100 nm by a plasma CVD method. Note that the silicon oxynitride film releases oxygen because of heat treatment performed later. The released oxygen is used in order to reduce oxygen vacancies in the oxide semiconductor, so that the electrical characteristics and reliability of the transistor can be improved. Meanwhile, when the released oxygen reaches single crystal silicon, the electrical characteristics and reliability of the transistor might be degraded. The above-described aluminum oxide film has a function of preventing entry of oxygen to single crystal silicon. Thus, even if the silicon oxynitride film containing excess oxygen is provided, the transistor including single crystal silicon can have good electrical characteristics and high reliability.

Next, for Sample 1, a 20-nm-thick first oxide semiconductor film and a 20-nm-thick second oxide semiconductor film were sequentially formed by a sputtering method. In addition, for Sample 2, a 20-nm-thick first oxide semiconductor film and a 15-nm-thick second oxide semiconductor film were sequentially formed by a sputtering method. The first oxide semiconductor films were formed using a target having an atomic ratio of In:Ga:Zn=1:3:2. The second oxide semiconductor films were formed using a target having an atomic ratio of In:Ga:Zn=1:1:1. Note that the first oxide semiconductor film and the second oxide semiconductor film are collectively referred to as an oxide semiconductor film 206.

Next, heat treatment was performed at 450° C. in a nitrogen atmosphere for 1 hour, and then heat treatment was performed at 450° C. in an oxygen atmosphere for 1 hour.

Next, part of the oxide semiconductor film 206 was etched by photolithography, whereby the oxide semiconductor film 206 had an island shape.

Then, parts of the silicon oxynitride film containing excess oxygen, the aluminum oxide film, and the silicon oxide film were etched to form openings reaching the conductive film 220, the conductive film 174, and the like.

Next, a tungsten film was formed to a thickness of 100 nm by a sputtering method.

Part of the tungsten film was etched by photolithography to form a conductive film 216a and a conductive film 216b that function as a source electrode and a drain electrode of the transistor including an oxide semiconductor.

Next, a third oxide semiconductor film was formed to a thickness of 5 nm by a sputtering method. The third oxide semiconductor film was formed using a target having an atomic ratio of In:Ga:Zn=1:3:2.

Next, a silicon oxynitride film was formed to a thickness of 20 nm by a plasma CVD method.

Next, a 30-nm-thick titanium nitride film and a 135-nm-thick tungsten film were formed sequentially by a sputtering method.

Then, parts of the titanium nitride film and the tungsten film were etched by photolithography to form a conductive film 204 serving as a gate electrode.

Next, parts of the third oxide semiconductor film and the silicon oxynitride film were etched by photolithography. The silicon oxynitride film is positioned between the second oxide semiconductor film that is a channel formation region and the conductive film 204 serving as the gate electrode, and thus functions as a gate insulating film.

Next, an aluminum oxide film was formed to a thickness of 150 nm by a sputtering method. The aluminum oxide film has a function of blocking oxygen, hydrogen, and the like. Thus, by providing the aluminum oxide film, hydrogen released from the transistor including single crystal silicon or the insulating films, the conductive films, and the like provided near the transistor or hydrogen from the outside of the semiconductor device can be prevented from entering the transistor including an oxide semiconductor. In addition, outward diffusion of oxygen released from the silicon oxynitride film containing excess oxygen can be prevented and oxygen can be efficiently used in order to reduce oxygen vacancies in the oxide semiconductor.

Next, heat treatment was performed at 400° C. in an oxygen atmosphere for 1 hour. By the heat treatment, part of oxygen contained in the silicon oxynitride film containing excess oxygen is released to be supplied to the first oxide semiconductor film first. Since the supplied oxygen moves like a billiard ball in the first oxide semiconductor film, oxygen seems to be also supplied to the second oxide semiconductor film. That is, by the heat treatment, oxygen vacancies in the second oxide semiconductor film that is the channel formation region can be reduced. At this time, an aluminum oxide film is provided in the periphery of the second oxide semiconductor film. Thus, oxygen released from the silicon oxynitride film containing excess oxygen is efficiently used in order to reduce the oxygen vacancies in the second oxide semiconductor film.

Next, a silicon oxynitride film was formed to a thickness of 300 nm by a plasma CVD method.

Then, parts of the silicon oxynitride film and the aluminum oxide film were etched to form openings reaching the conductive film 216a, the conductive film 216b, and the like.

Next, a 50-nm-thick titanium film, a 200-nm-thick aluminum film, and a 50-nm-thick titanium film were formed sequentially by a sputtering method.

Then, parts of the above-described titanium film, aluminum film, and titanium film were etched by photolithography to form a second wiring layer.

In the above-described manner, as Sample 1 and Sample 2, the semiconductor devices including the transistors including single crystal silicon and the transistors including an oxide semiconductor can be manufactured.

[Measurement]

The electrical characteristics of the transistors including single crystal silicon and the transistors including oxide semiconductors included in Sample 1 and Sample 2 were measured.

Note that Sample 1 and Sample 2 are different from each other only in the conditions of the two dehydrogenation treatment steps. Specifically, for Sample 1, heat treatment at 490° C. in a nitrogen atmosphere for 10 hours was performed as the first and second dehydrogenation treatment steps, whereas for Sample 2, heat treatment at 450° C. in a nitrogen atmosphere for 5 hours was performed as the first dehydrogenation treatment step and heat treatment at 450° C. in a nitrogen atmosphere for 1 hour was performed as the second dehydrogenation treatment step.

Figure 30:
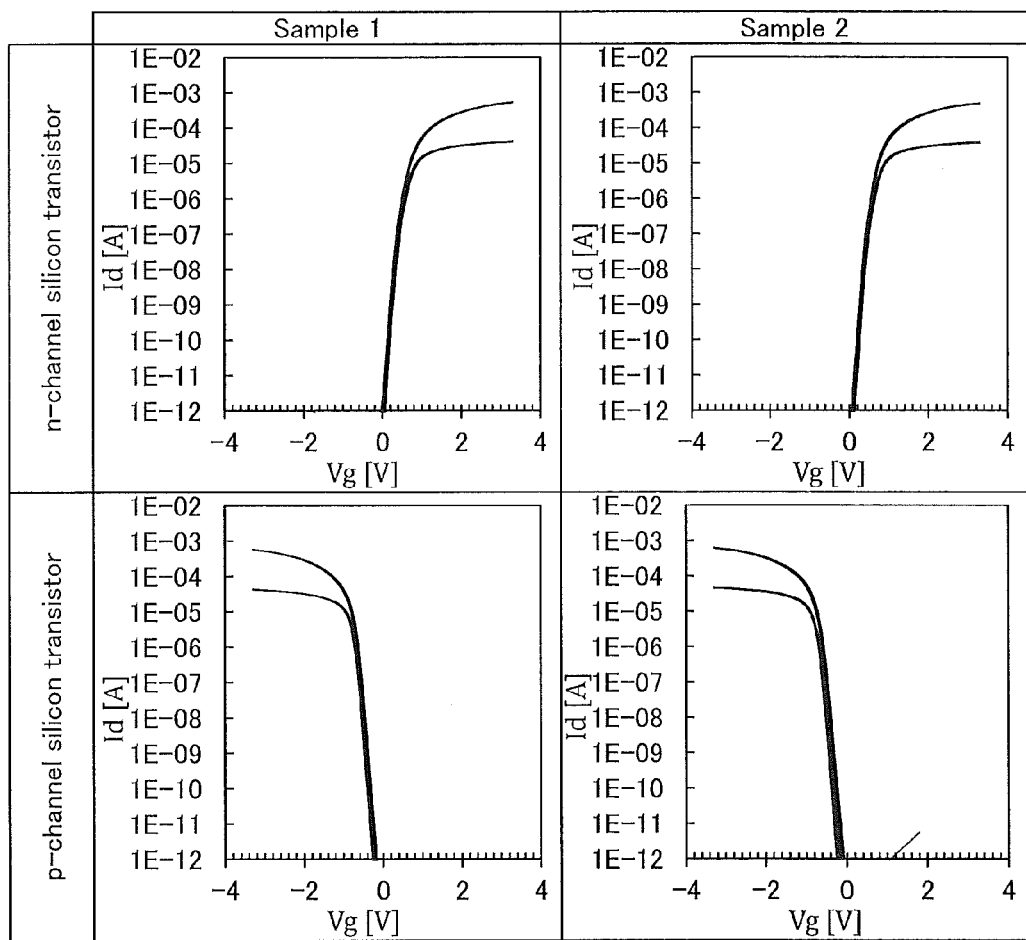
FIG. 30 shows the electrical characteristics of transistors.

FIG. 30 shows the $V_g$-$I_d$ characteristics of the transistors including single crystal silicon. The $V_g$-$I_d$ characteristics measurement of the n-channel transistors was performed by measuring drain current ($I_d$) when the drain voltage ($V_d$) was set to 0.1 V or 1.8 V and the gate voltage ($V_g$) was swept in the range of −1.8 V to 3.3 V at 0.1 V intervals. The $V_g$-$I_d$ characteristics measurement of the p-channel transistors was performed by measuring drain current ($I_d$) when the gate voltage ($V_g$) was swept in the range of 1.8 V to −3.3 V at 0.1 V intervals. Note that the design values of the channel length and the channel width of the transistors were 0.35 μm and 1.6 μm, respectively. The measurement was performed on 25 transistors uniformly arranged over a substrate with a size of 126.6 mm².

As shown in FIG. 30, there was little difference in the electrical characteristics of the transistors including single crystal silicon between Sample 1 and Sample 2. Specifically, the n-channel transistor in Sample 1 had a threshold voltage of 0.47 V and a subthreshold swing value (also referred to as an S value) of 67.0 mV/dec. The n-channel transistor in Sample 2 had a threshold voltage of 0.51 V and an S value of 67.6 mV/dec. The p-channel transistor in Sample 1 had a threshold voltage of −0.59 V and an S value of 69.0 mV/dec. The p-channel transistor in Sample 2 had a threshold voltage of −0.55 V and an S value of 71.6 mV/dec. Note that the threshold voltage was derived from the $V_g$-$I_d$ characteristics at a drain voltage of 1.8 V and the S values were derived from the $V_g$-$I_d$ characteristics at a drain voltage of 0.1 V.

The electrical characteristics of a transistor are presumed to be degraded when hydrogen terminating dangling bonds of single crystal silicon is released. As shown in FIG. 30, however, there is little difference in the electrical characteristics of the transistors including single crystal silicon between Sample 1 and Sample 2. This means that release of hydrogen terminating dangling bonds of single crystal silicon is less likely to occur in Sample 1 even under the conditions where release of hydrogen is more likely to occur than in Sample 2.

Figure 31A:
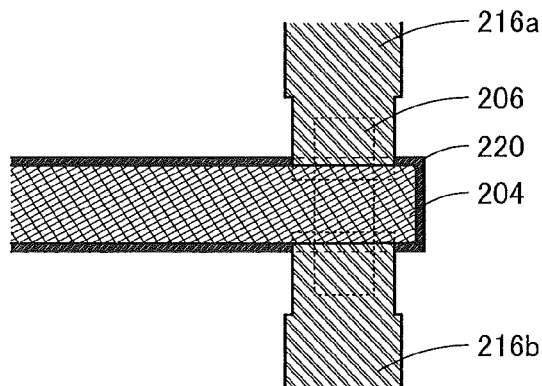
FIGS. 31A to 31C are top views each illustrating the structure of the periphery of a transistor.
Figure 31B:
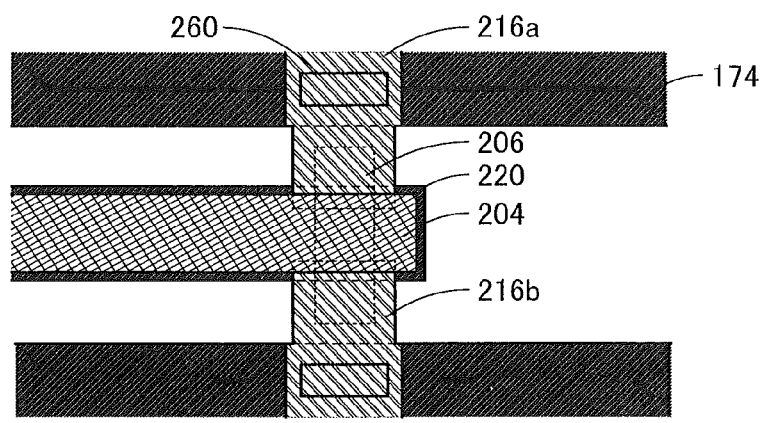
Figure 31C:
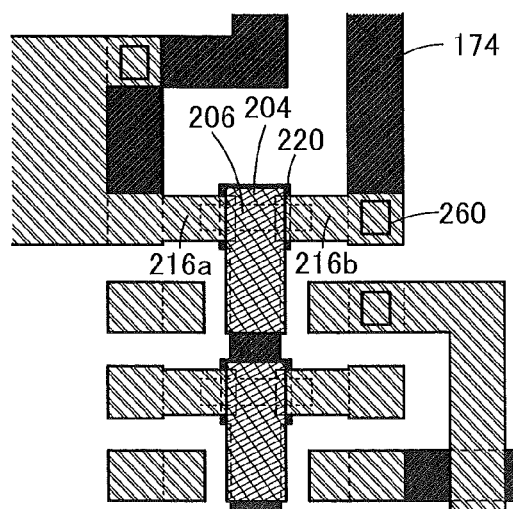

Next, the $V_g$-$I_d$ characteristics of the transistors including oxide semiconductors were measured. Note that the $V_g$-$I_d$ characteristics of three kinds of structures were measured in order to examine influence of the openings formed in the layers in the vicinity of the transistors. FIGS. 31A to 31C are top views each illustrating the transistor including an oxide semiconductor and the periphery thereof.

FIG. 31A illustrates a structure (Structure 1) that does not have an opening between the conductive film 174 and each of the conductive films 216a and 216b. FIG. 31B illustrates a structure (Structure 2) that has one opening 260 between the conductive film 174 and the conductive film 216a and one opening 260 between the conductive film 174 and the conductive film 216b. FIG. 31C illustrates a structure (Structure 3) that has one opening 260 between the conductive film 174 and the conductive film 216a, one opening 260 between the conductive film 174 and the conductive film 216b, and openings in peripheral wiring layers.

Figure 32:
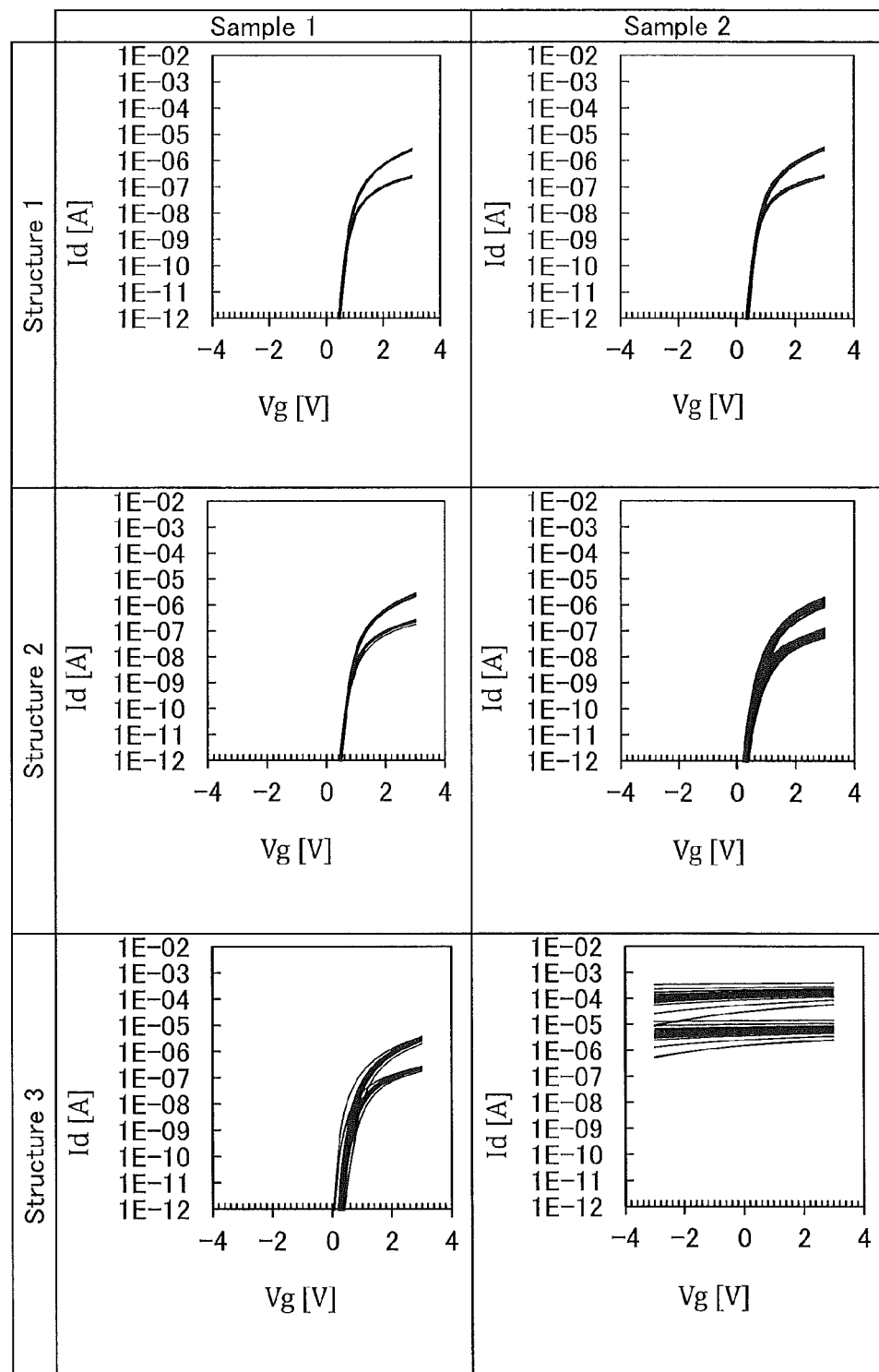
FIG. 32 shows the electrical characteristics of transistors.

FIG. 32 shows the $V_g$-$I_d$ characteristics of the transistors including oxide semiconductors in the structures illustrated in FIGS. 31A to 31C. Measurement of the $V_g$-$I_d$ characteristics was performed by measuring drain current ($I_d$) when the drain voltage ($V_d$) was set to 0.1 V or 2.7 V and the gate voltage ($V_g$) was swept in the range of −3 V to 3 V at 0.1 V intervals. Note that the design values of the channel length and the channel width of the transistors were 0.8 μm and 0.8 μm, respectively. The measurement was performed on 25 transistors uniformly arranged over a substrate with a size of 126.6 mm².

As shown in FIG. 32, there was little difference in the electrical characteristics of the transistors including oxide semiconductors between Sample 1 and Sample 2 in Structure 1. Specifically, Sample 1 had a shift value (also referred to as Shift) of 0.44 V and an S value of 90.7 mV/dec. Note that the shift value is a gate voltage at a drain current of $1\times10^{-12}$ A. Sample 2 had a shift value of 0.34 V and an S value of 98.4 mV/dec. Note that the shift values were derived from the $V_g$-$I_d$ characteristics at a drain voltage of 2.7 V and the S values were derived from the $V_g$-$I_d$ characteristics at a drain voltage of 0.1 V.

In addition, as shown in FIG. 32, there was a difference in the electrical characteristics of the transistors including oxide semiconductors in Sample 1 and Sample 2 in Structure 2. Specifically, Sample 1 had a shift value of 0.47 V and an S value of 95.3 mV/dec., whereas Sample 2 had a shift value of 0.28 V and an S value of 132.1 mV/dec. Sample 2 in Structure 2 had a larger S value than Sample 2 in Structure 1. In contrast, Sample 1 in Structure 2 had an S value substantially equal to that in Structure 1 and had favorable electrical characteristics also in Structure 2.

Moreover, as shown in FIG. 32, there was a significant difference in the electrical characteristics of the transistors including oxide semiconductors between Sample 1 and Sample 2 in Structure 3. Specifically, Sample 1 had a shift value of 0.24 V and an S value of 98.1 mV/dec., whereas Sample 2 did not have switching characteristics. The above results reveal that Sample 1 in Structure 3 had an S value substantially equal to those in Structure 1 and Structure 2 and had favorable electrical characteristics also in Structure 3.

The structure differences among Structure 1, Structure 2, and Structure 3 indicate that presence or absence of the openings in Sample 2 affects the electrical characteristics of the transistors including oxide semiconductors. Specifically, a larger number of openings in the periphery of the transistor degrades the electrical characteristics. In Sample 1, however, the electrical characteristics of the transistor are not changed by the presence or absence of the opening as much as those in Sample 2. This is probably because the dehydrogenation treatment was not sufficiently performed in Sample 2 as compared to Sample 1 and hydrogen moved to the transistor including an oxide semiconductor through the opening; in contrast, the dehydrogenation treatment was sufficiently performed in Sample 1 and degradation due to hydrogen was hardly caused. Note that slight degradation of the electrical characteristics is observed depending on the structure in Sample 1. In that case, further improvement in the electrical characteristics of Sample 1 can be expected by improving the conditions of dehydrogenation treatment.

Figure 33:
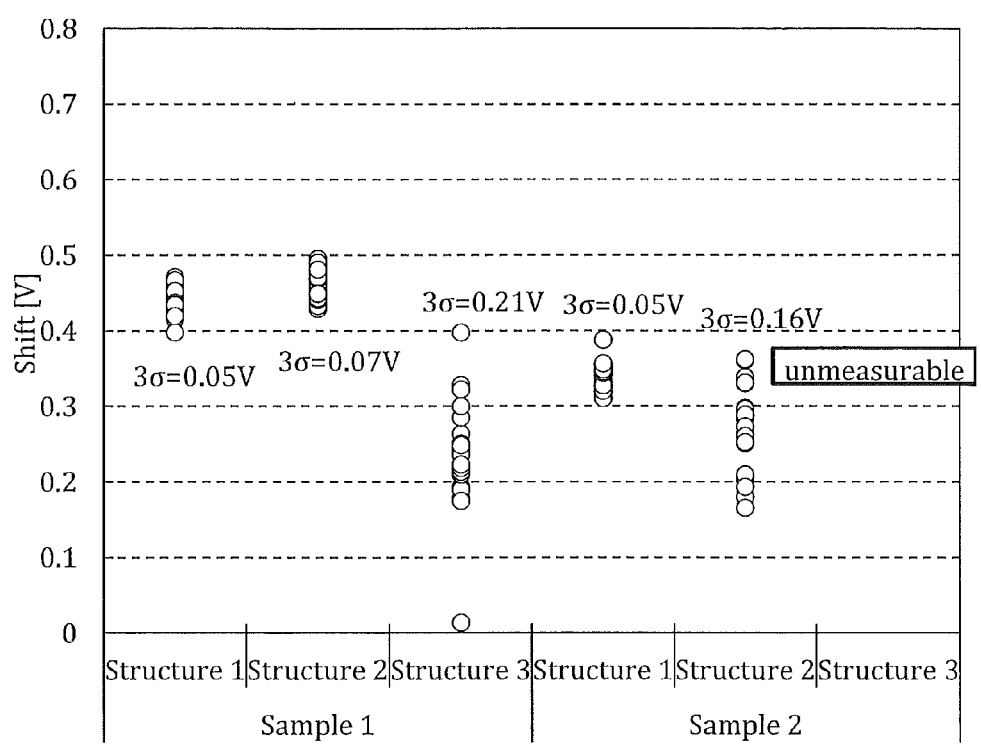
FIG. 33 shows variations in the electrical characteristics of transistors.

All shift values derived from the $V_g$-$I_d$ characteristics shown in FIG. 32 are plotted in FIG. 33. Sample 1 had a 3σ of the shift value of 0.05 V in Structure 1, 0.07 V in Structure 2, and 0.21 V in Structure 3. In contrast, Sample 2 had a 3σ of the shift value of 0.05 V in Structure 1 and 0.16 V in Structure 2, and the 3σ of the shift value in Structure 3 was unmeasurable.

The above results show that Sample 1 has smaller variation in the $V_g$-$I_d$ characteristics due to the structure differences than Sample 2.

Structure 2 and Structure 3 have more openings than Structure 1 and are closer to the structure of a highly integrated semiconductor device. Thus, in order to manufacture a highly integrated semiconductor device with high yield, it is probably important to achieve excellent electrical characteristics even in a structure having many openings like Structure 2 and Structure 3.

This example reveals that an improvement in the conditions of dehydrogenation treatment can reduce degradation of the electrical characteristics of the transistors including an oxide semiconductor that have a variety of structures without changes in the electrical characteristics of the transistors including single crystal silicon. This example also indicates that a further improvement of conditions of dehydrogenation treatment can further suppress degradation of the electrical characteristics of the transistors including oxide semiconductors.

Example 3

In this example, it was examined of how electrical characteristics of transistors including oxide semiconductors change depending on a difference in dehydrogenation treatment and a difference in the thickness of a silicon oxynitride film containing excess oxygen.
[Samples]
Methods for manufacturing Sample 3 and Sample 4 are described below.

Sample 3 was manufactured under conditions similar to those for Sample 1 described in Example 2 except that the thickness of the second oxide semiconductor film was 15 nm. The only difference between Sample 3 and Sample 1 is the thickness of the second oxide semiconductor film; therefore, the description of Sample 1 is referred to for the other conditions. In other words, dehydrogenation treatment for Sample 3 was performed under improved conditions.

Sample 4 was manufactured under conditions similar to those for Sample 2 except that the thickness of the silicon oxynitride film containing excess oxygen was 300 nm. The only difference between Sample 4 and Sample 2 is the thickness of the silicon oxynitride film containing excess oxygen; therefore, the description of Sample 2 is referred to for the other conditions. Note that the thickness of the silicon oxynitride film containing excess oxygen in Sample 3 is 100 nm.
[Measurement]
Next, the $V_g$-$I_d$ characteristics of Sample 3 and Sample 4 were measured. The $V_g$-$I_d$ characteristics measurement was performed on the samples having Structure 1 described in Example 2. The $V_g$-$I_d$ characteristics measurement was performed by measuring drain current ($I_d$) when the drain voltage ($V_d$) was set to 1.8 V and the gate voltage ($V_g$) was swept in the range of −3 V to 3 V at 0.1 V intervals at room temperature (25° C.) and 85° C. The measurement was performed a plurality of times by changing voltage ($V_{bg}$) applied to the conductive film 220 that was the second gate electrode in the range of 0 V to −20 V. Note that the design values of the channel length and the channel width of the transistors were 0.8 μm and 0.8 μm, respectively. The measurement was performed on 13 transistors uniformly arranged over a substrate with a size of 126.6 mm².

Figure 34A:
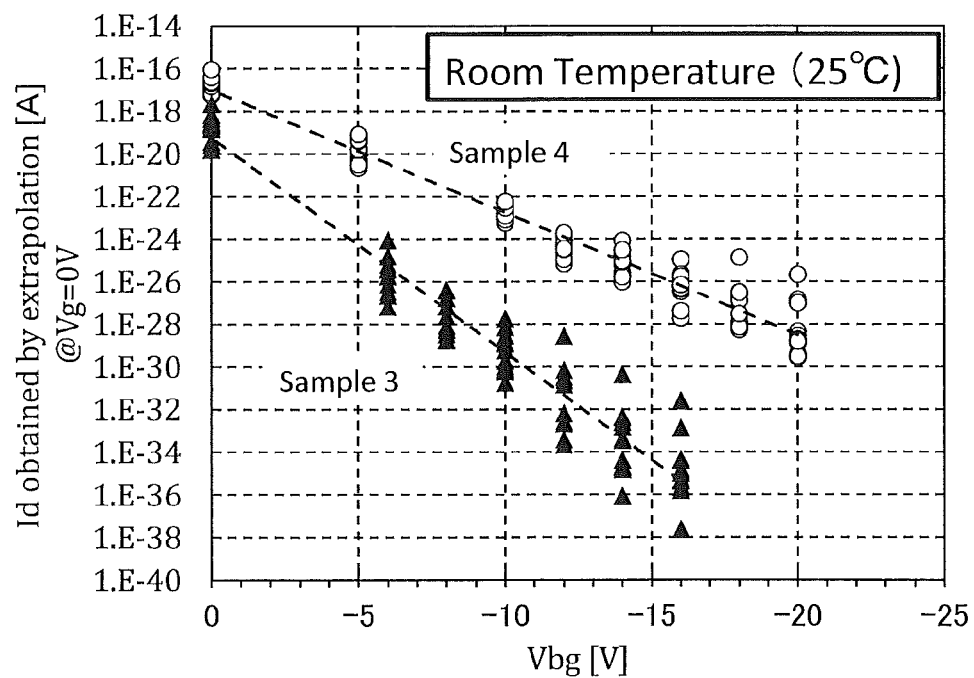
FIGS. 34A and 34B each show a relationship between voltage applied to a second gate electrode and ideal drain current in a transistor at a voltage of a first gate electrode of 0 V.
Figure 34B:
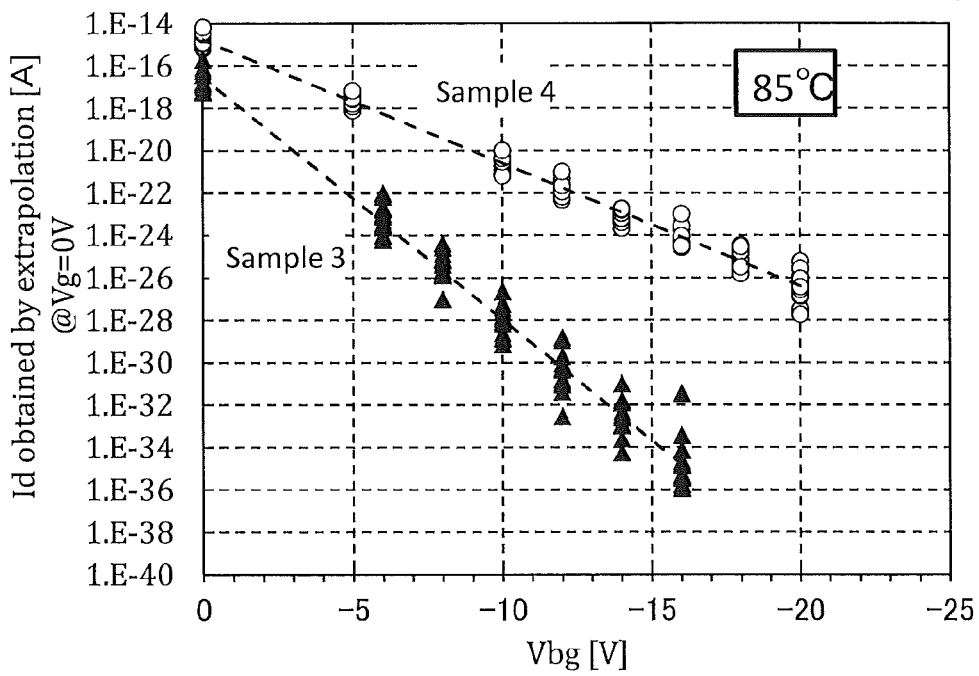

Then, S values were calculated on the basis of the obtained $V_g$-$I_d$ characteristics, and drain current at a gate voltage of 0 V was obtained by extrapolation. FIGS. 34A and 34B show the results. FIG. 34A shows the relationship between voltage applied to the conductive film 220 at room temperature and drain current at a gate voltage of 0 V. FIG. 34B shows the relationship between voltage applied to the conductive film 220 at 85° C. and drain current at a gate voltage of 0 V.

As shown in FIGS. 34A and 34B, the drain current of Sample 3, for which the dehydrogenation treatment was performed under the improved conditions, was overall lower than that of Sample 4. In addition, a small thickness of the silicon oxynitride film containing excess oxygen is highly effective in reducing the drain current with respect to the voltage applied to the conductive film 220 functioning as the second gate electrode.

In addition, FIGS. 34A and 34B indicate that an improvement in the conditions of the dehydrogenation treatment can reduce drain current in a state where voltage is not applied to a gate electrode to approximately $1\times10^{-22}$ A to $1\times10^{-35}$ A. The drain current is sometimes used to mean off-state current. Thus, it is important to improve conditions of dehydrogenation treatment in the manufacture of a semiconductor device utilizing extremely small off-state current of a transistor including an oxide semiconductor.

Note that drain current obtained by extrapolation is different from actual drain current in some cases. For example, in the case where hydrogen enters a transistor including an oxide semiconductor, drain current obtained by extrapolation is lower than actual drain current in some cases. This indicates that a drastic reduction in hydrogen that might enter an oxide semiconductor is important in order to improve the electrical characteristics of a transistor including an oxide semiconductor.

Example 4

In this example, off-state current of an ideal transistor with no leakage current of a gate insulating film, no trap states, and no parasitic resistance was calculated and evaluated.

First, a structure of the transistor is described.

Figure 35:
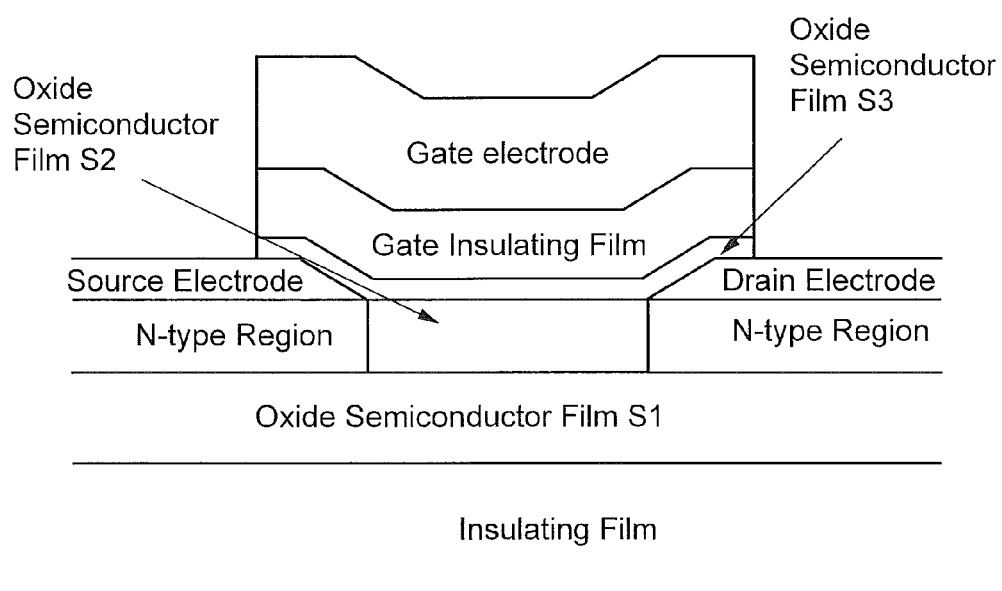
FIG. 35 is a schematic cross-sectional view of a transistor in one example.

FIG. 35 is a cross-sectional view of the transistor in the channel length direction. N-type regions (also referred to as low-resistance regions) in contact with a source electrode and a drain electrode are provided in an entire region of an oxide semiconductor film S2 overlapped with the source electrode and the drain electrode. The transistor had a channel length L of 0.8 μm, a channel width W of 1 nm, and a width Lov of a region where a gate electrode overlaps the source electrode or the drain electrode of 0.2 μm.

Next, calculation conditions are described.

The calculation was performed under conditions shown in Table 2, using Sentaurus Device produced by Synopsys, Inc.

TABLE 2

| Structure | | |
|---|---|---|
| | L | 0.8 μm |
| | Lov | 0.2 μm |
| | W | 1 nm |
| GI | Relative dielectric constant | 4.1 |
| | Thickness | 20 nm |
| S3 | Composition ratio | IGZO (132) |
| | Electron affinity | 4.4 eV |
| | Eg | 3.6 eV |
| | Relative dielectric constant | 15 |
| | Donor density | 6.60E−9 cm$^{-3}$ |
| | Electron mobility | 0.1 cm$^2$/Vs |
| | Hole mobility | 0.01 cm$^2$/Vs |
| | Nc | 5.00E+18 cm$^{-3}$ |
| | Nv | 5.00E+18 cm$^{-3}$ |
| | Thickness | 5 nm |
| S2 | Composition ratio | IGZO (111)   IGZO(312) |
| | Electron affinity | 4.6 eV |
| | Eg | 3.2 eV   2.8 eV |
| | Relative dielectric constant | 15 |
| | Donor density of channel portion | 6.60E−9 cm$^{-3}$ |
| | Donor density of poion under S/D electrode | 5.00E+18 cm$^{-3}$ |
| | Electron mobility | 10 cm$^2$/Vs   20 cm$^2$/Vs |
| | Hole mobility | 0.01 cm$^2$/Vs |
| | Nc | 5.00E+18 cm$^{-3}$ |
| | Nv | 5.00E+18 cm$^{-3}$ |
| | Thickness | 15 nm |
| S1 | Composition ratio | IGZO (132) |
| | Thickness | 20 nm |
| Insulating film | Relative dielectric constant | 4.1 |
| | Thickness | 230 nm |
| GE | Work function | 5 eV |
| | Thickness | 165 nm |
| S/D | Work function | 4.6 eV |
| | Thickness | 100 nm |

* IGZO (111) . . . oxide target with In:Ga:Zn = 1:1:1 (composition ratio)
* IGZO (132) . . . oxide target with In:Ga:Zn = 1:3:2 (composition ratio)
* IGZO (312) . . . oxide target with In:Ga:Zn = 3:1:2 (composition ratio)

In Table 2, GI represents a gate insulating film; S3, an oxide film; S2, an oxide semiconductor film; S1, an oxide semiconductor film; GE, a gate electrode; and S/D, a source electrode and a drain electrode. Note that G1 corresponds to the gate insulating film 212 in Embodiment 1; S3, the oxide semiconductor film 206c in Embodiment 1; S2, the oxide semiconductor film 206b in Embodiment 1; S1, the oxide semiconductor film 206a in Embodiment 1; GE, the first conductive film 204 in Embodiment 1; S/D, the conductive films 216a and 216b in Embodiment 1; and the insulating film, the insulating film 172 in Embodiment 1.

Figure 36:
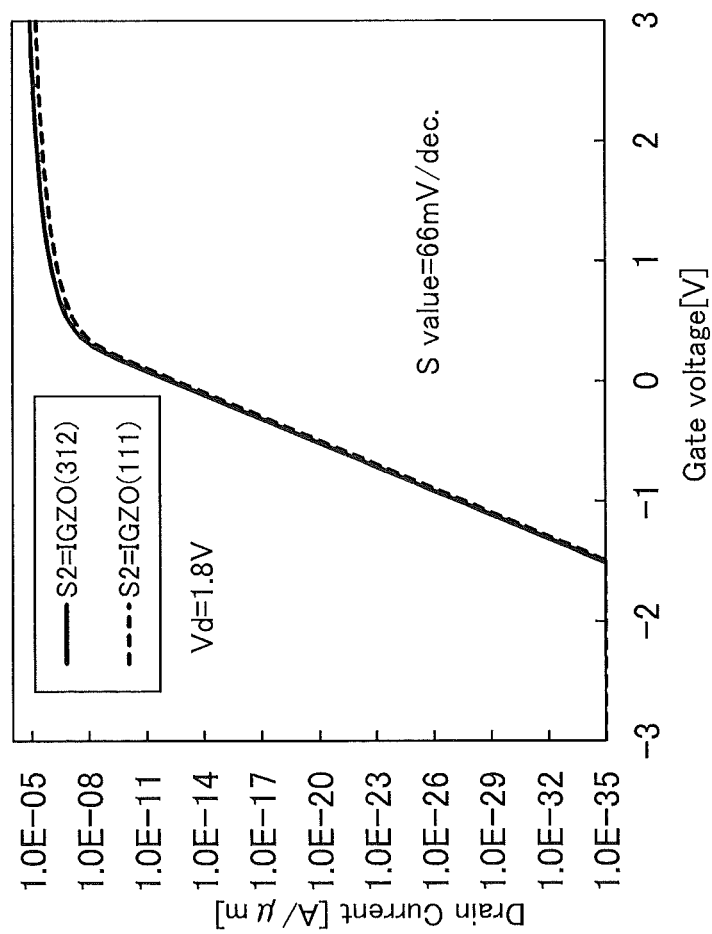
FIG. 36 shows the $V_g$-$I_d$ characteristics of an ideal transistor.

FIG. 36 shows $V_g$-$I_d$ characteristics and an S value at a drain voltage $V_d$ of 1.8 V.

As shown in FIG. 36, the off-state current of both of the ideal transistor using IGZO (111) for the oxide semiconductor film S2 and the ideal transistor using IGZO (312) for the oxide semiconductor film S2 was reduced to approximately $1\times10^{-35}$ A/μm that is a calculable limit value. In addition, the S value of the transistors was able to be estimated at 66 mV/dec.

Example 5

In this example, the electrical characteristics of a transistor of one embodiment of the present invention are described.

[Sample]

Sample 5 used for measurement is described below.

For Sample 5, a transistor including an oxide semiconductor was manufactured over a single crystal substrate through steps similar to those after the step of forming the silicon oxynitride film containing excess oxygen in the method for manufacturing Sample 1 and Sample 2 described in Example 2.

The method for manufacturing Sample 5 is different from the manufacturing method described in Example 2 in that the thickness of a silicon oxynitride film containing excess oxygen is 300 nm, the thickness of a second oxide semiconductor film is 15 nm, the thickness of a silicon oxynitride film functioning as a gate insulating film is 10 nm, and the thickness of an aluminum oxide film is 70 nm.

[Measurement of Off-State Current]

Next, a method for measuring off-state current of Sample 5 manufactured in the above manner and the measurement results are described with reference to FIG. 37, FIGS. 38A and 38B, FIG. 39, and FIGS. 40A and 40B.

[Measurement System]

Figure 37:
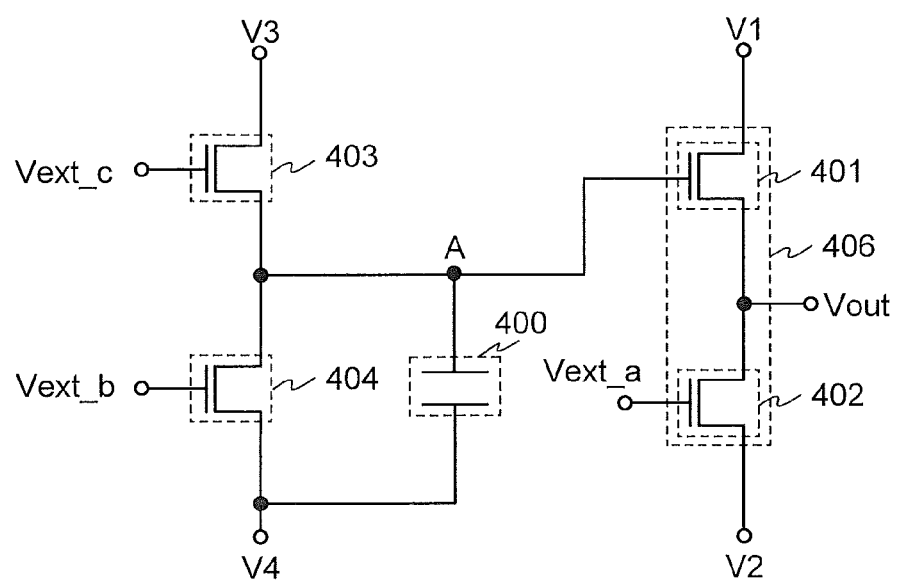
FIG. 37 is a circuit diagram illustrating an example of a measurement system.

A measurement system shown in FIG. 37 includes a capacitor 400, a transistor 401, a transistor 402, a transistor 403, and a transistor 404. Here, the transistor 403 is a transistor for injection of charge and the transistor 404 is a transistor for evaluation of leakage current. The transistor 401 and the transistor 402 form an output circuit 406. A point where a source terminal (or drain terminal) of the transistor 403, a drain terminal (or source terminal) of the transistor 404, a first terminal of the capacitor 400, and a gate terminal of the transistor 401 were connected to each other is referred to as a node A.

When the transistor for injection of charge and the transistor for evaluation are separately provided, the transistor for evaluation can be always kept in an off state at the time of injection of charge. In the case where the transistor for injection of charge is not provided, the transistor for evaluation needs to be turned on once at the time of injection of charge; accordingly, it takes longer time for measurement when an element takes time to be in a steady state of an off state from an on state. In addition, the transistor for evaluation does not need to be turned on once, so that there is no influence of change in the potential of the node A caused by flow of part of the charge in a channel formation region of the transistor into the node A.

The channel width W of the transistor for evaluation is preferably larger than that of the transistor for injection of charge. When the channel width W of the transistor for evaluation is larger than that of the transistor for injection of charge, leakage current other than leakage current of the transistor for evaluation can be relatively reduced. As a result, the leakage current of the transistor for evaluation can be measured with high accuracy.

In the measurement system shown in FIG. 37, the source terminal (or drain terminal) of the transistor 403, the drain terminal (or source terminal) of the transistor 404, and the first terminal of the capacitor 400 are connected to the gate terminal of the transistor 401. A second terminal of the capacitor 400 and a source terminal (or drain terminal) of the transistor 404 are connected to each other. A drain terminal (or source terminal) of the transistor 401 is connected to a power source, a source terminal (or drain terminal) of the transistor 402 is connected to a power source, and a drain terminal (or source terminal) of the transistor 403 is connected to a power source.

In the measurement system shown in FIG. 37, a potential V3 is applied from the power source to the drain terminal (or source terminal) of the transistor 403, and a potential V4 is applied from the power source to the source terminal (or drain terminal) of the transistor 404. A potential V1 is applied from the power source to the drain terminal (or source terminal) of the transistor 401, and a potential V2 is applied from the power source to the source terminal (or drain terminal) of the transistor 402. An output potential $V_{out}$ is output from a terminal corresponding to an output terminal of the output circuit 406 to which a source terminal (or drain terminal) of the transistor 401 and a drain terminal (or source terminal) of the transistor 402 are connected.

In the above structure, a potential $V_{ext\_a}$ for adjusting the output circuit 406 is applied to a gate terminal of the transistor 402, a potential $V_{ext\_c}$ for controlling the on/off of the transistor 403 is applied to a gate terminal of the transistor 403, a potential $V_{ext\_b}$ for controlling a state of the transistor for evaluation is applied to a gate terminal of the transistor 404.

Note that in FIG. 37, the capacitor 400 is not necessarily provided. In that case, the gate terminal of the transistor 401, the source terminal (or drain terminal) of the transistor 403, and the drain terminal (or source terminal) of the transistor 404 are connected to each other at the node A.

[Method for Measuring Current]

Figure 38A:
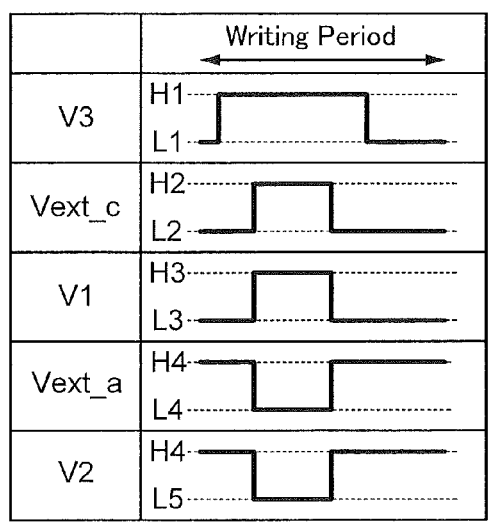
FIGS. 38A and 38B are diagrams (timing charts) showing potentials relating to operation of a measurement system.
Figure 38B:
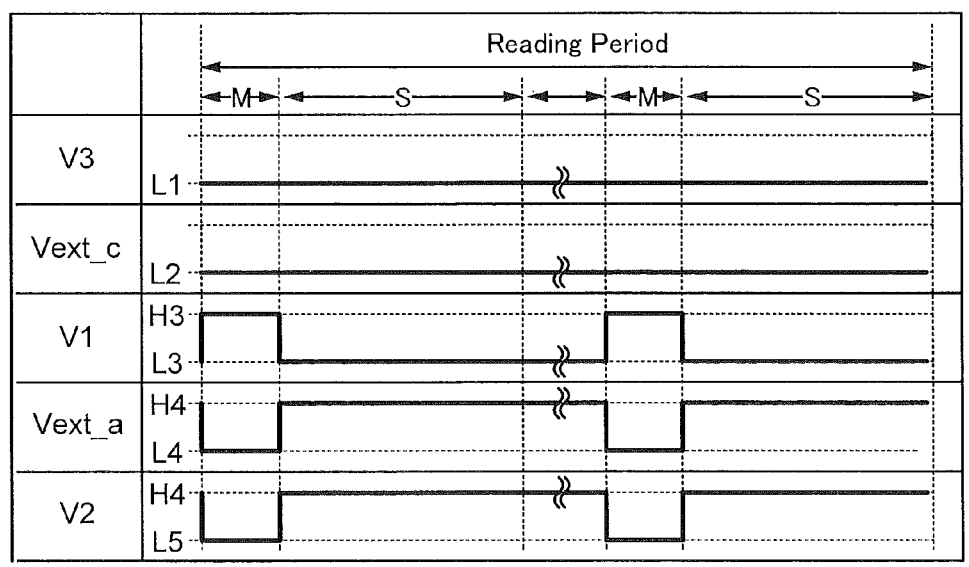

Next, an example of a method for measuring current using the above-described measurement system is described with reference to FIGS. 38A and 38B.

First, a writing period in which a potential difference is applied to measure the off-state current is briefly described with reference to FIG. 38A.

In the writing period, the potential V3 was input to the drain terminal (or source terminal) of the transistor 403 and the potential $V_{ext\_c}$ for turning on the transistor 403 was then input to the gate terminal of the transistor 403, so that the potential V3 was applied to the node A connected to the drain terminal (or source terminal) of the transistor 404. The potential $V_{ext\_a}$ for turning on the transistor 402 was input, whereby the transistor 402 was turned on. The potential $V_{ext\_b}$ for turning off the transistor 404 was input, whereby the transistor 404 was turned off.

Here, the potential V3 was set to a high potential (H1) and the potential $V_{ext\_c}$ was set to a high potential (H2). The potential V1 was set to a high potential (H3). The potential $V_{ext\_a}$ was set to a low potential (L4), the potential V2 was set to a low potential (L5), the potential $V_{ext\_b}$ was set to a low potential (L2), and the potential V4 was set to Vss.

Then, the potential $V_{ext\_a}$ for turning off the transistor 402 was input, whereby the transistor 402 was turned off. The potential V2 was set to a high potential (H4) and the potential V1 was set to a low potential (L3). Here, the potential V2 was the same potential as the potential V1. Next, the potential V3 was set to a low potential (L). The potential $V_{ext\_c}$ for turning off the transistor 403 was input to the gate terminal of the transistor 403, whereby the transistor 403 was turned off.

Here, the potential $V_{ext\_c}$ was set to a low potential (L2), the potential $V_{ext\_a}$ was set to a high potential (H4), the potential V3 was set to a low potential (L1), the potential V1 was set to a low potential (L3), and the potential V2 was set to a high potential (H4). The potential $V_{ext\_b}$ was set to a low potential (L2) and the potential V4 was set to Vss.

Thus, the writing period was completed. In a state where the writing period was completed, the transistor 404 was off but a potential difference was generated between the node A and the source terminal (drain terminal) of the transistor 404. Thus, a slight amount of current flows in the transistor 404. That is, the off-state current (i.e., leakage current) flows.

Next, a reading period was started. In the reading period, the amount of change in the potential of the node A due to a change in the amount of electric charge retained in the node A was measured. The operation in the reading period is described with reference to FIG. 38B.

When the reading period was started, the amount of electric charge retained in the capacitor connected to the node A changes over time, and the potential of the node A thus changed. This means that the potential of the input terminal of the output circuit 406 changed. Consequently, the potential of the output terminal of the output circuit 406 also changed over time.

Note that in the reading period, it is preferable that a measurement period M for measuring the amount of change in the potential of the node A and a storage period S for storing electric charge in the node A be performed repeatedly. When the measurement of the amount of change in the potential of the node A and the storage of electric charge of the node A are performed repeatedly, it can be confirmed that the measured value of voltage is a value in a steady state. In other words, the transient current (a current component that decreases over time after the measurement starts) can be removed from a current $I_A$ flowing through the node A. Consequently, the leakage current can be measured with higher accuracy.

When the relationship between VA denoting the potential of the node A, and the output potential $V_{out}$ is obtained in advance, the potential $V_A$ can be obtained from the output potential $V_{out}$. In general, $V_A$ denoting the potential of the node A can be measured as a function of the output potential $V_{out}$ and expressed by the following equation.

$$V_A = F(Vout) \quad \text{[Equation 1]}$$

Electric charge $Q_A$ denoting the electric charge in the capacitor connected to the node A can be expressed by the following equation using the potential $V_A$, $C_A$ denoting the capacitance of the capacitor connected to the node A, and a constant (const). Here, the capacitance $C_A$ of the capacitor connected to the node A is the sum of the capacitance of the capacitor 400 and other capacitance (e.g., the input capacitance of the output circuit 406).

$$Q_A = C_A V_A + \text{const} \quad \text{[Equation 2]}$$

Current $I_A$ of the node A is the time derivatives of electric charge flowing to the node A (or electric charge flowing from the node A), so that the current $I_A$ of the node A is expressed by the following equation.

$$I_A \equiv \frac{\Delta Q_A}{\Delta t} = \frac{C_A \cdot \Delta F(Vout)}{\Delta t} \quad \text{[Equation 3]}$$

As described above, the current $I_A$ flowing through the node A can be obtained from the capacitance $C_A$ connected to the node A, the output potential $V_{out}$ of the output circuit 406, and change over time $\Delta t$.

Note that the current $I_A$ is the sum of current $I_{dev}$ flowing in the transistor 404, and current Leak that is current other than the current $I_{dev}$, so that in order to obtain the current $I_{dev}$ with high accuracy, the measurement is preferably carried out with a measurement system in which the current $I_{leak}$ is sufficiently smaller than the current $I_{dev}$. Alternatively, the accuracy in obtaining the current $I_{dev}$ may be increased by estimating the current $I_{leak}$ and then subtracting it from the current $I_A$.

Here, in the measurement period M, the potential V2 was set to a low potential (L5) and the potential $V_{ext\_a}$ was set to a low potential (L4), whereby the transistor 402 was turned on. Note that in order to turn on the transistor 402, the low potential (L4) of the potential $V_{ext\_a}$ was higher than the low potential (L5) of the potential V2. The potential V1 was set to a high potential (H3). The potential $V_{ext\_c}$ was set to a low potential (L2), and the potential V3 was set to a low potential (L1). The potential $V_{ext\_b}$ was set to a low potential (L2) and the potential V4 was set to Vss.

In the storage period S, the potential V2 is set to a high potential (H4) and the potential $V_{ext\_a}$ is set to a high potential (H4), whereby the transistor 402 is turned off. The potential V1 is set to a low potential (L3). Note that the potential V1, the potential V2, and the potential $V_{ext\_a}$ were the same potentials. The potential $V_{ext\_c}$ is set to a low potential (L2) and the potential V3 is set to a low potential (L1). The potential $V_{ext\_b}$ is set to a low potential (L2) and the potential V4 is set to Vss.

Minute current flowing through the transistor 404 can be measured by the above-described method.

In this example, the transistors 401 and 402 each has a channel length L of 3 μm and a channel width W of 100 μm, the transistor 403 has a channel length L of 10 μm and a channel width W of 10 μm, and the transistor 404 has a channel length L of 0.8 μm and a channel width W of 10000 μm. Note that each transistor was manufactured under the same condition as Sample 1.

Next, a measurement sequence is described. Two types of measurement sequences were used as the measurement sequence.

In the first sequence, a cycle in which the measurement temperature was 125° C., Δt used in calculation of current I flowing in the transistor was 1 hour, and the writing period was provided per Δt was repeated 10 times. Then, a cycle in which the measurement temperature was 85° C., Δt was 6 hours, and the writing period was provided per Δt was repeated 4 times.

In the second sequence, a cycle in which the measurement temperature was 150° C., Δt was 1 hour, and the writing period was provided per Δt was repeated 10 times. Then, a cycle in which the measurement temperature was 125° C., Δt was 1 hour, and the writing period was provided per Δt was repeated 10 times. After that, a cycle in which the measurement temperature was 85° C., Δt was 6 hours, and the writing period was provided per Δt was repeated 4 times. Then, a cycle in which the measurement temperature was 85° C., Δt was 12 hours, and the writing period was provided per Δt was repeated 3 times. Then, a cycle in which the measurement temperature was 60° C., Δt was 60 hours, and the writing period was provided per Δt was performed once.

Note that in this example, in the writing period, the high potential (H1) of the potential V3 was set to 2 V and the low potential (L1) of the potential V3 was set to 1 V. The high potential (H2) of the potential $V_{ext\_c}$ was set to 5 V and the low potential (L2) thereof was set to −3 V. The high potential (H3) of the potential V1 was set to 3 V and the low potential (L3) thereof was set to 1.5 V. The high potential (H4) of the potential $V_{ext\_a}$ was set to 1.5 V and the low potential (L4) thereof was set to −1 V. The high potential (H4) of the potential V2 was set to 1.5 V and the low potential (L5) thereof was set to −2 V. The potential $V_{ext\_b}$ was set to −3 V and the transistor 404 was thus turned off, and the potential V4 was set to 1 V. Here, a voltage of 2 V was applied to the node A.

In a reading period, a measurement period M for 10 seconds and a storage period S for 290 seconds were collectively regarded as one set, and the reading operation was repeatedly performed, so that the output potential $V_{out}$ was measured.

In this example, in the reading period, the high potential (H1) of the potential V1 was set to 5 V and the low potential (L1) thereof was set to 1.5 V. The high potential (H4) of the potential $V_{ext\_a}$ was set to 1.5 V and the low potential (L4) thereof was set to −1 V. The high potential (H4) of the potential V2 was set to 1.5 V and the low potential (L5) thereof was set to −2 V. The low potential (L2) of the potential V3 was set to 1 V. The low potential (L2) of the potential $V_{ext\_c}$ was set to −3 V. The potential $V_{ext\_b}$ was set to −3 V and the transistor 404 was thus turned off, and the potential V4 was set to 1 V.

Figure 39:
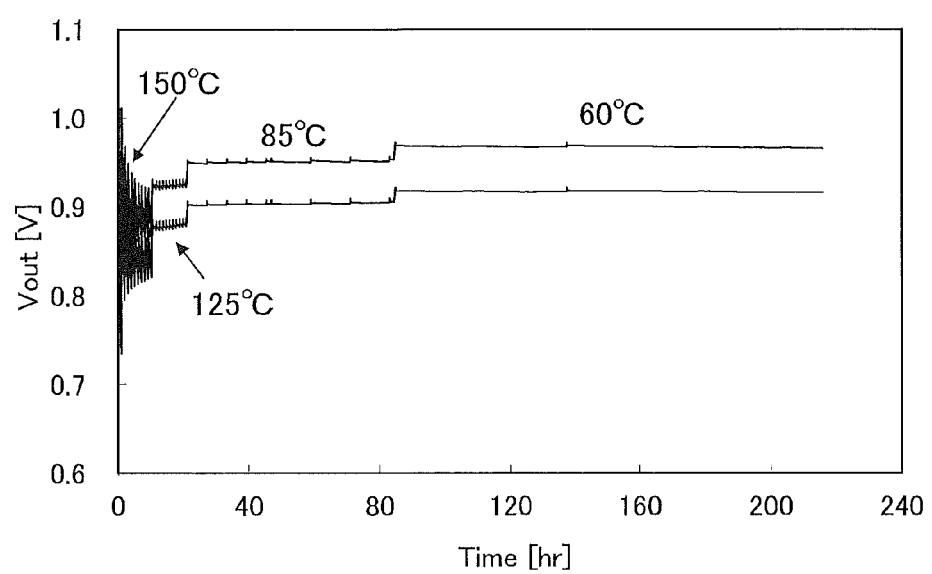
FIG. 39 shows the results of measurement of off-state current.

FIG. 39 shows, as an example of the measurement data, the relationship between the elapsed time and the output voltage $V_{out}$ of the output circuit 406 in the second measurement sequence. As shown in FIG. 39, the potential changes as time passes.

Figure 40A:
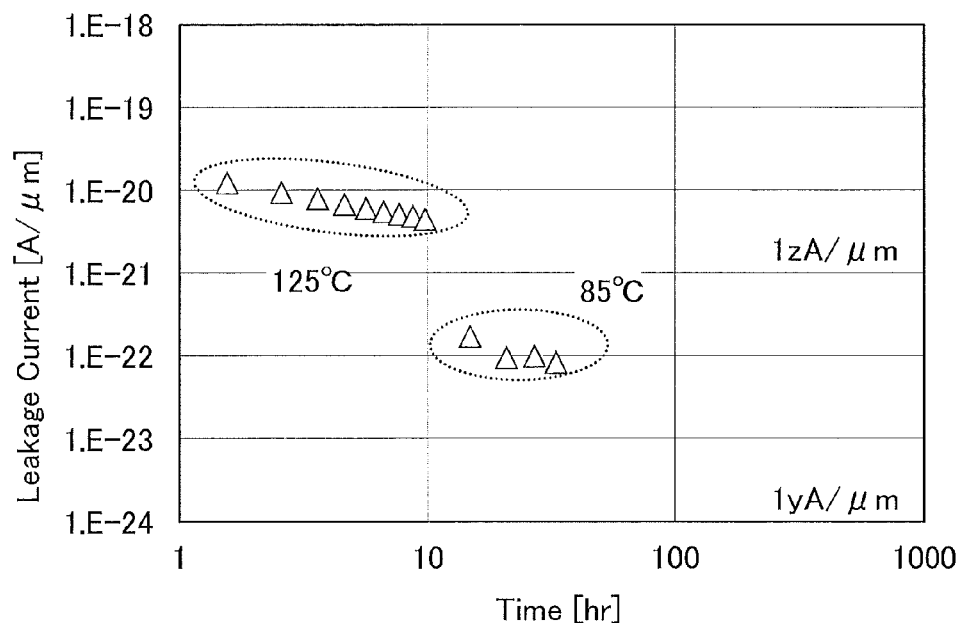
FIGS. 40A and 40B each show the results of measurement of off-state current.
Figure 40B:
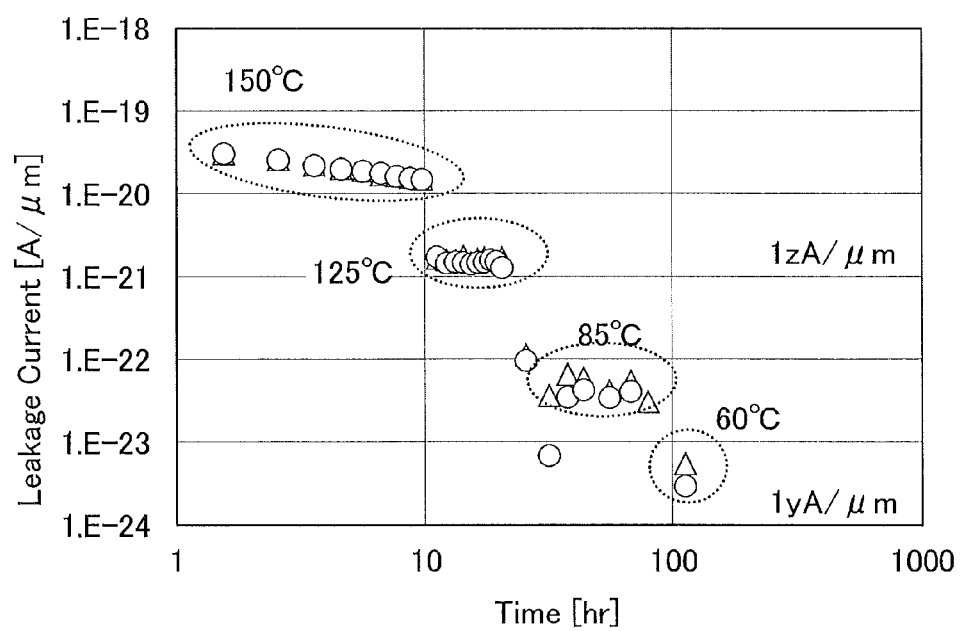

FIGS. 40A and 40B show leakage current calculated by the measurement of the output potential $V_{out}$. FIG. 40A shows measurement results of the first measurement sequence, and FIG. 40B shows measurement results of the second measurement sequence. Note that FIGS. 40A and 40B show the relationship between the elapsed time and the leakage current flowing between the source electrode and the drain electrode.

As shown in FIGS. 40A and 40B, the value of the leakage current tends to gradually decrease shortly after the start of the measurement and to converge on a specific value. In the condition having the highest measurement temperature, the value of the lowest measured current was regarded as the leakage current for the temperature.

As shown in FIG. 40A, the leakage current was lower than $5 \times 10^{-21}$ A/μm (5 zA/μm) at a measurement temperature of 125° C., and the leakage current was lower than $1 \times 10^{-22}$ A/μm (100 yA (yoctoampere)/μm) at a measurement temperature of 85° C. Note that 1 yA equals $10^{-24}$ A.

As shown in FIG. 40B, the leakage current at a measurement temperature of 150° C. was lower than $1.5 \times 10^{-20}$ A/μm (15 zA (zeptoampere)/μm), the leakage current at a measurement temperature of 125° C. was lower than $2 \times 10^{-21}$ A/μm (2 zA/μm), the leakage current at a measurement temperature of 85° C. was lower than $5 \times 10^{-23}$ A/μm (50 yA/μm), and the leakage current at a measurement temperature of 60° C. was lower than $6 \times 10^{-24}$ A/μm (6 yA/μm). Note that 1 zA equals $10^{-21}$ A.

It was found from the above results that influence of a transitional change in current can be suppressed effectively and original leakage current of the transistor can be measured by increasing the measurement temperature at the start of the measurement.

As described above, this example reveals that the off-state current is sufficiently small in a transistor including a highly purified oxide semiconductor whose oxygen vacancies are reduced.

Figure 41:
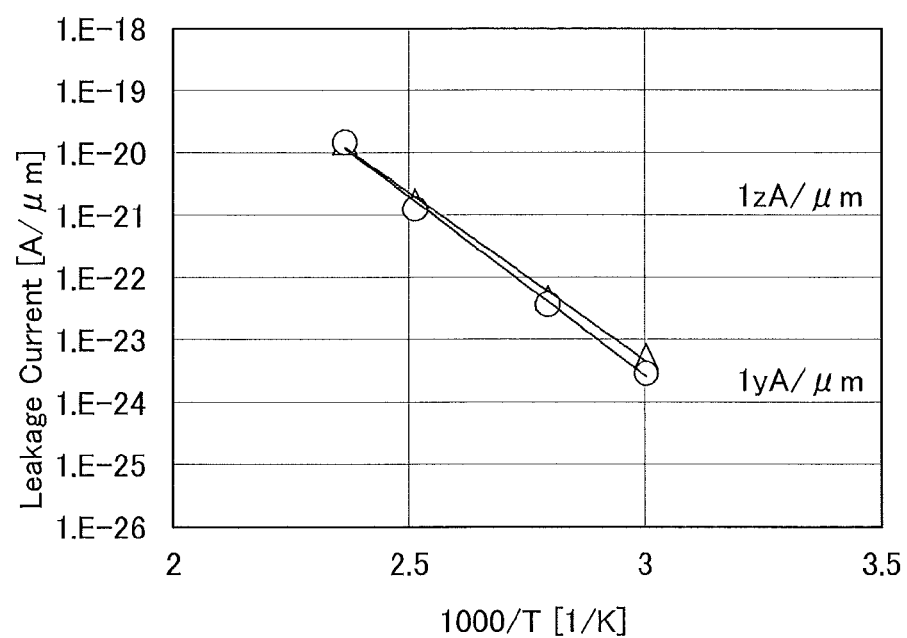
FIG. 41 is an Arrhenius plot diagram for showing off-state current.

FIG. 41 shows an Arrhenius plot of the leakage current shown in FIG. 40B. As shown in FIG. 41, the temperature dependence of the leakage current measured above is expressed as a straight line and the activation energy was substantially constant; thus, the measured values were found to be reasonable.

Example 6

In this example, off-state current of Sample 6 manufactured by a method similar to that of Sample 1 in Example 2 was measured.

The off-state current was measured by a method similar to that described in Example 5. The first measurement sequence was used.

Figure 42A:
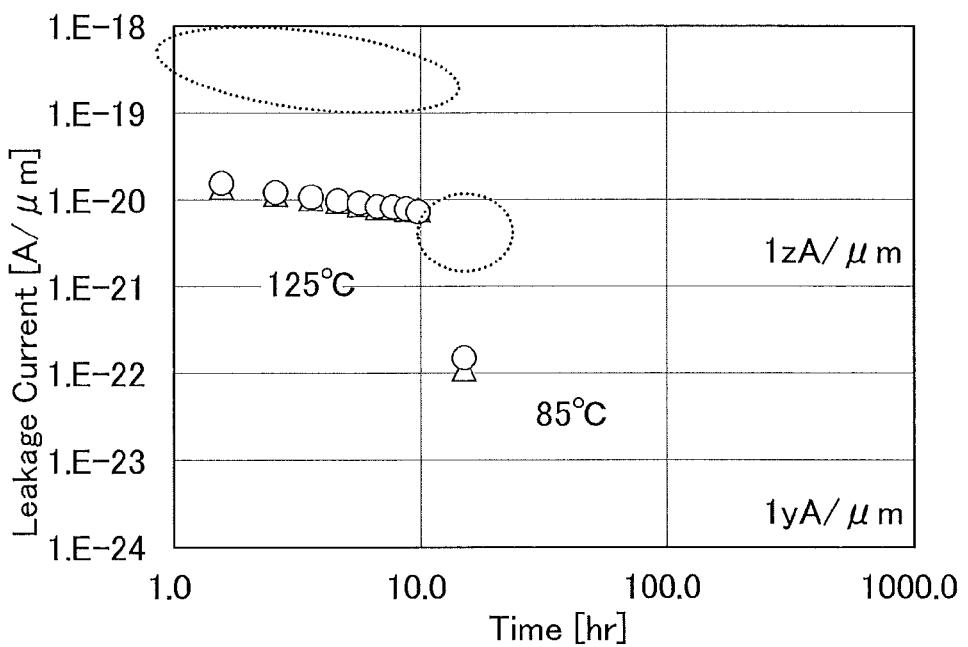
FIG. 42A illustrates results of measurement of off-state current and FIG. 42B is an Arrhenius plot diagram for showing off-state current.
Figure 42B:
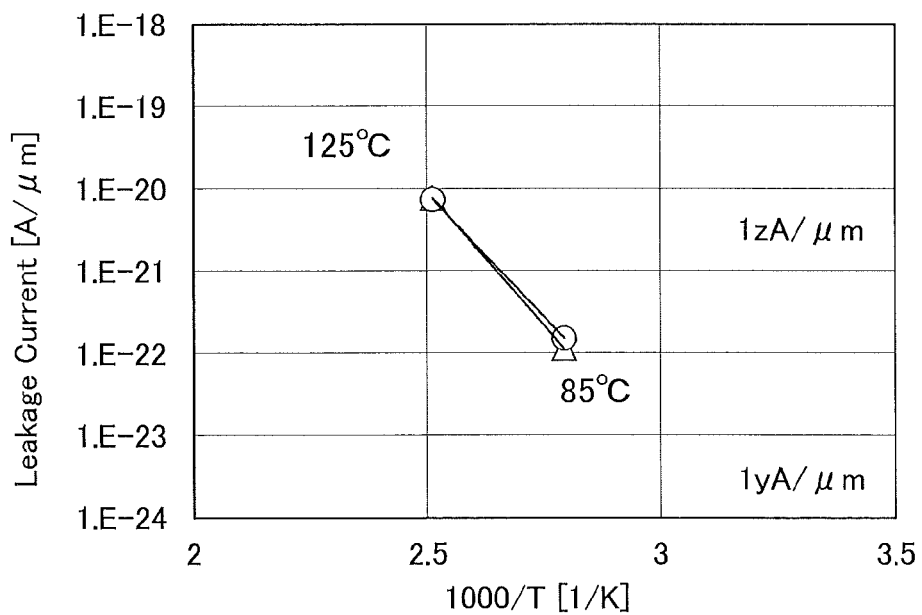

FIG. 42A shows leakage current calculated by the measurement of output potential $V_{out}$. FIG. 42B shows an Arrhenius plot of the leakage current shown in FIG. 42A. As shown in FIGS. 42A and 42B, the leakage current at a measurement temperature of 125° C. was lower than $1 \times 10^{-20}$ A/μm (10 zA/μm), and the leakage current at a measurement temperature of 85° C. was lower than $2 \times 10^{-22}$ A/μm (200 yA/μm).

The above results reveal that the off-state current of a transistor including an oxide semiconductor in the semiconductor device of one embodiment of the present invention can be sufficiently small even when a transistor including single crystal semiconductor is provided below the transistor including an oxide semiconductor.

<Reference Example>

As a reference example, necessary retentions years and target (required) leakage current at 85° C. of devices are described.

The required retention years of the devices and the target leakage current at 85° C. thereof are described with reference to FIG. 43.

A semiconductor device shown in FIG. 20 is a memory device that is called a dynamic oxide semiconductor random access memory (DOSRAM) and includes a transistor including an oxide semiconductor as a selection transistor (a transistor as a switching element) of a memory cell.

In a DOSRAM in which the area occupied by one memory cell is $8F^2$ (F=minimum feature size), the target current of the transistor is lower than 100 aA/μm, the time for retaining electric potential is 1 hour or longer, the capacitance for retaining electric potential is 30 fF, and the acceptable threshold voltage change is 0.3 V.

In the normally-off CPUs shown in FIG. 22, the target current of a transistor is lower than 3 zA/μm, the time for retaining electric potential is 1 day or longer, the capacitance for retaining electric potential is 184 fF, and the acceptable threshold voltage change is 0.1 V.

The semiconductor device illustrated in FIGS. 1A to 1C is called a nonvolatile oxide semiconductor random access memory (NOSRAM). In a small-scale NOSRAM, the target current of a transistor is lower than 93 yA/μm, the time for retaining electric potential is 10 years or longer, the capacitance for retaining electric potential is 21 fF, and the acceptable threshold voltage change is 0.5 V. In a 2-level NOSRAM, the target current of a transistor is lower than 1.5 yA/μm, the time for retaining electric potential is 10 years or longer, the capacitance for retaining electric potential is 39 aF, and the acceptable threshold voltage change is 0.5 V. In an 8-level NOSRAM, the target current of a transistor is lower than 0.02 yA/μm, the time for retaining electric potential is 10 years or longer, the capacitance for retaining electric potential is 39 aF, and the acceptable threshold voltage change is 0.1 V.

In an FPGA, the target current of a transistor is lower than 44 yA/μm, the time for retaining electric potential is 10 years or longer, the capacitance for retaining electric potential is 184 fF, and the acceptable threshold voltage change is 0.3 V.

EXPLANATION OF REFERENCE

100: transistor, 150: semiconductor substrate, 160: insulating film, 162: insulating film, 164: conductive film, 166: impurity region, 170: insulating film, 171: barrier film, 172: insulating film, 173: conductive film, 174: conductive film, 175: void, 176: insulating film, 200: transistor, 204: conductive film, 205: conductive film, 206: oxide semiconductor film, 206a: oxide semiconductor film, 206b: oxide semiconductor film, 206c: oxide semiconductor film, 212: gate insulating film, 213: insulating film, 215: oxide semiconductor film, 216a: conductive film, 216b: conductive film, 218: barrier film, 219: insulating film, 220: conductive film, 250: capacitor, 400: capacitor, 401: transistor, 402: transistor, 403: transistor, 404: transistor, 406: output circuit, 700: substrate, 701: pixel portion, 702: scan line driver circuit, 703: scan line driver circuit, 704: signal line driver circuit, 710: capacitor wiring, 712: gate wiring, 713: gate wiring, 714: drain electrode layer, 716: transistor, 717: transistor, 718: liquid crystal element, 719: liquid crystal element, 720: pixel. 721: switching transistor, 722: driver transistor, 723: capacitor, 724: light-emitting element, 725: signal line, 726: scan line, 727: power supply line, 728: common electrode, 800: RF tag, 801: communication device, 802: antenna, 803: wireless signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: refrigerator door, 933: freezer door, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8006: display panel, 8007: backlight unit, 8008: light source, 8009: frame, 8010: printed board, 8011: battery.

This application is based on Japanese Patent Application serial No. 2013-219682 filed with the Japan Patent Office on Oct. 22, 2013, the entire contents of which are hereby incorporated by reference.

The invention claimed is:

1. A method for manufacturing a semiconductor device, comprising the steps of:
   forming a first transistor;
   performing a first heat treatment after forming the first transistor;
   forming a first insulating film over the first transistor;
   performing a second heat treatment after forming the first insulating film;
   forming a first barrier film over the first insulating film after performing the second heat treatment;
   forming a second insulating film over the first barrier film;
   forming an opening in the second insulating film, the first barrier film, and the first insulating film; and
   forming a second transistor comprising an oxide semiconductor film comprising a channel formation region, the second transistor being over the second insulating film and electrically connected to the first transistor through the opening.

2. The method for manufacturing a semiconductor device, according to claim 1,
wherein a temperature of the second heat treatment is higher than that of the first heat treatment.

3. The method for manufacturing a semiconductor device, according to claim 1,
wherein the first transistor is formed by using a semiconductor substrate.

4. The method for manufacturing a semiconductor device, according to claim 1,
wherein the second heat treatment is performed for less than or equal to 10 hours at a temperature higher than or equal to 450° C. and lower than 650° C.

5. The method for manufacturing a semiconductor device, according to claim 1,
wherein the first barrier film is loaned by a DC sputtering method.

6. The method for manufacturing a semiconductor device, according to claim 1,
wherein a second barrier film is formed over the second transistor.

7. The method for manufacturing a semiconductor device, according to claim 6,
wherein the second barrier film is formed by a DC sputtering method.

8. The method for manufacturing a semiconductor device, according to claim 1,
wherein after the first transistor is formed, a third insulating film containing hydrogen is formed before the first heat treatment.

9. A method for manufacturing a semiconductor device, comprising the steps of:
forming a first transistor;
performing a first heat treatment after forming the first transistor;
forming a first insulating film over the first transistor;
forming a first barrier film over the first insulating film;
forming a second insulating film over the first barrier film;
forming an opening in the second insulating film, the first barrier film, and the first insulating film;
performing a second heat treatment after forming the opening; and
forming a second transistor comprising an oxide semiconductor film comprising a channel formation region, the second transistor being over the second insulating film and electrically connected to the first transistor through the opening.

10. The method for manufacturing a semiconductor device, according to claim 9,
wherein a temperature of the second heat treatment is higher than that of the first heat treatment.

11. The method for manufacturing a semiconductor device, according to claim 9,
wherein the first transistor is formed by using a semiconductor substrate.

12. The method for manufacturing a semiconductor device, according to claim 9
wherein the second heat treatment is performed for less than or equal to 10 hours at a temperature higher than or equal to 450° C. and lower than 650° C.

13. The method for manufacturing a semiconductor device, according to claim 9,
wherein the first barrier film is formed by a DC sputtering method.

14. The method for manufacturing a semiconductor device, according to claim 9,
wherein a second barrier film is formed over the second transistor.

15. The method for manufacturing a semiconductor device, according to claim 14,
wherein the second barrier film is formed by a DC sputtering method.

16. The method for manufacturing a semiconductor device, according to claim 9,
wherein after the first transistor is formed, a third insulating film containing hydrogen is formed before the first heat treatment.

* * * * *

UNITED STATES PATENT AND TRADEMARK OFFICE
CERTIFICATE OF CORRECTION

PATENT NO. : 9,780,201 B2
APPLICATION NO. : 15/223002
DATED : October 3, 2017
INVENTOR(S) : Yoshinori Ando et al.

It is certified that error appears in the above-identified patent and that said Letters Patent is hereby corrected as shown below:

In the Claims

Column 71, Line 19, in Claim 5, replace "loaned" with --formed--.

Signed and Sealed this
Third Day of July, 2018

Andrei Iancu
*Director of the United States Patent and Trademark Office*